US008294283B2

(12) United States Patent
Ihara

(10) Patent No.: US 8,294,283 B2
(45) Date of Patent: Oct. 23, 2012

(54) SEMICONDUCTOR DEVICE AND MANUFACTURING METHOD THEREOF

(75) Inventor: Takumi Ihara, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 54 days.

(21) Appl. No.: 12/944,848

(22) Filed: Nov. 12, 2010

(65) Prior Publication Data

US 2011/0133321 A1    Jun. 9, 2011

(30) Foreign Application Priority Data

Dec. 7, 2009  (JP) ................................. 2009-277846

(51) Int. Cl.
*H01L 23/48* (2006.01)
*H01L 23/52* (2006.01)
*H01L 29/40* (2006.01)

(52) U.S. Cl. . 257/778; 257/678; 257/787; 257/E21.499; 257/E21.502; 257/E21.503; 257/E21.506; 257/E21.507; 257/E21.508; 257/E21.509; 257/E21.511

(58) Field of Classification Search ................... 257/778, 257/678, 787, 777, 779, 780, E21.499, E21.502, 257/E21.503, E21.506, E21.507, E21.508, 257/257, E21.509, E21.511
See application file for complete search history.

(56) References Cited

U.S. PATENT DOCUMENTS 7,924,228 B2 *  4/2011  Ochi et al. ............. 343/700 MS
8,039,756 B2 * 10/2011  Kikuchi et al. ............... 174/260
8,111,523 B2 *  2/2012  Sunohara et al. ............. 361/781

FOREIGN PATENT DOCUMENTS
JP    2006-140327 A   6/2006
* cited by examiner

*Primary Examiner* — David Nhu
(74) *Attorney, Agent, or Firm* — Westerman, Hattori, Daniels & Adrian, LLP

(57) ABSTRACT

A disclosed semiconductor device includes a wiring board, a semiconductor element mounted on a principal surface of the wiring board with flip chip mounting, a first conductive pattern formed on the principal surface along at least an edge portion of the semiconductor element, a second conductive pattern formed on the principal surface along the first conductive pattern and away from the first conductive pattern, a passive element bridging between the first conductive pattern and the second conductive pattern on the principal surface of the wiring board, and a resin layer filling a space between the wiring board and the semiconductor chip, wherein the resin layer extends between the semiconductor element and the first conductive pattern on the principal surface of the wiring board.

18 Claims, 64 Drawing Sheets

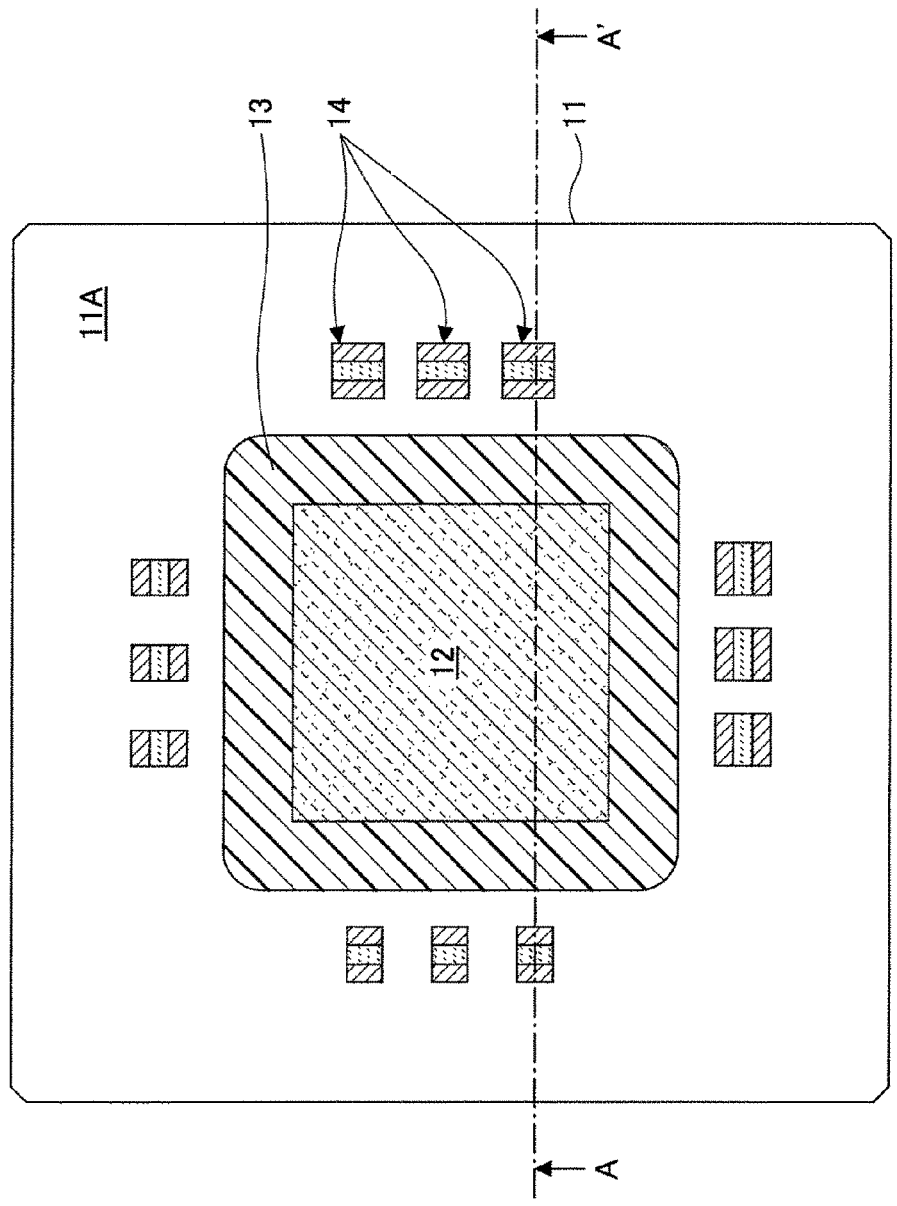

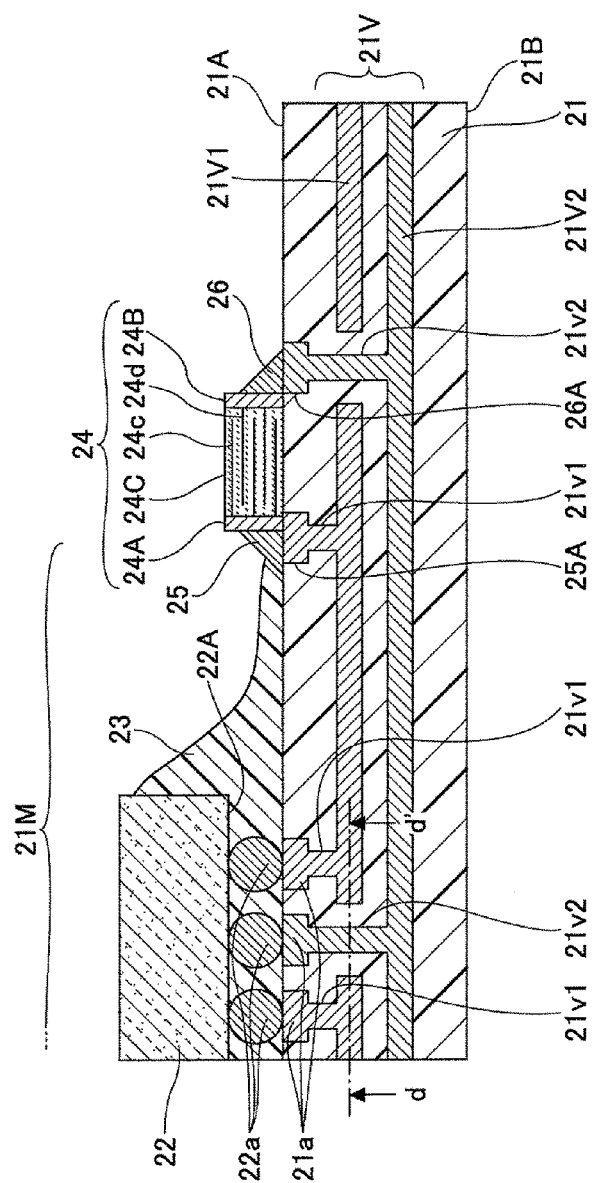

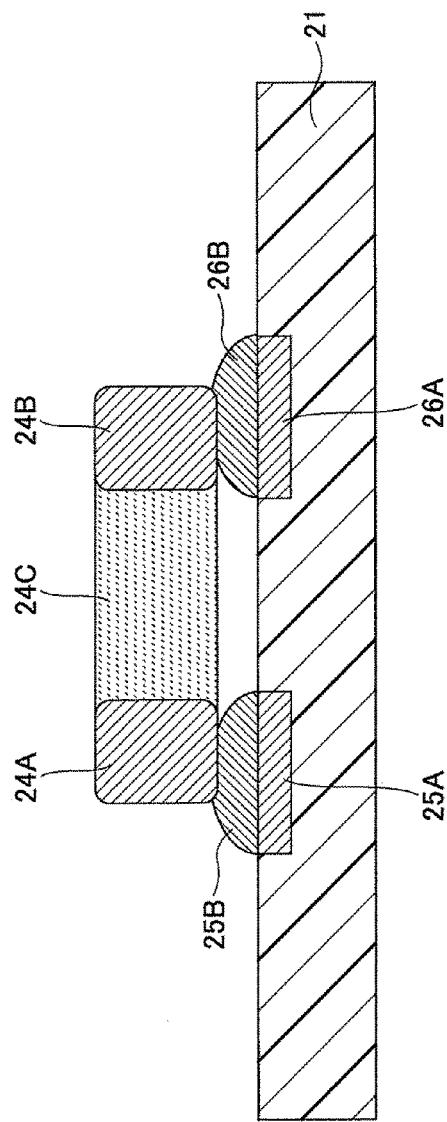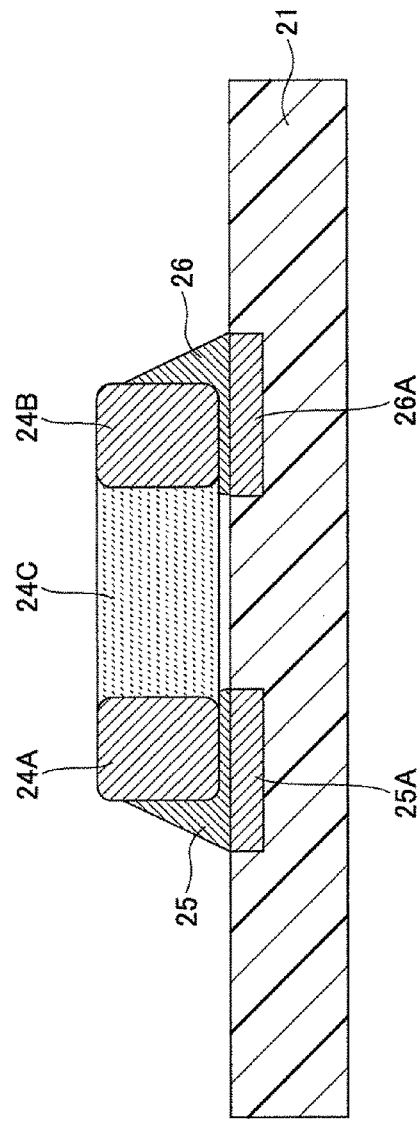

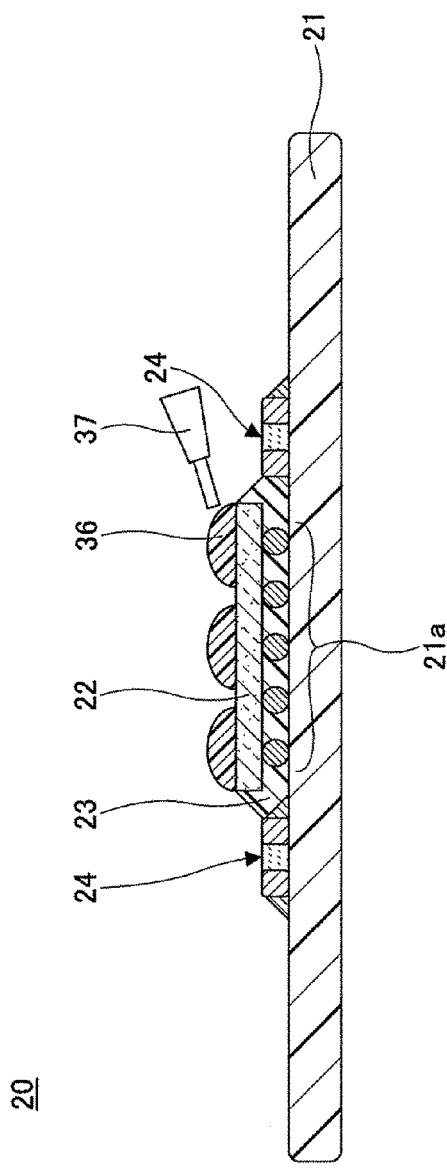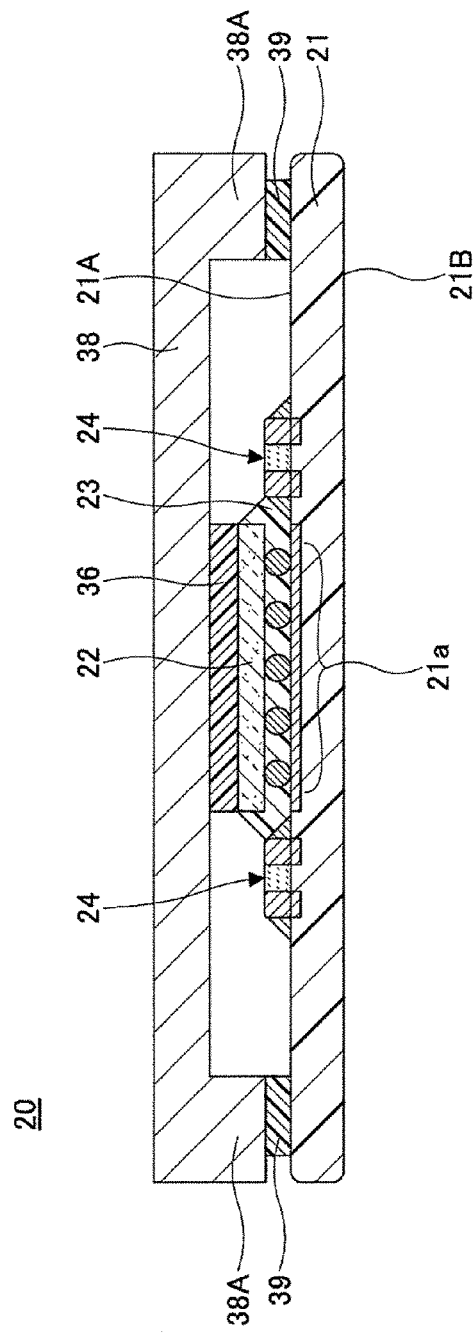
FIG.15A
FIG.15B

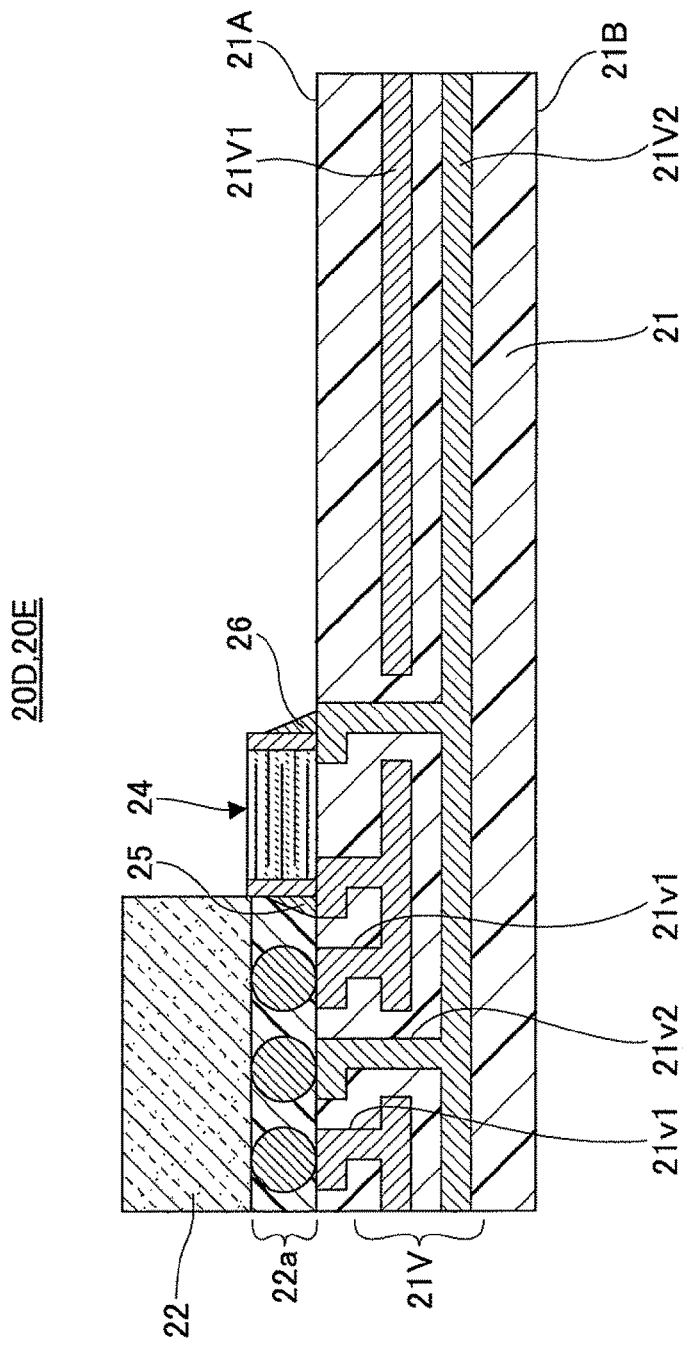

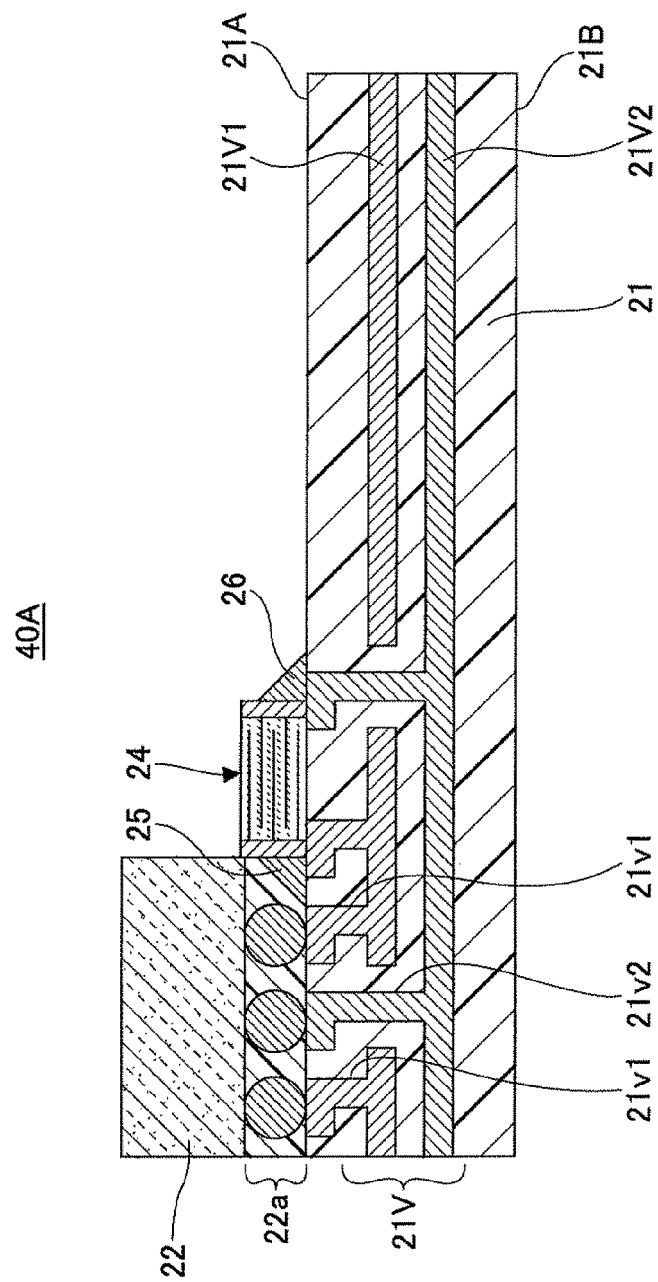

US 8,294,283 B2

SEMICONDUCTOR DEVICE AND MANUFACTURING METHOD THEREOF

CROSS-REFERENCE TO RELATED APPLICATIONS

This patent application is based upon and claims the benefit of priority of the prior Japanese Patent Application No. 2009-277846 filed on Dec. 7, 2009, the entire contents of which are incorporated herein by reference.

FIELD

A certain aspect of the embodiments discussed herein is related to a semiconductor device, in particular to a semiconductor device on which a semiconductor element is connected to a wiring board by flip chip mounting and a manufacturing method of the semiconductor device.

BACKGROUND

The flip chip mounting is a technique widely used in semiconductor devices.

In the flip chip mounting, a semiconductor element is mounted on a principal surface of a wiring board on which a wiring pattern is formed so that a surface of the semiconductor element on which an electrode pad is formed faces the principal surface of the wiring board, and the electrode pad is connected to the wiring pattern by solder bumps.

With the flip chip mounting, the wiring length between the semiconductor element and the wiring board may be shortened, and influences of a parasitic impedance or a parasitic inductance may be lessened. Heat generated by the semiconductor element may be effectively dissipated and transferred to the wiring board via solder bumps.

With the flip chip mounting, after the semiconductor element is mounted on the wiring board, an underfill resin is injected into a gap between the semiconductor element and the wiring board in order to protect the solder bump and the wiring pattern and to mechanically support the semiconductor element. The underfill resin is ordinarily supplied using a capillary action. Therefore, a resin which is excellent in wettability and flowability may be used as the underfill resin to prevent voids from being formed or the resin from being insufficiently supplied as described in Japanese Laid-open Patent Publication No. 2006-140327.

SUMMARY

According to as aspect of the embodiments, a semiconductor device includes a wiring board; a semiconductor element configured to be mounted on a principal surface of the wiring board with flip chip mounting; a first conductive pattern configured to be formed on the principal surface along at least an edge portion of the semiconductor element; a second conductive pattern configured to be formed on the principal surface along the first conductive pattern and away from the first conductive pattern; a passive element configured to bridge between the first conductive pattern and the second conductive pattern on the principal surface of the wiring board; and a resin layer configured to fill a space between the wiring board and the semiconductor chip, wherein the resin layer extends between the semiconductor element and the first conductive pattern on the principal surface of the wiring board.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

FIG. 1A is a plan view of an example semiconductor device.

FIG. 4A is an enlarged cross-sectional view of the semiconductor device of First Embodiment taken along a line C-C' of FIG. 3A.

FIG. 11B is a cross-sectional view of the passive element taken along a line F-F' of FIG. 11A before a solder reflow process.

FIG. 11C is a cross-sectional view of the passive element taken along the line F-F' of FIG. 11A after the solder reflow process.

FIG. 15A is a seventh cross-sectional view of the semiconductor device for illustrating the manufacturing method of the semiconductor device of First Embodiment carried after those of FIG. 10A and FIG. 10B.

FIG. 15B is an eighth cross-sectional view of the semiconductor device for illustrating the manufacturing method of the semiconductor device of First Embodiment carried after those of FIG. 10A and FIG. 10B.

FIG. 18C is an enlarged cross-sectional view of the semiconductor device of First Embodiment taken along a line G-G' of FIG. 18A and FIG. 18B.

FIG. 26B is a cross-sectional view of the semiconductor device of the modified example of Second Embodiment taken along a line K-K' of FIG. 26A.

DESCRIPTION OF EMBODIMENT(S)

When the semiconductor element is mounted on a wiring board to form a semiconductor device, a power supply voltage may vary due to noise generated when a power source circuit of the semiconductor element is turned on and off. The variation of the power supply voltage may cause an operation of the semiconductor element to be unstable. In order to prevent the unstable operation of the semiconductor element, a capacitative element may be provided between a power wire and a grounding wire in the vicinity of the semiconductor element. The capacitative element may be a ceramic capacitor having a capacity of about 100 pF and an outside dimension of 1.6×0.8 mm.

This capacitative element is called a "chip-type capacitative element" named for its shape.

For example, when all transistors are simultaneously turned on, a large load is applied to the power line, and the power supply voltage decreases. On the other hand, when all transistors are simultaneously turned off, a large surge may be generated in the power supply line.

The chip-type capacitative element smoothes the voltage variation of the power supply line and enables the power supply line supplying a stable power supply voltage.

An underfill resin extends around the semiconductor element. There is a tendency that a resin having good fluidity or good wettability is apt to extend outward.

When the chip-type capacitative element is arranged on the wiring board, it is necessary to arrange the chip-type capacitative element away from the semiconductor element while avoiding expansion of the underfill resin.

However, if the chip-type capacitative element is arranged away from the semiconductor element, an overall electric property is degraded by a parasitic inductance or capacitance caused by a wiring pattern between the chip-type capacitative element and the semiconductor element.

By arranging the chip-type capacitative element away from the semiconductor element, the area of the wiring board is increased and the semiconductor device may be prevented from being miniaturized.

When a resin excellent in fluidity and wettability is used as the underfill resin, the underfill resin injected into a space flows out and a resin fillet supporting the semiconductor element on sides of the semiconductor element is not sufficiently formed.

Figure 1B:
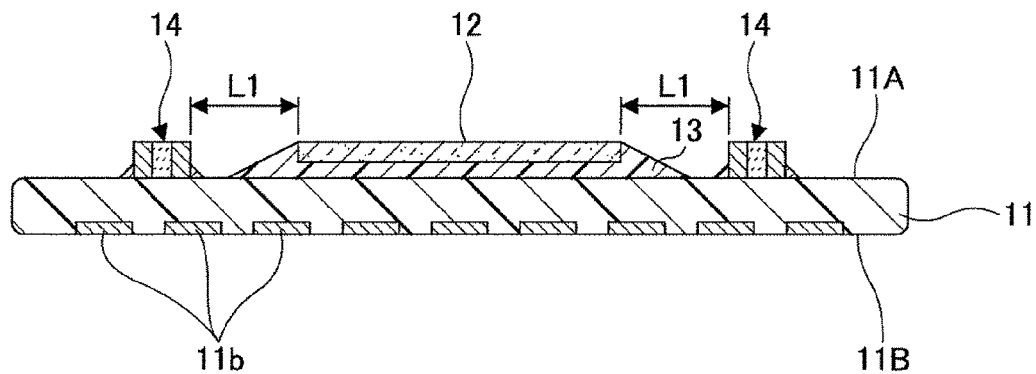
FIG. 1B is a cross-sectional view of the example semiconductor device illustrated in FIG. 1A taken along a line A-A'.

Structures of the example semiconductor device 10 are illustrated in FIG. 1A and FIG. 1B. FIG. 1B is a cross-sectional view of FIG. 1A taken along a line A-A'.

Referring to FIG. 1A and FIG. 1B, the semiconductor element 12 is mounted on an upper principal surface 11A of the wiring board 11 by flip chip mounting.

An underfill resin 13 which is injected into the space between the wiring board 11 and the semiconductor element 12 extends a distance L1 on an area where the semiconductor element 12 covers the upper principal surface 11A.

The chip-type capacitative elements 14 are arranged on the principal surface of the wiring board 11 in the vicinity of the semiconductor element 12 and apart by the distance L1 or more from the side edge of the semiconductor element 12.

On the other hand, electrode pads 1ib to be connected to the outside are formed on a lower principal surface 11B of the wiring board 11.

Figure 2A:
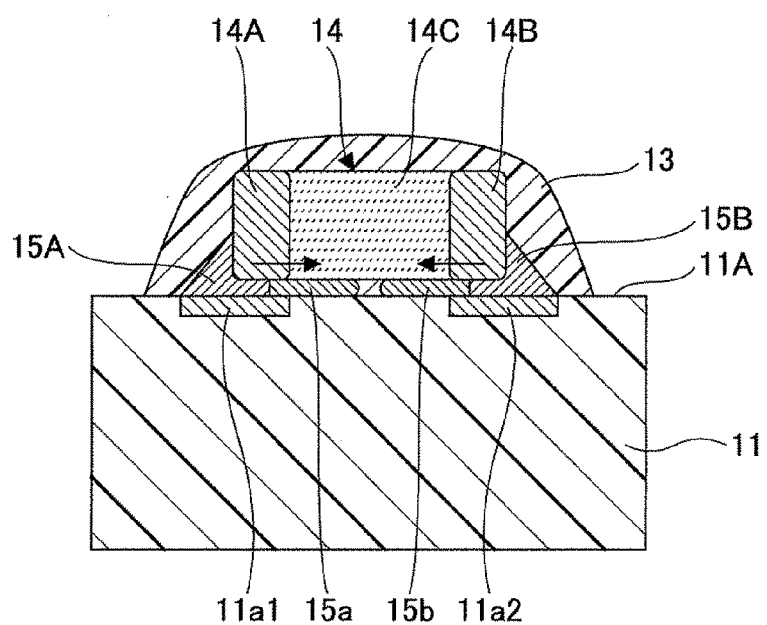
FIG. 2A is a schematic cross-sectional view of the example semiconductor device illustrated in FIG. 1A and FIG. 1B.
Figure 2B:
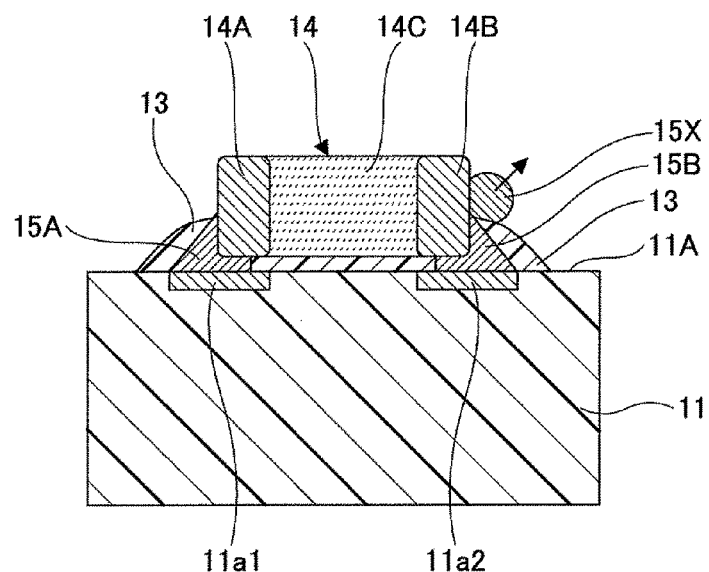
FIG. 2B is a schematic cross-sectional view of the example semiconductor device illustrated in FIG. 1A and FIG. 1B.

When the chip-type capacitative element 14 is covered by the underfill resin 13 and the semiconductor device illustrated in FIG. 1A and FIG. 1B is heated in a process of forming solder balls on the electrode pads on the wiring board 11 or a process of soldering a heat discharging part, the solder in a gap between a lower portion of the chip-type capacitative element 14 and the wiring board 11 is melted, intrudes into the inside of the gap to cause a short circuit along arrows illustrated in FIG. 2A, or is blown up from an interspace between the chip-type capacitative element 14 and the underfill resin 13 to form a solder ball 15X as illustrated in FIG. 2B.

FIG. 2A and FIG. 2B illustrate a part of the cross-sectional view of the chip-type capacitative element 14 taken along a line A-A' in FIG. 1A. The chip-type capacitative element 14 has a ceramic member to be a ceramic capacitor body 14C and electrodes 14A and 14B formed one on each side of the ceramic capacitor body 14C. Electrode pads 11a1 and 11a2 are formed on the upper principal surface 11A in correspondence with the electrodes 14A and 14B.

The electrode 14A is connected to the electrode pad 11a1 by a solder 15A, and the electrode 14B is connected to the electrode pad 11a2 by a solder 15B. A multi wiring structure formed in the wiring board 11 is omitted in FIG. 1, FIG. 2A and FIG. 2B.

Referring to FIG. 2A, a gap or a space is formed between the chip-type capacitative element 14 and the upper principal surface 11A of the wiring board 11. However, when the heat treatment is applied to the wiring board 11 as described above, the solder 15A and 15B is melted and blown up from an interspace between the chip-type capacitative element 14 and the underfill resin 13 along the arrow in FIG. 2B. As a result, solder extending portions 15a and 15b may be shunted.

Referring to FIG. 2B, the solder blows up from the interspace between the underfill resin 13 and the chip-type capacitative element 14, and the solder ball 15X is formed. The solder ball 15X may be blown up along the arrow as illustrated in FIG. 2B.

Figure 2C:
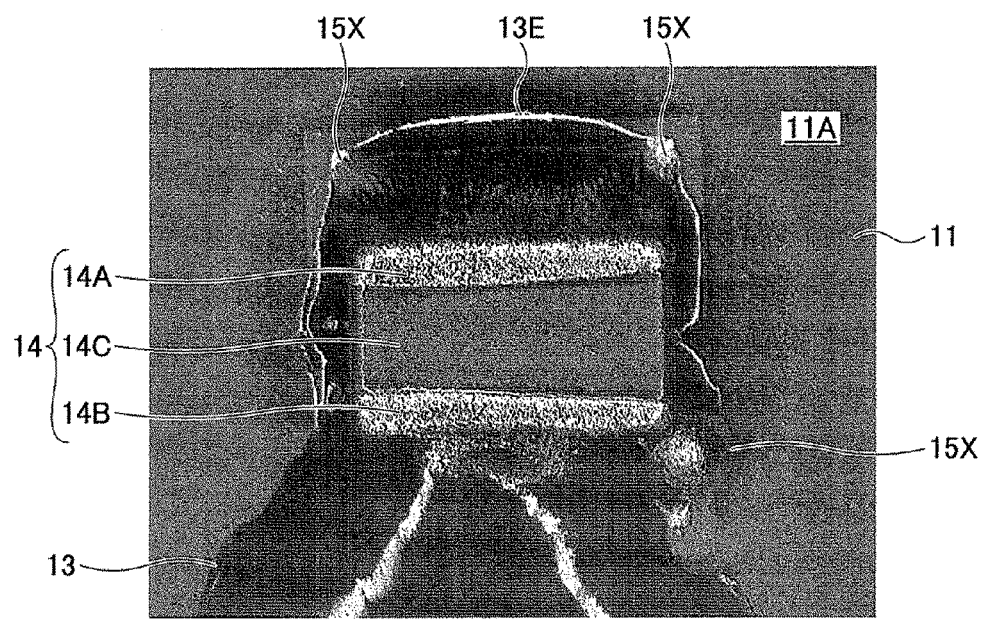
FIG. 2C is a photograph of the example semiconductor device illustrated in FIG. 1A and FIG. 1B.

FIG. 2C is a photograph illustrating an example of the solder ball. FIG. 2C is a plan view of vertically looking down at the upper principal surface 11A of the wiring board 11. The underfill resin 13 is blackened.

Referring to FIG. 2C, an outer edge 13E of the underfill resin is glistening white. This means that the molten solder protrudes from the outer edge 13E of the underfill resin. Solder balls 15X are formed around the outer edge 13E.

As described, the chip-type capacitative elements 14 are arranged on an outer side of the outer edge 13E of the underfill resin 13 in the example semiconductor devices illustrated in FIG. 1A and FIG. 1B. Therefore, it is necessary to form the chip-type capacitative elements 14 at positions apart by the distance L1 or more from the outer edge of the semiconductor element 12. The distance L1 may become 2 mm or more.

When the chip-type capacitative element 14 is formed far away from the semiconductor element 12, there may be caused a problem that an electric property is degraded by an effect of the parasitic inductance and the parasitic impedance of the wiring.

By arranging the chip-type capacitative elements 14 away from the semiconductor element 12, the area of the wiring board 11 increases and the size of the semiconductor device may increase.

Further, as described, the underfill resin 13 may flow out of the space between the wiring board 11 and the semiconductor element 12 due to the high fluidity of the underfill resin 13. Then, a mechanical support of a side surface of the semiconductor element with the underfill resin 13 may become insufficient.

Figure 3A:
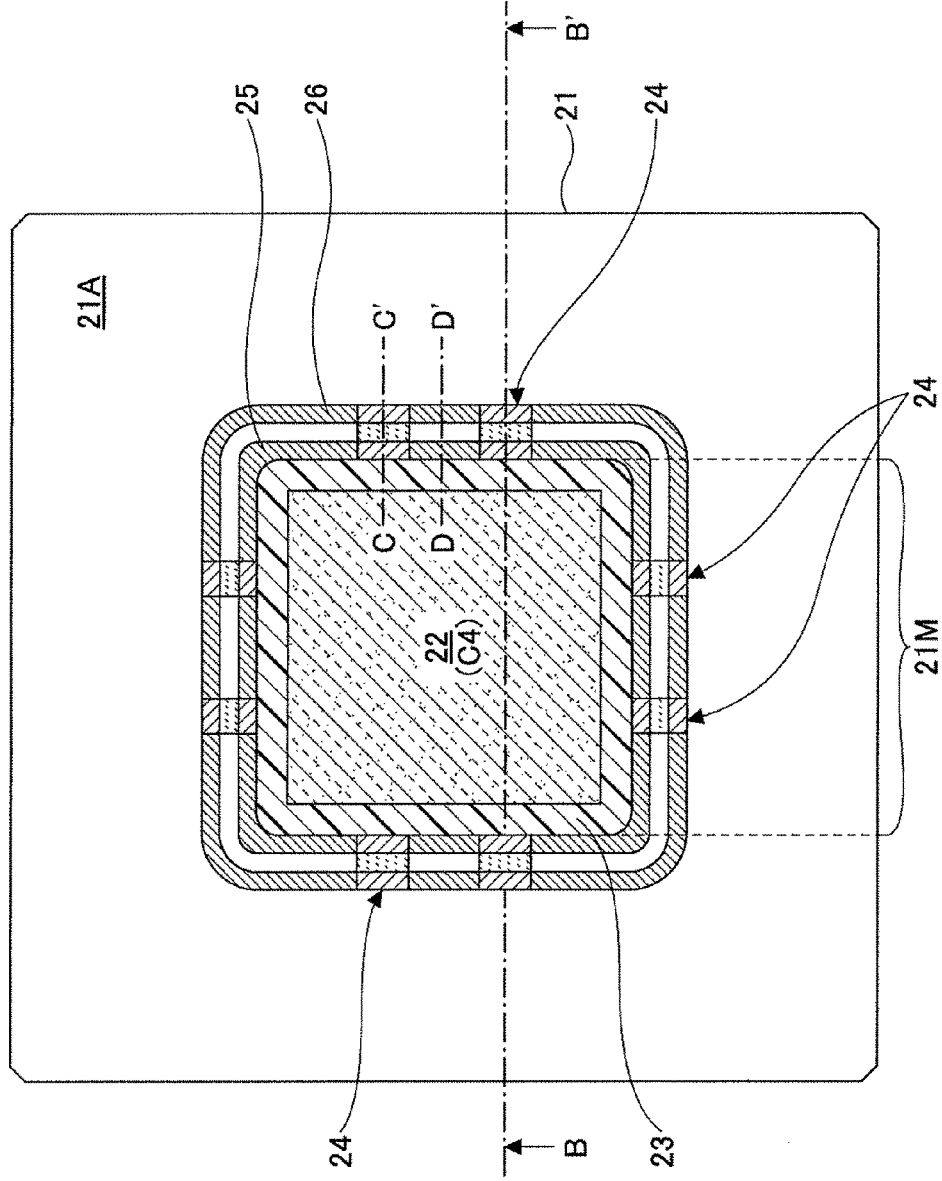
FIG. 3A is a plan view of a semiconductor device of First Embodiment.
Figure 3B:
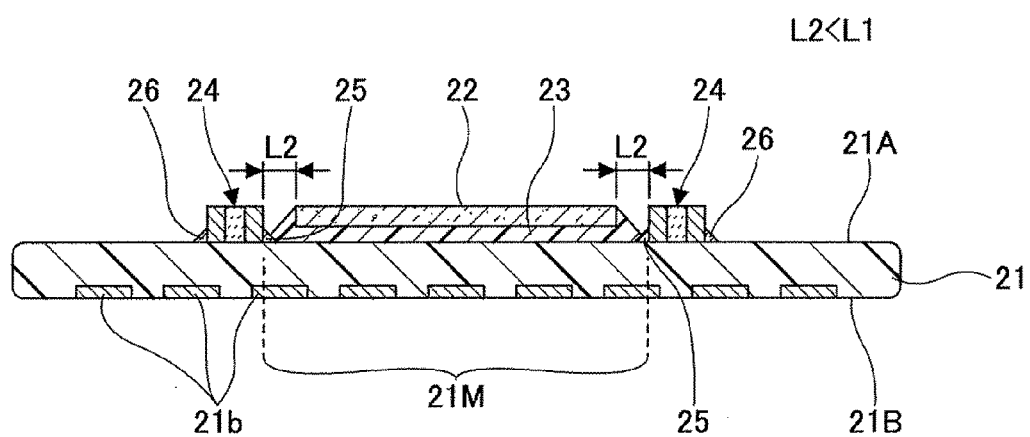
FIG. 3B is a cross-sectional view of the semiconductor device of First Embodiment taken along a line B-B' of FIG. 3A.

Preferred embodiments of the present invention will be explained with reference to accompanying drawings.
First Embodiment FIG. 3A is a plan view of a single chip structure of a semiconductor device 20 of First Embodiment. FIG. 3B is a cross-sectional view of the single chip structure of the semiconductor device 20 of First Embodiment. FIG. 3B is the crossectional view of the semiconductor device 20 taken along a line B-B'.

Referring to FIG. 3A and FIG. 3B, a semiconductor element 22 is installed on an upper principal surface 21A of a wiring board 21 with flip chip mounting. A first conductive pattern 25 made of, for example, a solder is formed to surround with plural turns an area 21M including an area (C4) occupied by the semiconductor element 22. A second conductive pattern 26 made of, for example, a solder is formed outside the first conductive pattern 25 to surround many turns the first conductive pattern 25.

As described later, the first conductive pattern 25 functions as a dam for banking up the underfill resin 23 which fills the space between the principal surface of the wiring board 21 and the semiconductor element 22. The underfill resin 23 is prevented from extending outside the mounting area 21M sectioned off by the first conductive pattern 25.

Further, the semiconductor device 20 includes many chip-type capacitative elements 24 which surround the semiconductor element 22 and bridge between the first conductive pattern 25 and the second conductive pattern 26.

On the other hand, many electrode pads 21b to be connected to the outside are formed on a lower principal surface 21B of the wiring board 21.

Since the first conductive pattern 25 functions as the dam for banking up the underfill resin 23 in the semiconductor device 20 of the present invention, when a distance L2 between the semiconductor element 22 and the first conductive pattern 25 is shortened like L2<L1 to arrange the first conductive pattern 25 in the vicinity of the semiconductor element 22, it is possible to enclose the underfill resin 23 in the vicinity of the occupying area C4 of the semiconductor element 22. Therefore, it is possible to prevent the underfill resin 23 from flowing out of the gap between the wiring board 21 and the semiconductor element 22. Then, the insufficient support of the semiconductor element 22 with the underfill resin 23 is avoidable.

Further, it is possible to arrange the chip-type capacitative elements 24 immediately outside the mounting area 21M. Thus, it becomes possible to prevent the above described parasitic inductance and parasitic capacitance from increasing and degradation of the electric property of the semiconductor device 20.

Further, by reducing the distance L2, it becomes possible to arrange various passive and active elements in addition to the chip-type capacitative elements 24 on the surface of the wiring board 21 covered by the underfill resin. Thus, an efficiency of using the substrate area may be improved.

Figure 4B:
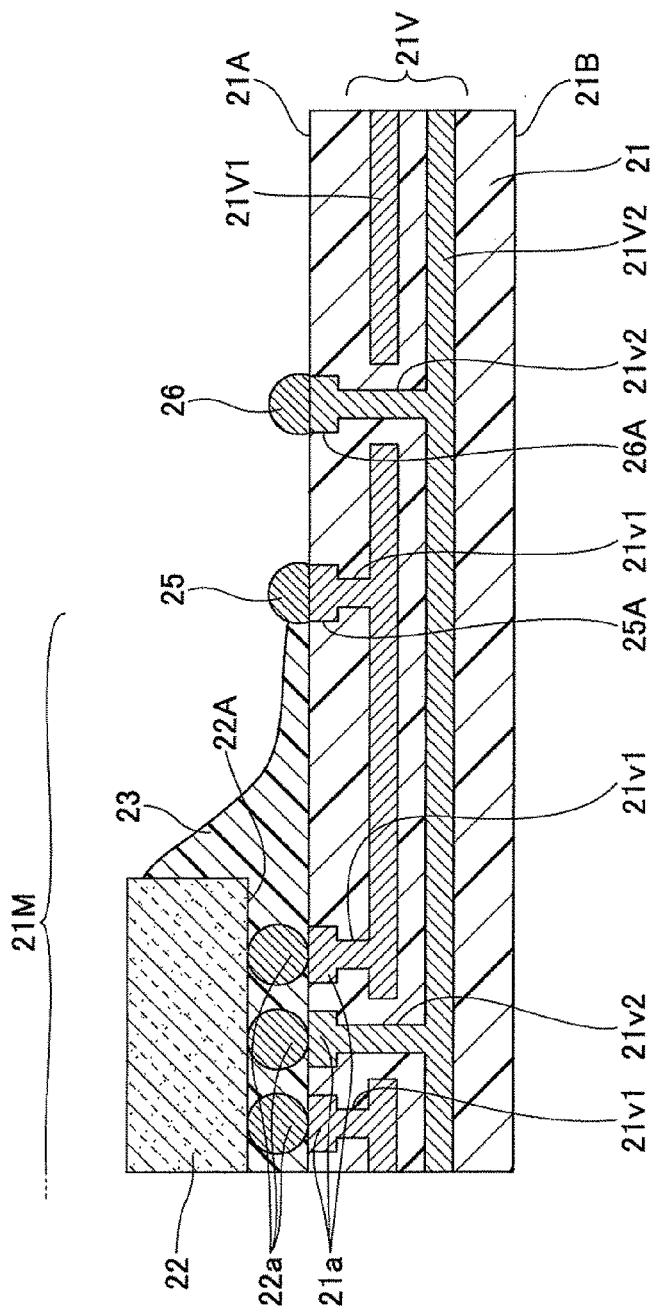
FIG. 4B is an enlarged cross-sectional view of the semiconductor device of First Embodiment taken along a line D-D' of FIG. 3A.

FIG. 4A is an enlarged cross-sectional view of the semiconductor device 20 illustrated in FIG. 3A taken along a line C-C'. FIG. 4B is an enlarged cross-sectional view of the semiconductor device 20 illustrated in FIG. 3A taken along a line D-D'.

Referring to FIG. 4A, an internal wiring 21V which includes a power source pattern 21V1 and a power source pattern 21V2 positioned beneath the power source pattern 21V1 are formed in the wiring board 21. One of the power source patterns 21V1 and 21V2 is connected to a power terminal (not illustrated) and the other power source patterns is connected to a ground terminal (not illustrated).

The electrode pads 21a are arranged like a matrix in the area C4 occupied by the semiconductor element 22 on the upper principal surface 21A of the wiring board 21. Solder bumps 22a shaped like a matrix and formed on the circuit face 22A of the semiconductor element 22 are connected to the electrode pads 21a. Via plugs 21v1 extend to the corresponding electrode pads 21a from the power source patterns 21V1. A power supply voltage or a ground potential are supplied from the power source pattern 21v1. Via plugs 21v2 extend to the corresponding electrode pads 21a from the power source patterns 21V2. The ground potential is supplied to the power source pattern 21V2 when the power supply voltage is supplied to the power source pattern 21V1. The power supply voltage is supplied to the power source pattern 21V2 when the ground potential is supplied to the power source pattern 21V1. At this time, the via plug 21v2 extending from the power source pattern 21V2 extends inside an opening formed inside the power source pattern 21V1 to thereby prevent short circuiting.

Figure 4C:
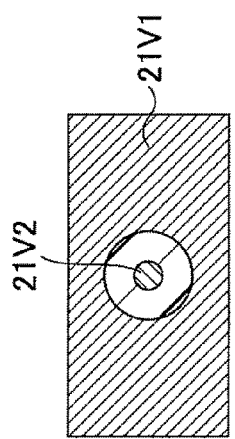
FIG. 4C is an enlarged cross-sectional view of the semiconductor device of First Embodiment taken along a line d-d' of FIG. 4A.

FIG. 4C is a cross-sectional view of FIG. 4A taken along a line D-D'.

Referring to FIG. 4A, the electrode pads 25A are formed in correspondence with the first conductive pattern 25 on the upper principal surface 21A of the wiring board 21 so as to surround the mounting area 21M. The electrode pads 26A are formed in correspondence with the second conductive pattern 26 on the upper principal surface 21A of the wiring board 21 so as to surround the electrode pads 25A. The power supply voltage or ground potential is supplied from the power source pattern 21V1 and the via plug 21v1 to the electrode pad 25A and the first conductive pattern 25. The power supply voltage or ground potential is supplied from the power source pattern 21V2 and the via plug 21v2 to the electrode pad 26A and the second conductive pattern 26.

Referring to FIG. 4A, a chip-type capacitative element 24 having an internal structure where a ceramic capacitor body 24C and capacitor electrodes 24c and 24d facing by interposing the ceramic capacitor body 24C between these is arranged to bridge between the electrode pad 25A and the electrode pad 26A. The capacitor electrode 24c is connected to the electrode pad 25A via the corresponding electrode pad 24A, and the solder pattern forming the first conductive pattern 25. The capacitor electrode 24d is connected to the electrode pad 26A via the corresponding electrode pad 24B, and the solder pattern forming the second conductive pattern 26. The chip-type capacitative element 24 may be a LLL series commercially available from Murata Manufacturing Co., Ltd.

Referring to the structure illustrated in FIG. 4B, the chip-type capacitative element 24 is not included. The solder pattern of the first conductive pattern 25 is formed on the electrode pads 25A. The solder pattern of the first conductive pattern 26 is formed on the electrode pads 26A.

In the structures illustrated in FIG. 4A and FIG. 4B, the solder patterns of the first conductive pattern 25 and the second conductive pattern 26 rise upward from the upper principal surface 21A of the wiring board 21. Especially, the solder pattern forming the first conductive pattern 25 functions as the dam for banking up an extension of the underfill resin 23.

A preferable height of the upward rising solder pattern of the first conductive pattern 25 and the second conductive pattern 26 changes depending on wettability between the underfill resin 23 and the solder pattern. For example, when UF8802F manufactured by Ablestik Laboratories is used as the underfill resin 23, it is preferable to set 80 μm to be the preferable height. When the height of the upward rising solder pattern is 100 μm, the upward rising solder pattern sufficiently functions as the dam for banking up an extension of an ordinary underfill resin.

According to First Embodiment, the extension of the underfill resin 23 is prevented by the first conductive pattern 25. Therefore, passive elements such as the chip-type capacitative element 24 may not be covered by the underfill resin 23. Even when a heat treatment is provided in forming the solder bumps on the lower principal surface 21B of the wiring board 21, it is possible to prevent formation of the solder balls which is produced when the molten solder blows up and short circuiting caused by the solder balls.

A manufacturing method of the semiconductor device 20 illustrated in FIG. 3A and FIG. 3B is illustrated in FIG. 5A and FIG. 5B to FIG. 10A and FIG. 10B.

Figure 5A:
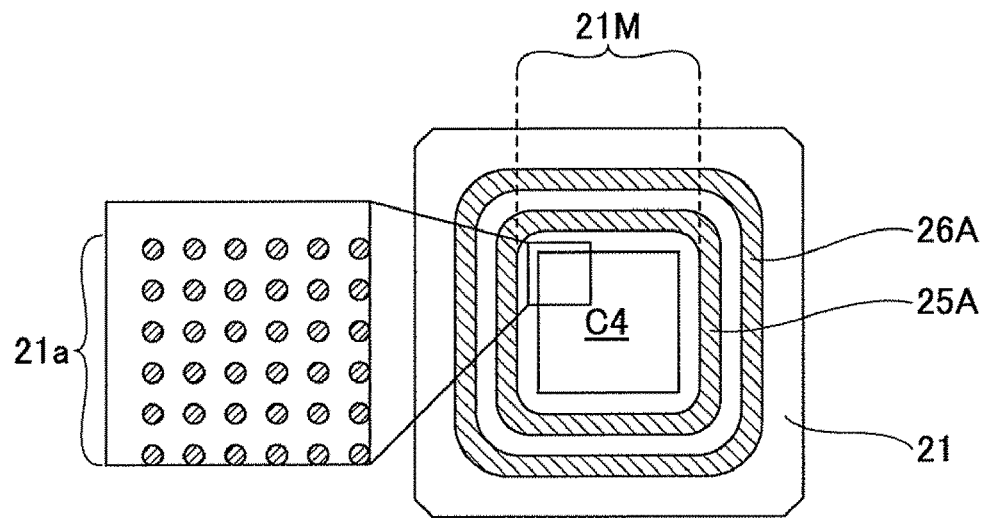
FIG. 5A is a first plan view of the semiconductor device for illustrating a manufacturing method of the semiconductor device of First Embodiment.
Figure 5B:
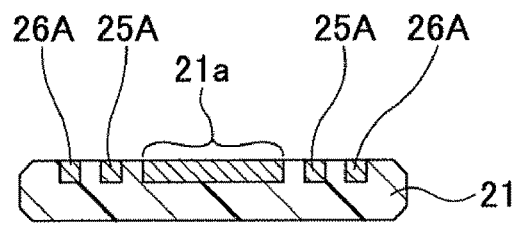
FIG. 5B is a first cross-sectional view of the semiconductor device for illustrating the manufacturing method of the semiconductor device of First Embodiment.

Referring to FIG. 5A and FIG. 5B, electrode pads 21a are arranged like a matrix and formed on the occupying area C4 of the semiconductor element over the wiring board 21 corresponding to the solder bumps 22a on the circuit face 22A of the semiconductor element 22. The electrode pads 26A are formed so as to surround the electrode pads 25A at a position where the second conductive pattern 26 is formed outside the electrode pads 25A.

The electrode pads 21a illustrated in FIG. 5A in FIG. 6B and FIG. 7B to FIG. 10B form a continuous electrode pattern including the small electrode pads as illustrated in FIG. 5A. For easy illustrated, the continuous electrode pattern as illustrated in FIG. 5A is not precisely depicted.

Figure 6A:
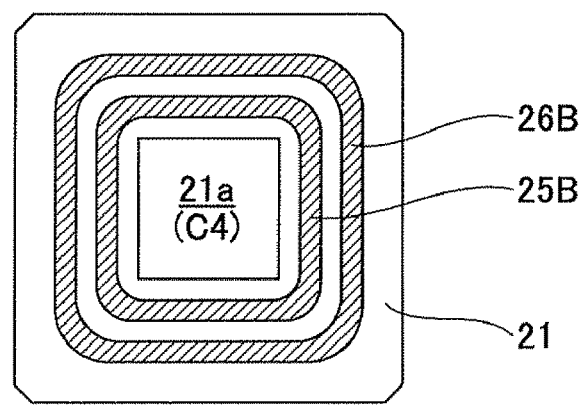
FIG. 6A is a second plan view of the semiconductor device for illustrating the manufacturing method of the semiconductor device of First Embodiment.
Figure 6B:
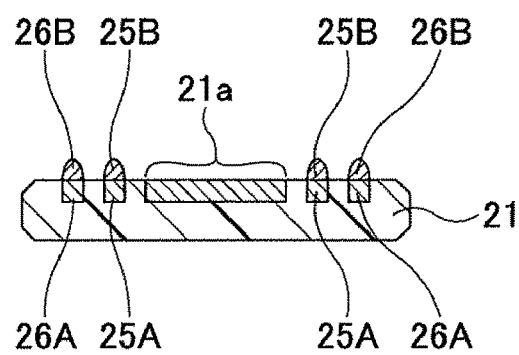
FIG. 6B is a second cross-sectional view of the semiconductor device for illustrating the manufacturing method of the semiconductor device of First Embodiment.

Referring to FIG. 6A and FIG. 6B, patterns 25B and 26B of a solder paste are printed on the electrode pads 25A and 26A.

Figure 7A:
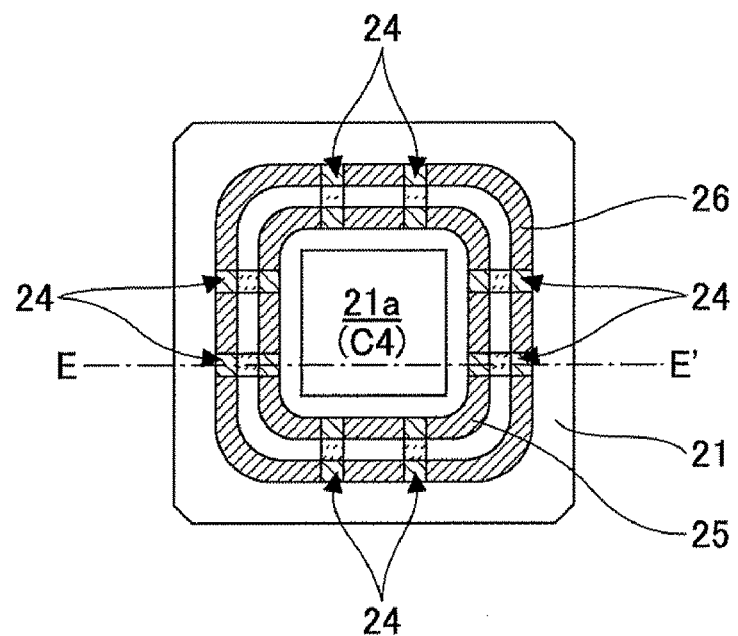
FIG. 7A is a third plan view of the semiconductor device for illustrating the manufacturing method of the semiconductor device of First Embodiment.
Figure 7B:
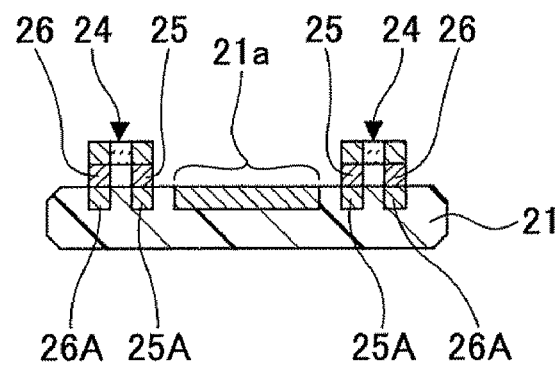
FIG. 7B is a third cross-sectional view of the semiconductor device for illustrating the manufacturing method of the semiconductor device of First Embodiment.

Referring to FIG. 7A and FIG. 7B, the chip-type capacitative elements 24 are arranged to bridge between the patterns 25B and 26B. Then, the patterns 25B and 26B are melted to thereby install the chip-type capacitative elements 24 as many as a desired number.

The installation of the chip-type capacitative element 24 is described in detail later.

By melting the patterns 25B and 26B of the solder paste, the first conductive pattern 25 and the second conductive pattern 26 are formed corresponding to the electrode pads 25A and 26A on the wiring board 21.

Figure 8A:
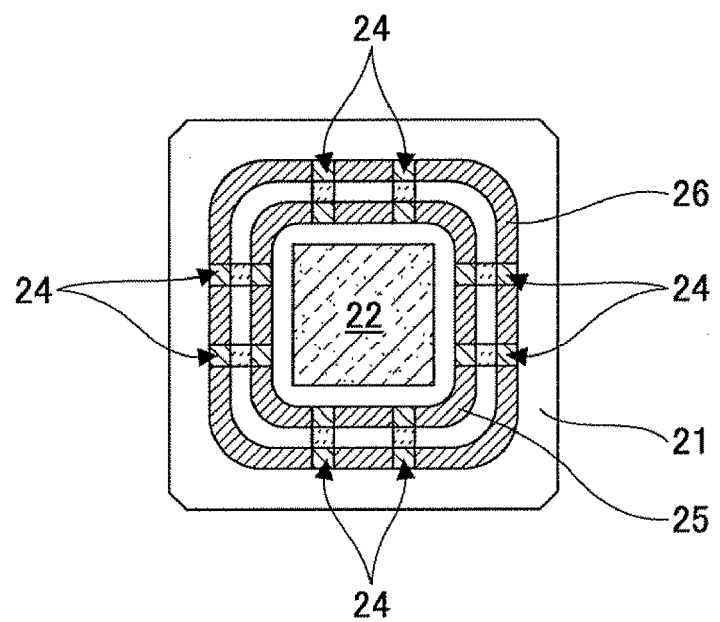
FIG. 8A is a fourth plan view of the semiconductor device for illustrating the manufacturing method of the semiconductor device of First Embodiment.
Figure 8B:
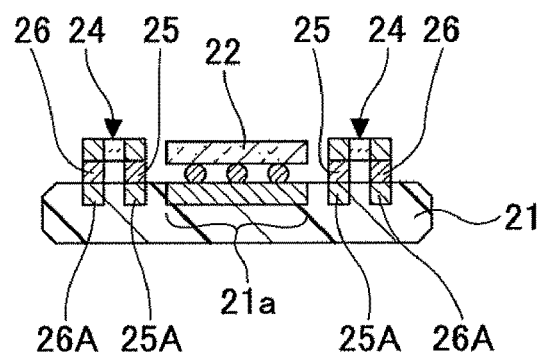
FIG. 8B is a fourth cross-sectional view of the semiconductor device for illustrating the manufacturing method of the semiconductor device of First Embodiment.

Referring to FIG. 8A and FIG. 8B, the semiconductor element 22 is mounted on the wiring board 21 by flip chip mounting. The solder bumps 22a formed on the circuit face 22A of the semiconductor element 22 are connected to the corresponding electrode pads 21a on the wiring board 21.

Figure 9A:
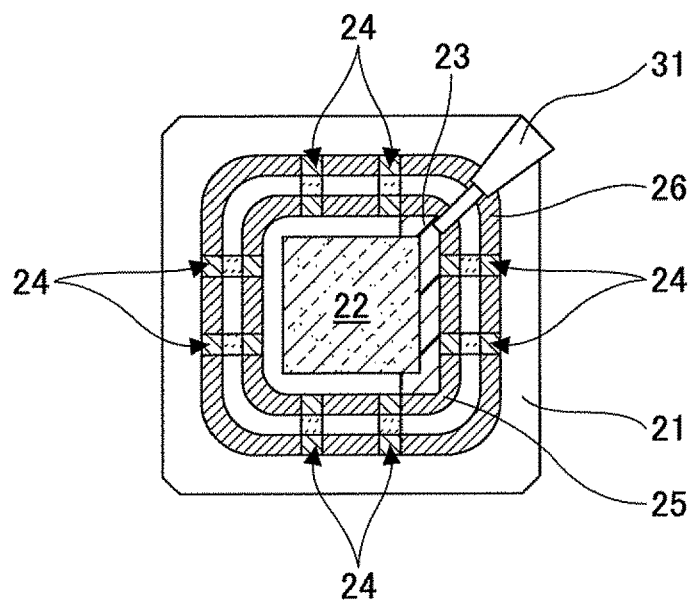
FIG. 9A is a fifth plan view of the semiconductor device for illustrating the manufacturing method of the semiconductor device of First Embodiment.
Figure 9B:
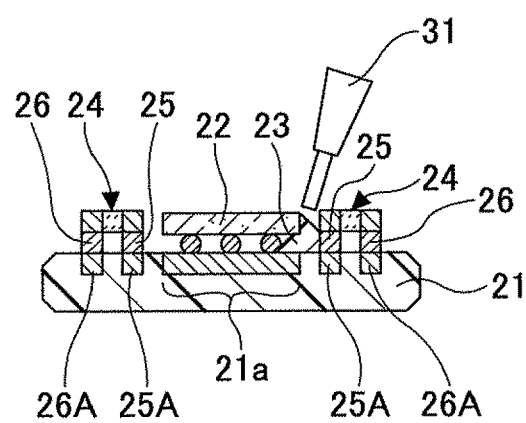
FIG. 9B is a fifth cross-sectional view of the semiconductor device for illustrating the manufacturing method of the semiconductor device of First Embodiment.

Referring to FIG. 9A and FIG. 9B, the underfill resin 23 is supplied into the space between the wiring board 21 and the semiconductor element 22 by a dispenser 31 using a capillary action.

In the processes illustrated in FIG. 9A and FIG. 9B, the tip of the dispenser 31 is positioned inside the conductive pattern 25 and then the underfill resin 23 is supplied.

Thus, the supplied underfill resin 23 is hardened.

Figure 10A:
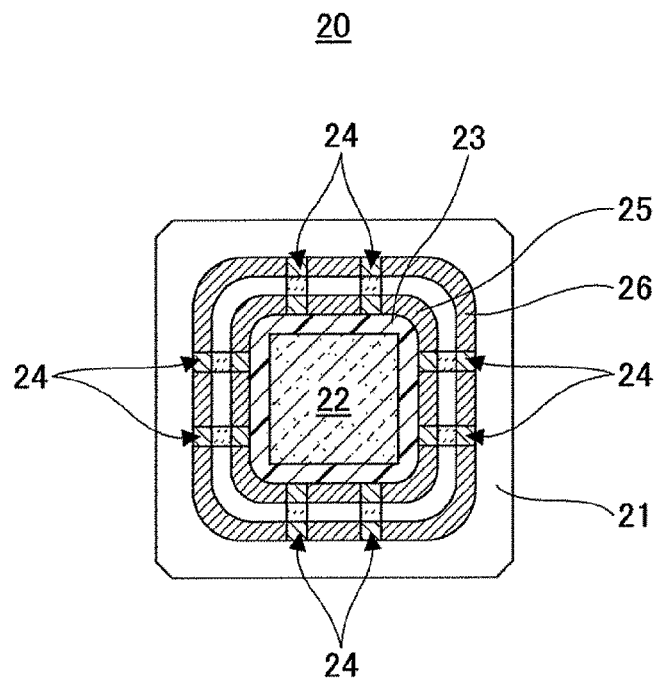
FIG. 10A is a sixth plan view of the semiconductor device for illustrating the manufacturing method of the semiconductor device of First Embodiment.
Figure 10B:
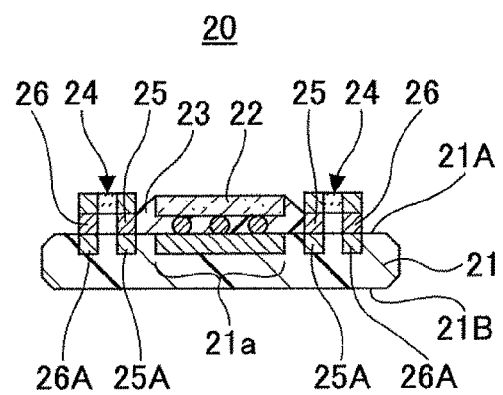
FIG. 10B is a sixth cross-sectional view of the semiconductor device for illustrating the manufacturing method of the semiconductor device of First Embodiment.

Referring to FIG. 10A and FIG. 10B, the solder bumps may be formed on the pad electrodes 21b on the lower principal surface of the wiring board 21 when necessary. The semiconductor device 20 having this structure may be delivered as a product to purchasers.

With First Embodiment, the underfill resin 23 supplied by the dispenser 31 is dammed by the first conductive pattern 25 which functions as the dam for banking up the underfill resin 23, and the underfill resin 23 does not extend to the outside of the mounting area 21M illustrated in FIG. 5A.

Figure 11A:
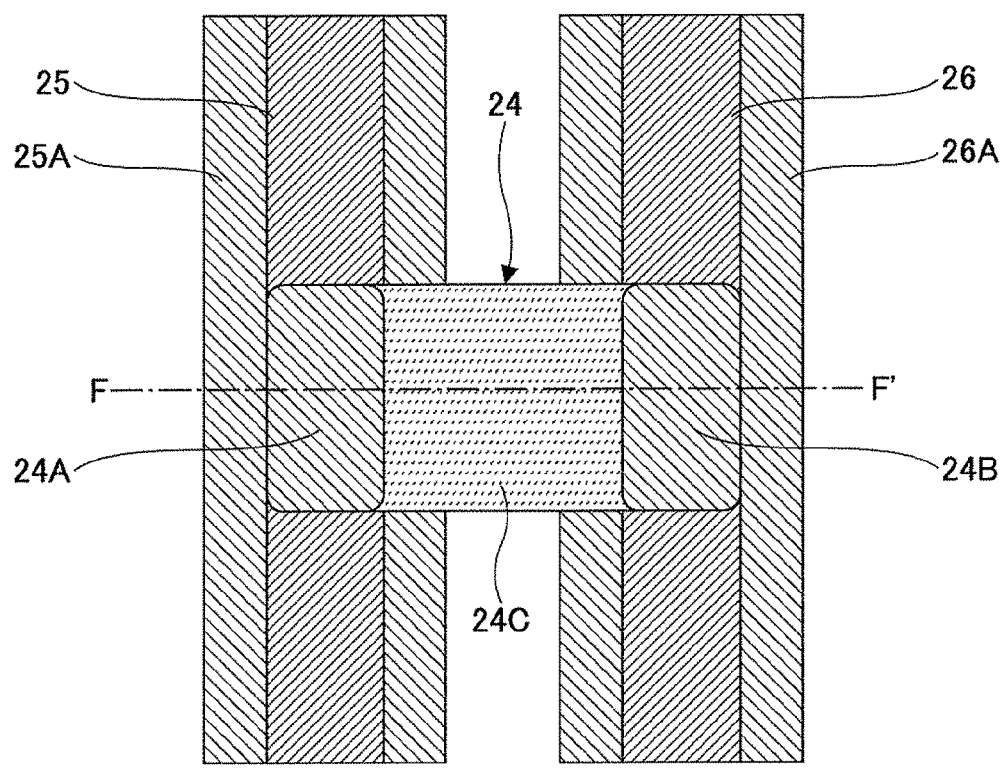
FIG. 11A is a plan view illustrating mounting of a passive element of First Embodiment.

FIG. 11A to FIG. 11C illustrate a process of installing the chip-type capacitative elements 24 illustrated in FIG. 7A and FIG. 7B.

FIG. 11B and FIG. 11C are cross-sectional views of FIG. 11A taken along a line F-F'.

FIG. 11B illustrates the solder patterns to be the first conductive pattern 25 and the second conductive pattern 26 when the solder patterns are not melted. FIG. 11C illustrates the solder patterns after the solder patterns are melted. Referring to FIG. 11B and FIG. 11C, the capacitor electrodes 24c and 24d formed inside the ceramic body 24C are not illustrated.

Referring to FIGS. 11A and 11B, the chip-type capacitative elements 24 are installed so that the electrodes 24A and 24B are in contact with the solder paste patterns 25B and 26B to be THE first conductive pattern 25 and the second conductive pattern 26. By melting the solder paste patterns 25B and 26B, the molten solder paste rises up while covering the electrodes 24A and 24B. Thus, the chip-type capacitative element 24 is installed as illustrated in FIG. 11C.

If the widths and lengths of the electrode pads 25A and 26A are different when the solder patterns are melted, surface tensions the molten solder may not balance. Then, there is a provability that the chip-type capacitative element 24 rises up to cause failures such as a so-called tombstone effect or Manhattan effect. Because the electrode pads 25A and 26A and the first and second conductive patterns 25 and 26 are substantially symmetrically formed in First Embodiment, the failure may not occur.

Referring to FIG. 11A, unlike the actual dimensions, the widths of the conductive patterns 25 and 26 are illustrated narrower than the widths of the electrode pads 25A and 25B in order to expose the electrode pads 25A and 25B. The surfaces of the electrode pads 25A and 26A may be practically covered by the corresponding solder paste 25B and 26B.

With First Embodiment, the first conductive pattern 25 and the second conductive pattern 26 are symmetrically formed to be substantially the same. Therefore, it is possible to avoid or restrict the so-called tombstone effect from occurring in the passive elements such as the chip-type capacitative elements 24. Accordingly, a yield ratio of the semiconductor device can be improved.

In First Embodiment illustrated in FIG. 11A to FIG. 11C, the electrode pads 25A and 26A are formed to have sufficient widths so that the chip-type capacitative elements 24 are installed in arbitrarily positions. In First Embodiment illustrated in FIG. 12, the widths of the electrode pads 25A and 25B may be increased at forming positions 25AW and 26AW of the chip-type capacitative element 24 and minimized at other positions as long as the solder patterns function as the dam.

In this case, the solder patterns to be the first and second conductive pattern 25 and 26 become wide solder patterns 25W and 26W at the forming positions 25AW and 26AW. The chip-type capacitative element 24 is firmly soldered at the forming positions 25AW and 26AW. Adjacent forming positions 25AW of the chip-type capacitative elements 24 are connected by only the narrow solder pattern 25. Adjacent forming positions 26AW of the chip-type capacitative elements 24 are connected by only the narrow solder pattern 26.

The above structure makes an interference between the forming positions of the chip-type capacitative elements 24 caused by a difference in surface tensions of the molten solder. Even though the two chip-type capacitative elements 24 are closely arranged, the so-called tombstone effect can be restricted.

Figure 12:
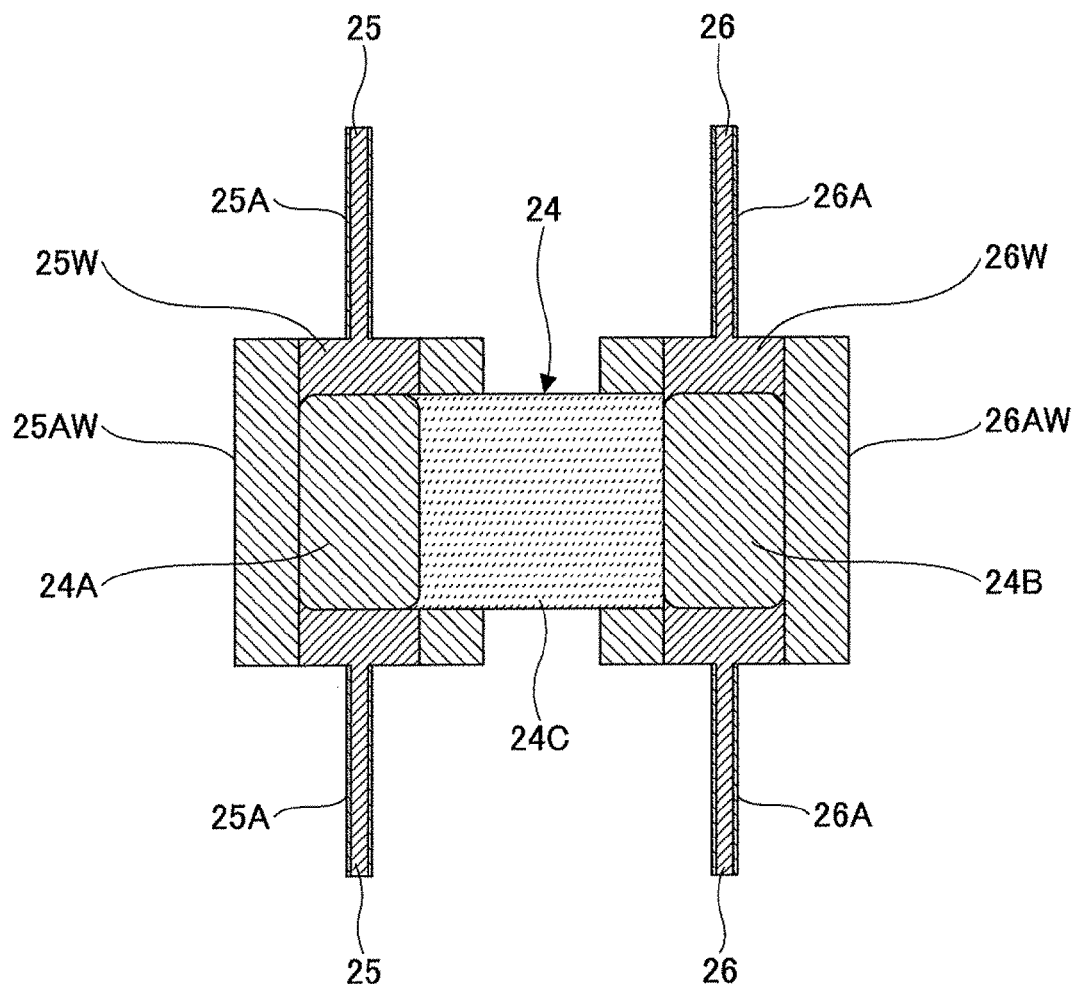
FIG. 12 is an enlarged plan view of a modified example of the passive element of First Embodiment.

Said differently, it is possible to closely arrange many chip-type capacitative elements 24 in the periphery of the semiconductor element 22 with the structure illustrated in FIG. 12.

Figure 13A:
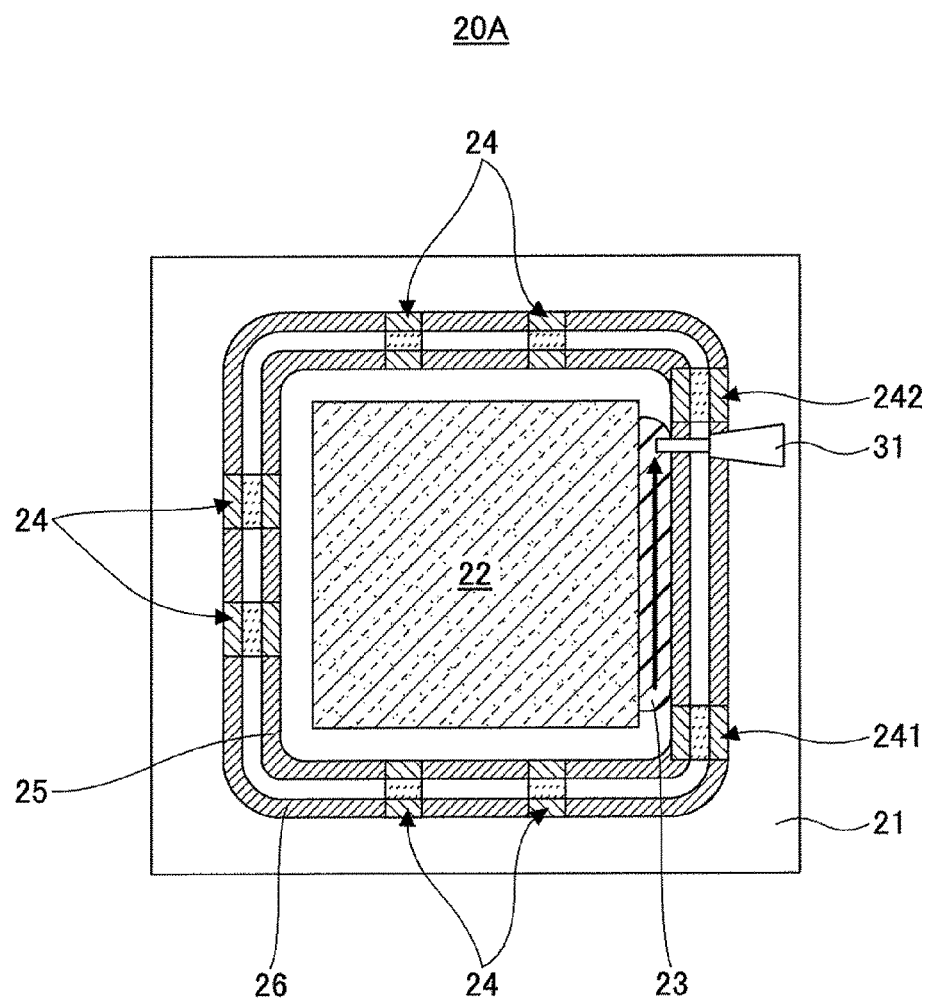
FIG. 13A is a plan view of the modified example of the passive element of First Embodiment.
Figure 13B:
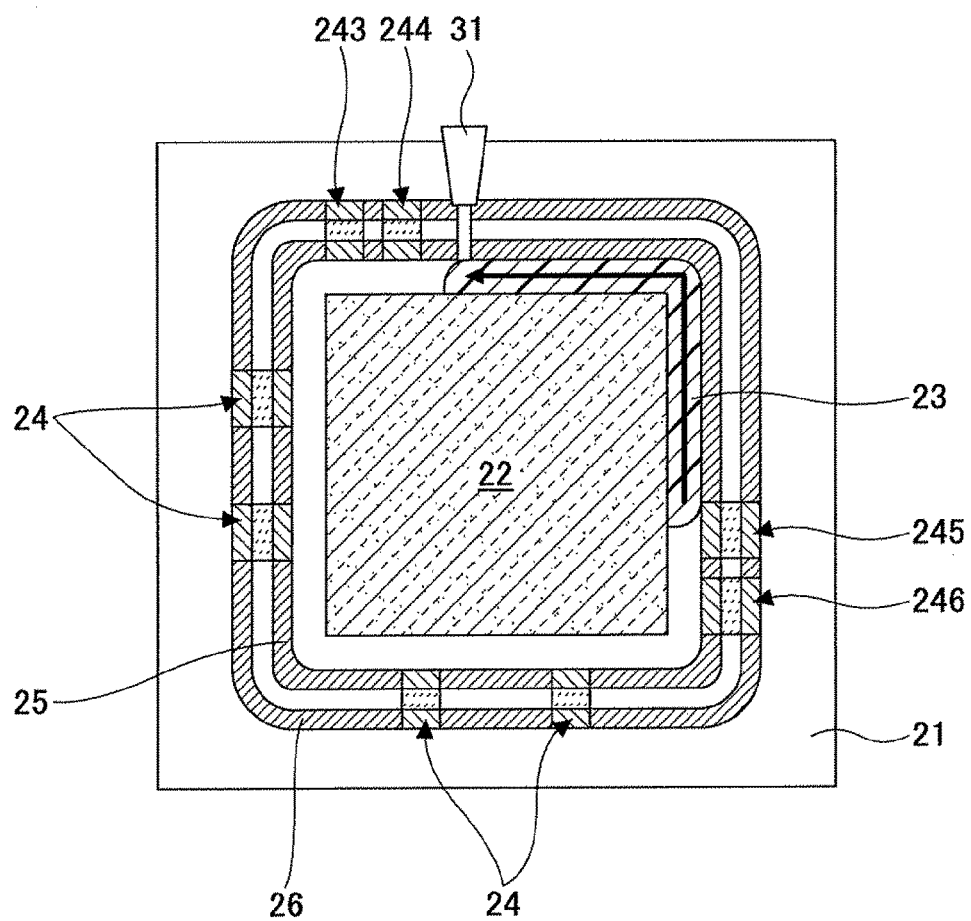
FIG. 13B is a plan view of the modified example of the passive element of First Embodiment.

FIG. 13A and FIG. 13B illustrate semiconductor devices 20A and 20B of a modified example of First Embodiment.

As described, the semiconductor chip 22 is doubly surrounded by the first conductive pattern 25 and the second conductive pattern 26 on the wiring board 21. The chip-type capacitative elements 24 surround the semiconductor element 22 and are installed to bridge between the conductive pattern 25 and the conductive pattern 26.

Referring to FIG. 9A and FIG. 9B, when the underfill resin 23 is supplied by the dispenser 31 and the dispenser 31 interferes with the already installed chip-type capacitative element 24, it is possible to appropriately arrange the chip-type capacitative element at a position where the dispenser 31 does not interfere with the chip-type capacitative element 24.

For example, in an example of the semiconductor device 20A illustrated in FIG. 13A, the dispenser 31 moves along a right edge of the semiconductor element 22 as indicated by an arrow. The chip-type capacitative elements 241 and 242 are arranged at a position other than within the moving range of the dispenser 31. There is no interference between the dispenser 31 and the chip-type capacitative elements 24.

In the example of the semiconductor device 20B illustrated in FIG. 13B, the dispenser 31 moves by turning around an upper right corner from the right edge to the upper edge as indicated by an arrow. The chip-type capacitative elements 243 and 244 are collectively arranged in the vicinity of the upper left corner of the semiconductor element 22. The chip-type capacitative elements 245 and 246 are collectively arranged in the vicinity of the lower right corner of the semiconductor element 22.

With the modified example of First Embodiment, the first conductive pattern 25 surrounds the mounting area of the semiconductor element 22. Therefore, a degree of freedom in arranging the passive elements such as the chip-type capacitative elements 24 is enhanced, and the passive elements may be arranged while avoiding a supplying position of the underfill resin 23 when the semiconductor element 22 is installed. Thus, it is possible to avoid a problem that the dispenser 31 used for supplying the underfill resin interfers with the passive elements.

In comparison, a dispenser may interfere with the chip-type capacitative element 14 in the example semiconductor device 10 illustrated in FIG. 1A. In this case, the position of supplying the underfill resin 13 using the dispenser is limited.

When the chip-type capacitative elements 24 are collectively arranged, even if the conductive pattern 25 and the conductive pattern 26 are symmetrically arranged, the so-called tombstone effect is apt to occur in the chip-type capacitative elements 24.

In this case, by reducing the width of the solder patterns of the conductive patterns 25 and 26 between the chip-type capacitative element such as the chip-type capacitative element 243 and the chip-type capacitative element such as the chip-type capacitative element 244 as illustrated in FIG. 12, the interference of the molten solder may be reduced.

Figure 14A:
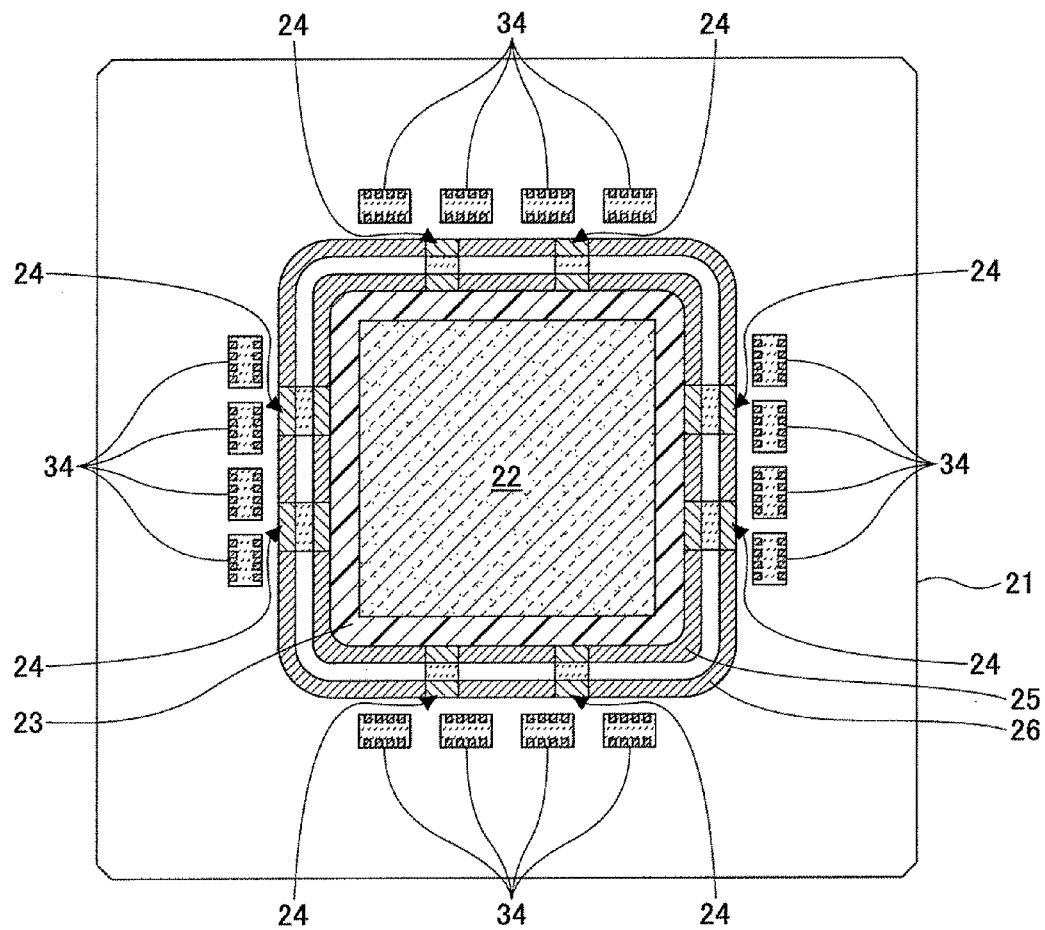
FIG. 14A is a plan view of a modified example of the passive element of First Embodiment.
Figure 14B:
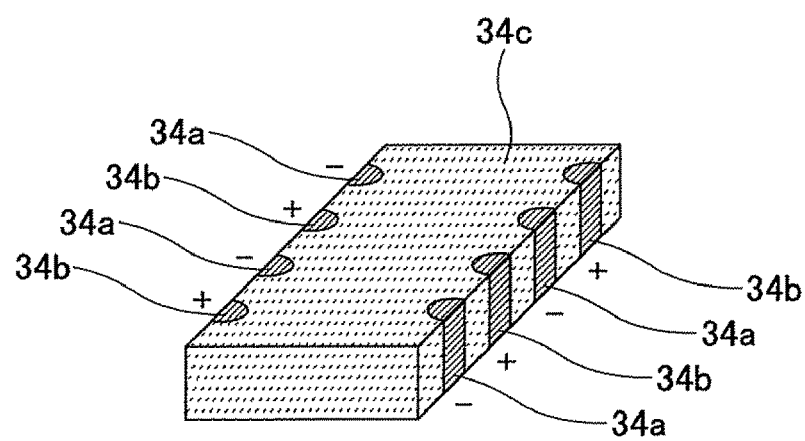
FIG. 14B is a perspective view of a multi-terminal ceramic capacitor used in the modified example of the passive element of First Embodiment illustrated in FIG. 14A.

The semiconductor device 20 of First Embodiment blocks the extension of the underfill resin 23 with the first conductive pattern 25. Therefore, a region covered by an extending underfill resin on the wiring board 21 does not appear outside the conductive pattern 26 as illustrated in FIG. 14A. Passive elements such as chip-type capacitative elements having a multi terminal structure in which terminals 34a and 34b are alternately arranged along side edge portions of the ceramic body 34c may be arranged in the region outside the conductive pattern 26 as illustrated in FIG. 14B. Active elements such as DRAM 35 may be arranged in the region outside the conductive pattern 26 as illustrated in FIG. 14C.

Then, use efficiency of the surface of the wiring board can be improved, and the function of the semiconductor device can be further improved.

In the case of the chip-type capacitative element 34 having the multi terminal structure, when the region outside the conductive pattern 26 is covered by the underfill resin 23, there occurs the problem illustrated in reference to FIG. 2A to FIG. 2C above. Therefore, the structure illustrated in FIG. 14A can be realized only when the size of a mounting board (wiring board) 21 is increased.

Figure 14C:
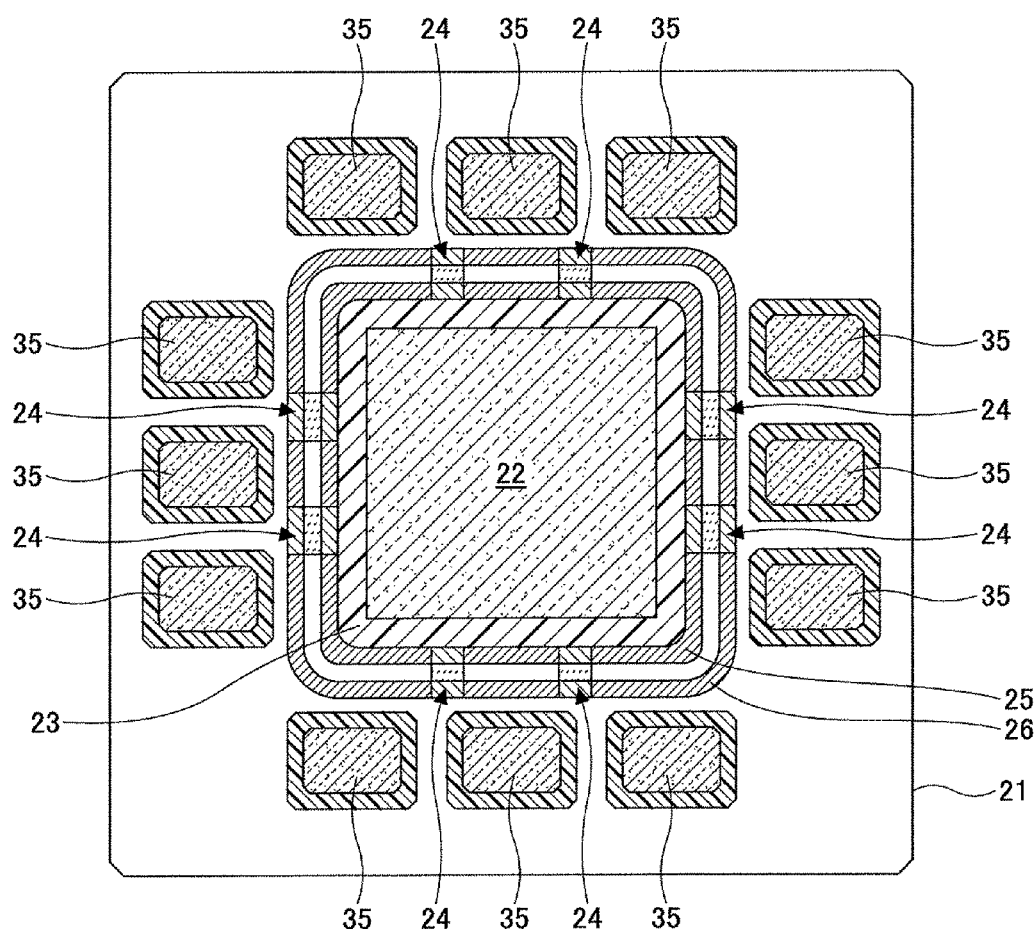
FIG. 14C is a plan view of a modified example of the passive element of First Embodiment.

In the case of the DRAM 35 illustrated in FIG. 14C, since there is a limit of heat in the DRAM 35, the DRAM 35 may be installed in the final process. If the underfill resin covers mounting pads for the DRAM 35, the DRAMs 35 cannot be mounted.

Said differently, the structure illustrated in FIG. 14C may not be realized without increasing the size of the mounting board (wiring board) 21.

In First Embodiment, the structures illustrated in FIG. 14A or FIG. 14C may be easily realized without increasing the size of the wiring board 21.

Especially, in the structure illustrated in FIG. 14C, the memory element such as the DRAM is installed together with the semiconductor element 22 to thereby form a compact system in package.

Figure 15C:
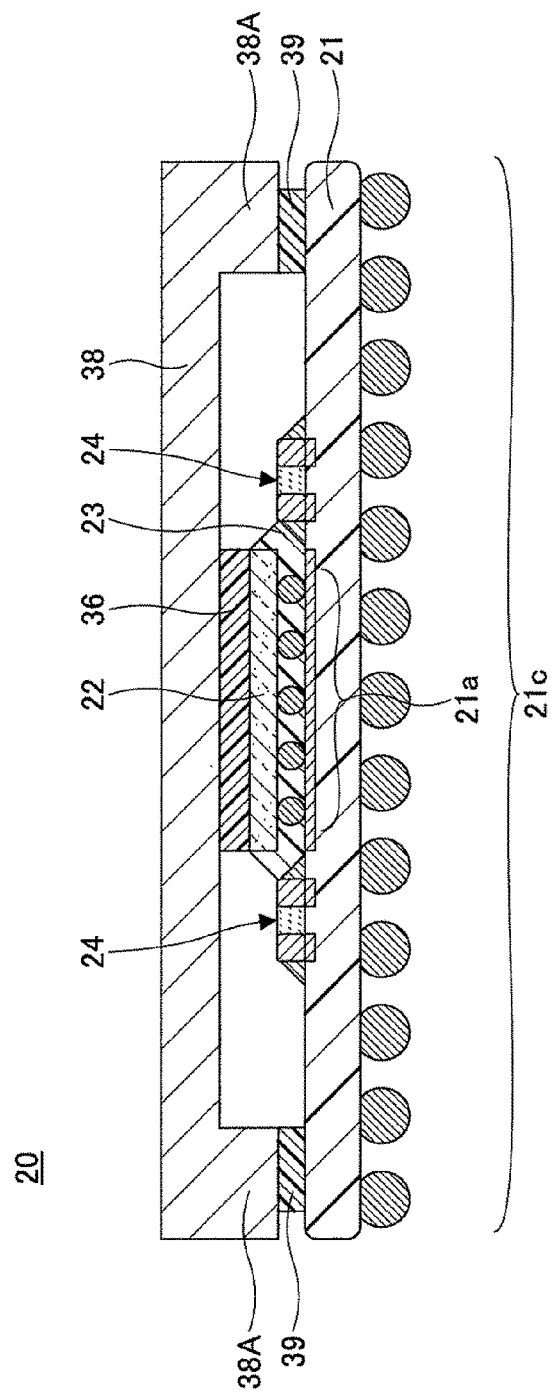
FIG. 15C is a ninth cross-sectional view of the semiconductor device for illustrating the manufacturing method of the semiconductor device of First Embodiment.

The processes further performed on the semiconductor device 20 illustrated in FIG. 10A and FIG. 10B are illustrated in FIG. 15A to FIG. 15C.

Referring to FIG. 15A, a back face, i.e. upper face, of the semiconductor element 22 is coated in a chip back face bonding layer 36 using the dispenser 37 to further form the semiconductor device 20. As illustrated in FIG. 15B, a sealing member 38 made of a heat conductive alloy such as AlSiC is arranged on the wiring board 21 so as to be joined to the bonding layer 36 on the back face of the semiconductor element 22.

The sealing member 38 having a space for accommodating the semiconductor element 22 surrounded by a joining portion 38A is bonded to an upper principal surface 21A of the wiring board 21 at the joining portion 38A by the bonding layer 39.

The semiconductor device 20 of First Embodiment illustrated in FIG. 15A or FIG. 15B may be delivered to a purchaser as a product.

When necessary, the solder bumps 21c may be formed on the external connection electrode pads 21b (see FIG. 3B) on the lower principal surface 21B as illustrated in FIG. 15C. The semiconductor device 20 formed as described above may be delivered to the purchaser as a product.

In a semiconductor device which includes a wiring board 21 illustrated in FIG. 15B or FIG. 15C and a sealing member 38 provided over the wiring board 21, the wiring board 21 may deflect due to a difference between the thermal expansion coefficients of the wiring board 21 and the sealing member 38.

The deflection amount may increase more as a distance from the center board increases.

When the deflection occurs in the wiring board 21, there occurs a problem that the reliability of electric connection degrades.

On the contrary, since the extension of the underfill resin 23 on the wiring board 21 is prevented by a dam action of the conductive pattern 25, it becomes possible to join the sealing member 38 to the upper principal surface 21A of the wiring board 21 at a position slightly inside the wiring board 21 from an outer periphery 21e (see FIG. 17) of the wiring board 21. Therefore, it is possible to relax the deflection of the wiring board 21 due to heat even when the semiconductor element 22 produces heat.

Figure 16A:
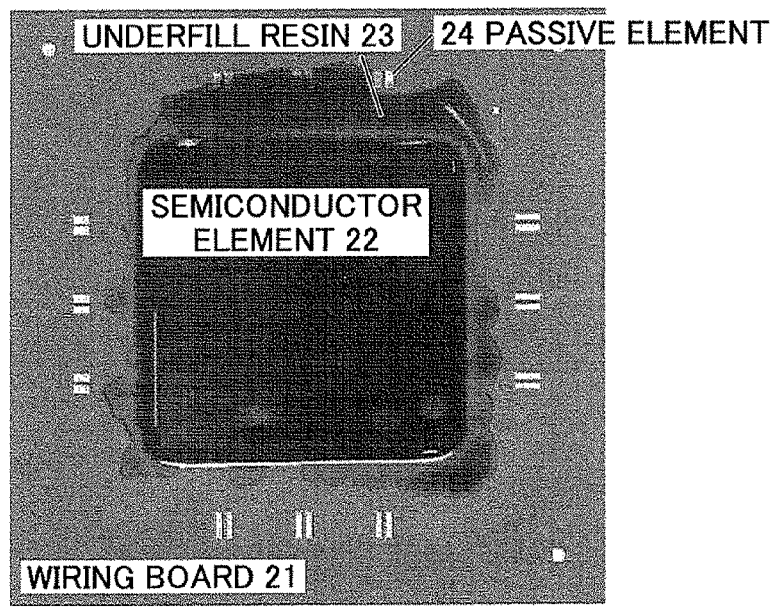
FIG. 16A illustrates wettability of an underfill resin when a dam effect does not exist.
Figure 16B:
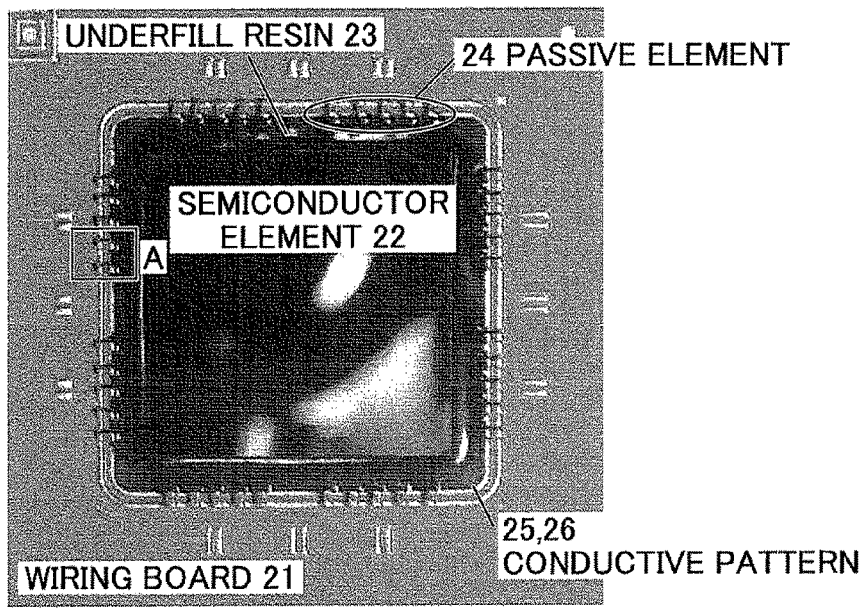
FIG. 16B illustrates wettability of an underfill resin when a dam effect does not exist.

FIG. 16A is a photo of extension of the underfill resin 23 on the surface of the wiring board 21 when the conductive patterns 25 and 26 are not provided. FIG. 16B is a photo of extension of the underfill resin 23 on the surface of the wiring board when the conductive patterns 25 and 26 are provided.

Referring to FIG. 16A and FIG. 16B, the semiconductor element 22 is not actually mounted. The underfill resin 23 is supplied by the dispenser into and formed on the occupying area C4 which is ordinarily occupied by the semiconductor element 22 on the wiring board 21 illustrated in FIG. 9A and FIG. 9B.

The epoxy resin 23 such as an item number of T693/R1000 UFR108F10 manufactured by Nagase ChemteX Corporation is used as the underfill resin 23. The underfill resin 23 is heated to 70° C. (degree C.) and supplied into the occupying area C4.

Referring to FIG. 16A and FIG. 16B, when the conductive patterns 25 and 26 are not provided, the underfill resin 23 extends outside the occupying area C4 of the semiconductor element 22 on the wiring board 21 and covers the passive elements such as chip-type capacitative elements 24 which are arranged to surround the semiconductor element 22.

On the contrary, when the conductive patterns 25 and 26 of First Embodiment are provided, the extension of the underfill resin 23 is prevented and the passive elements such as the chip-type capacitative elements 24 are not covered by the underfill resin 23.

Figure 16C:
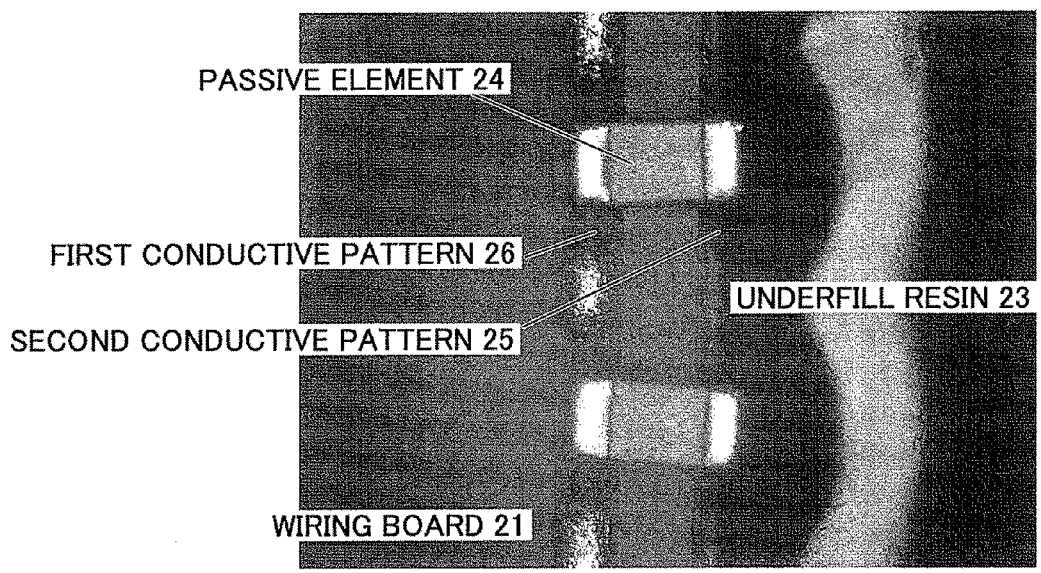
FIG. 16C is an enlarged view of a square A of FIG. 16B.

FIG. 16C is an enlarged photo of a square frame A in FIG. 16B.

Referring to FIG. 16C, the underfill resin 23 is prevented from extending by the conductive pattern 25. Thus, it is confirmed that the conductive pattern 25 fulfills a predetermined dam action.

The underfill resin is not limited to the epoxy resin, and various resins illustrated in Tables 1 to 4 are applicable.

TABLE 1

| | | MANUFACTURER | | | | |
|---|---|---|---|---|---|---|
| | | NAGASE CHEMTEX | ABLESTIK | NAMICS | HENKEL | KYOCERA CHEMICAL |
| ITEM NUMBER | | T693/ UFR108F10 | RP838-1A | NNCP013ES | FP5001 | XAP18938ES |
| APPEARANCE (COLOR) | | BLACK | WHITE | | BEIGE | BEIGE |
| CURING SYSTEM | | Epoxy | BMI Hybrid | Epoxy | Epoxy | Epoxy |
| BONDING CONDITION | STAGE TEMPERATURE | ° C. | 70 | | 70 | 50 | 50-70 |
| | CURING CONDITION | ° C./sec. | 220° C./ 5 sec. | 220° C./ 5 sec. | 270° C./ 2 sec. | 240° C./ 5 sec. | 260° C./ 2 sec. |

TABLE 2

| | | MANUFACTURER | | | | | |
|---|---|---|---|---|---|---|---|
| | | NAMICS | NAMICS | NAMICS | NAMICS | NAMICS | NAMICS |
| ITEM NUMBER | UNIT | U8437-2 | U8437-48 | U8439-1 | XS8439-105 | XS8410-73A | XS410-73B |
| APPEARANCE (COLOR) | | BLACK | BLACK | BLACK | BLACK | BLACK | BLACK |
| CURING SYSTEM | | Epoxy- Anhydride | Epoxy- Anhydride | Epoxy- Phenole | Epoxy- Phenole | Epoxy- Amine | Epoxy- Amine |
| RECOMMENDED SUPPLYING TEMPERATURE CONDITION | ° C. | 70 | 90-120 | 70 | 70-110 | 90-120 | 90-120 |
| RECOMMENDED CURING CONDITION | ° C./min. | 150° C./ 20 min. | 150° C./ 60 min. | 150° C./ 60 min. | 165° C./ 90 min. | 150° C./ 120 min. | 150° C./ 120 min. |

TABLE 3

| | | MANUFACTURER | | | | | |
|---|---|---|---|---|---|---|---|
| | | ABLESTIK | ABLESTIK | ABLESTIK | ABLESTIK | ABLESTIK | ABLESTIK |
| ITEM NUMBER | UNIT | 8802F | UF8822 | UF8826 | UF8828 | UF8829 | RP852-1 |
| APPEARANCE (COLOR) | | BLACK | TAN | OFF-WHITE | OFF-WHITE | OFF-WHITE | OFF-WHITE |
| CURING SYSTEM | | Cyanate Ester | Cyanate Ester | Cyanate Ester | Cyanate Ester | Cyanate Ester | Cyanate Ester |
| RECOMMENDED SUPPLYING TEMPERATURE CONDITION | ° C. | 100 | 100° C./ 65 sec. | 100-120/ 65 sec.+ | 100-120/ 65 sec.− | 100-120/ 65 sec. | 100 |
| RECOMMENDED CURING CONDITION | ° C./min. | 165° C./90 min. | UP TO 165° C. 30 min 165° C./90 min. | 100° C./60 min. + 165° C./90 min. | UP TO 165° C. 15 min. + 165° C./60 min. | UP TO 165° C. 30 min. + 165° C./90 min. | UP TO 165° C. 30 min. + 165° C./90 min. |

TABLE 4

| | | MANUFACTURER | | |
|---|---|---|---|---|
| | | NIPPON STEEL CHEMICAL | NIPPON STEEL CHEMICAL | NIPPON STEEL CHEMICAL |
| ITEM NUMBER | UNIT | NEX-3514F (041) | NEX-351R (040) | NEX-351R (046) |
| APPEARANCE (COLOR) | | | | |
| CURING SYSTEM | | Epoxy-Anhydride | Epoxy-Anhydride | Epoxy-Anhydride |
| RECOMMENDED SUPPLYING TEMPERATURE CONDITION | GEL TIME | ROOM TEMPERATURE | 50-80 | |
| RECOMMENDED CURING CONDITION | ° C. | 120° C./10 min. | 150° C./30 min. | |

Table 1 illustrates stage temperatures used when resins are supplied via the dispensers illustrated in FIG. 9A and FIG. 9B and corresponding curing conditions.

Figure 17:
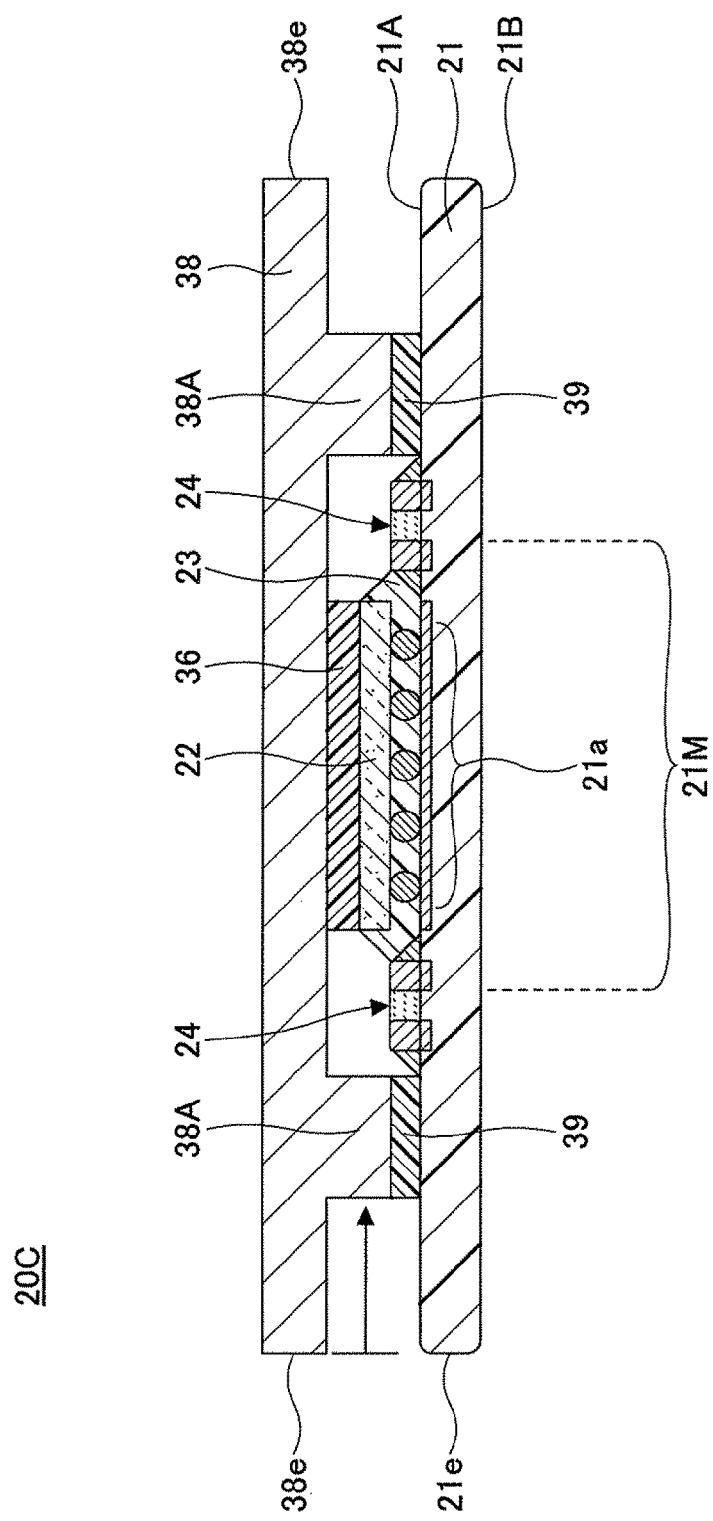
FIG. 17 is an enlarged cross-sectional view of a modified example of the semiconductor device of First Embodiment.

A semiconductor device 20C of a modified example of First Embodiment is illustrated in FIG. 17.

Referring to FIG. 17 of the modified example, a joining portion 38A of a sealing member 38 is formed at a position inside of an outer edge 38e along an arrow in comparison with the structure illustrated in FIG. 15C.

With the structure, the joining portion 38A is formed at the position toward the center of the wiring board 21 from an outer edge 21e of the wiring board 21.

By joining the sealing member 38 to the wiring board 21 at a position inside the outer edge 21e of the wiring board 21, it is possible to solve the problem of the deflection caused by the difference between the thermal expansion coefficients of the sealing member 38 and the wiring board 21.

This structure is enabled to be employed because a region for joining the joining portion 38A of the sealing member 38 is secured on the surface of the wiring board 21. The region is obtained since the passive elements such as chip-type capacitative elements 24 are arranged in the immediate vicinity of the mounting area 22M of the semiconductor element 22 as a result of the prevention of the extension of the underfill resin 23 with the conductive pattern 25.

Figure 18A:
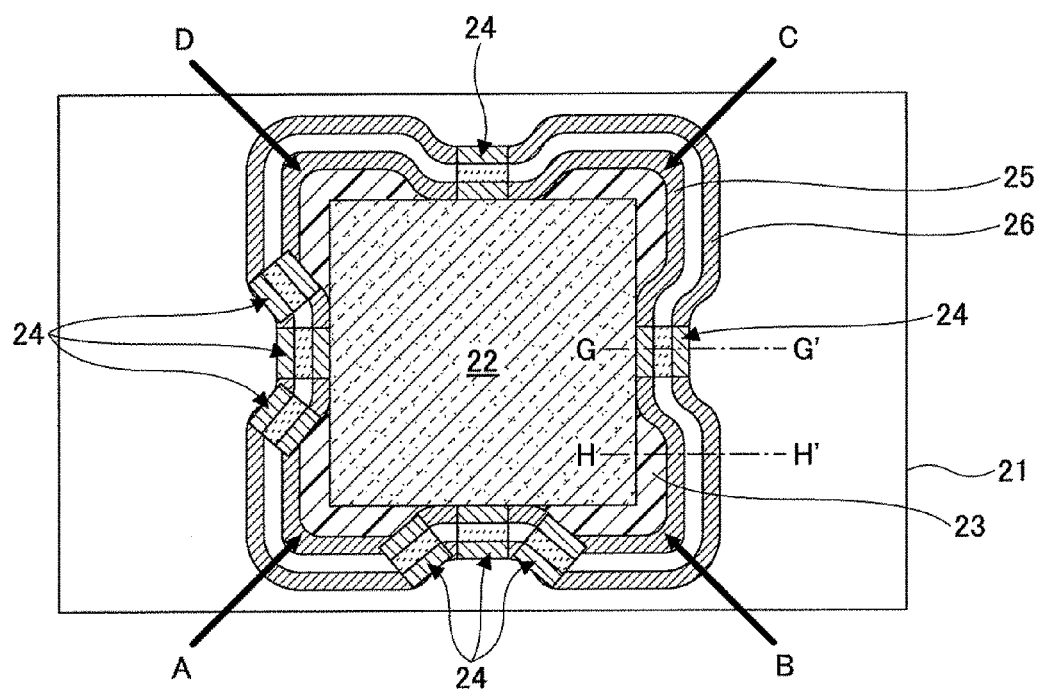
FIG. 18A is a plan view of a modified example of the semiconductor device of First Embodiment.
Figure 18B:
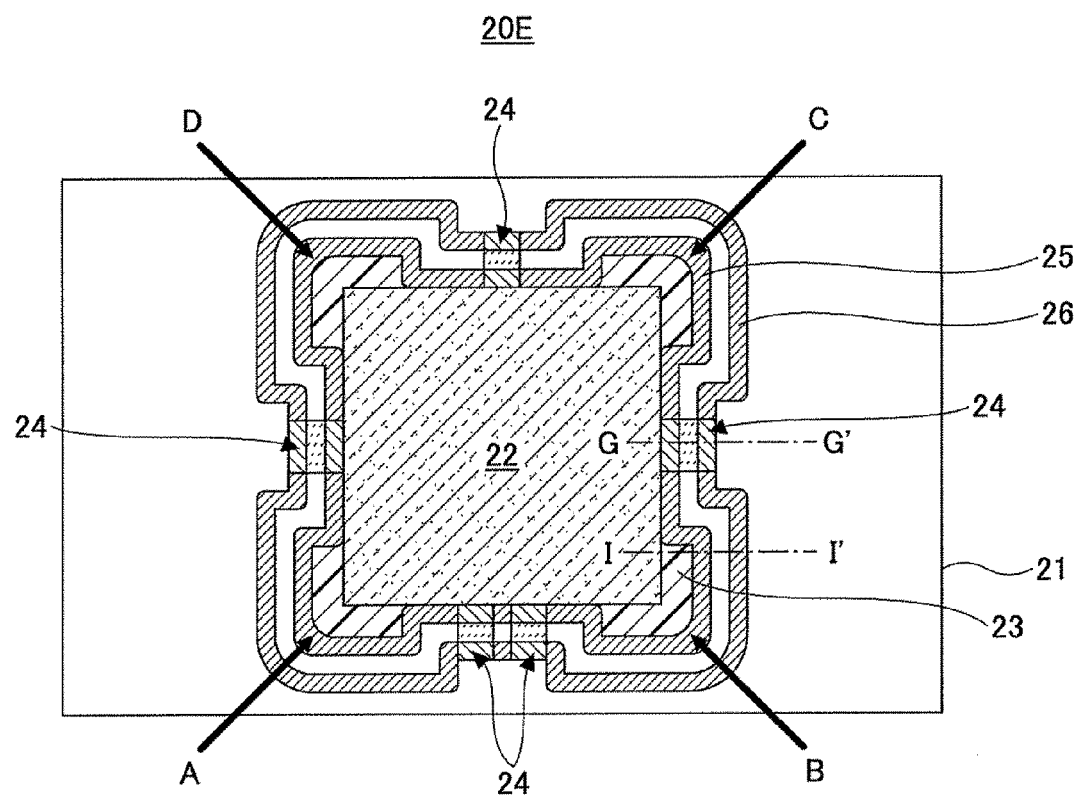
FIG. 18B is a plan view of a modified example of the passive element of First Embodiment.
Figure 18D:
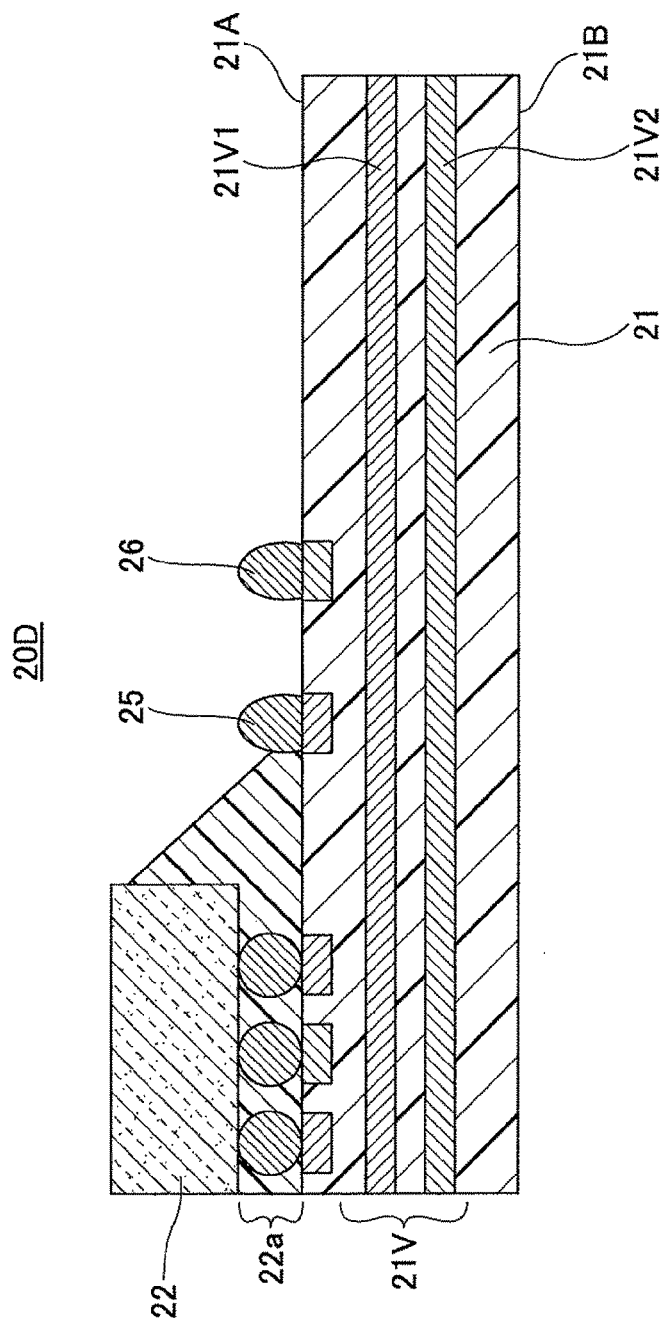
FIG. 18D is a cross-sectional view of the semiconductor device illustrated in FIG. 18A taken along a line H-H' of FIG. 18A.
Figure 18E:
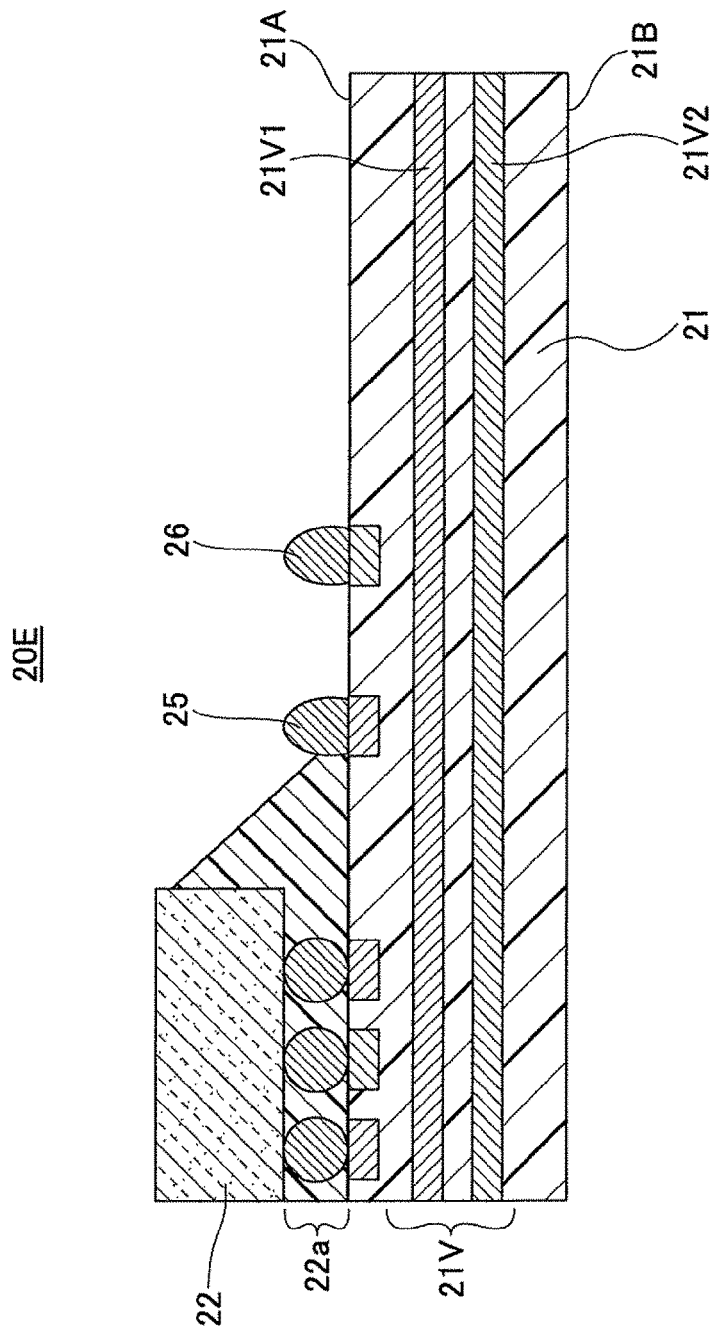
FIG. 18E is a cross-sectional view of the semiconductor device illustrated in FIG. 18A taken along a line I-I' of FIG. 18B.

FIG. 18A and FIG. 18B illustrate semiconductor devices 20D and 20E of other modified examples of the semiconductor device of First Embodiment. FIG. 18C is a cross-sectional view of FIG. 18A taken along a line G-G'. FIG. 18D is a cross-sectional view of FIG. 18A taken along a line H-H'. FIG. 18E is a cross-sectional view of FIG. 18B taken along a line I-I'.

Referring to FIG. 18A of the modified example, parts of the conductive patterns 25 and 26 bend and gradually transit toward the occupying area C4 of the semiconductor element 22 at portions in which the chip-type capacitative elements 24 are provided. As a result, the chip-type capacitative elements 24 may be provided in the immediate vicinity of the semiconductor element 22 as illustrated in FIG. 18C.

With this, a distance between the semiconductor element 22 and the chip-type capacitative element 24 may be minimized. Therefore, a parasitic inductance or a parasitic capacitance of a wiring between the semiconductor element 22 and the chip-type capacitative element 24 are reduced to thereby further improve an electric property of the semiconductor device.

In the modified example illustrated in FIG. 18A, the conductive patterns 25 and 26 are formed away from the semiconductor element 22 on a region other than the forming regions of the chip-type capacitative elements 24 as illustrated in FIG. 18D.

In the supplying process of the underfill resin illustrated in FIG. 9A and FIG. 9B, the underfill resin 23 can be supplied using the dispenser 31 from any one of positions indicated by arrows A to D in FIG. 18A.

In the structure illustrated in FIG. 18B, the conductive patterns 25 and 26 are bent at right angles, and the underfill resin 23 may be supplied from any one of the positions indicated by arrows A to D in FIG. 18A in a similar manner to the structure illustrated in FIG. 18A. Since the conductive patterns 25 and 26 are bent at the right angles, a degree of freedom in selecting the supplying positions for the dispenser 31 is improved on the region other than the forming regions of the chip-type capacitative elements 24 as illustrated in FIG. 18E in comparison with the structure of FIG. 18A.

Referring to FIG. 18A and FIG. 18B of the modified examples, the thick underfill resin layer 23 may be formed at the corner portions of the semiconductor element 22 on which thermal stress is apt to concentrate. Therefore, overall mechanical and electric stability and reliability of the semiconductor device are improved. From this view points, the structure of FIG. 18A is more preferable than the structure of FIG. 18B since the amount of the underfill resin 23 supporting the semiconductor element 22 can be increased in the corners of the semiconductor element 22.

Since the bent conductive patterns 25 and 26 are parallel to each other in the structure illustrated in FIG. 18A, it is possible to arrange many chip-type capacitative elements 24 at arbitrary positions as illustrated in FIG. 18A.

Figure 19:
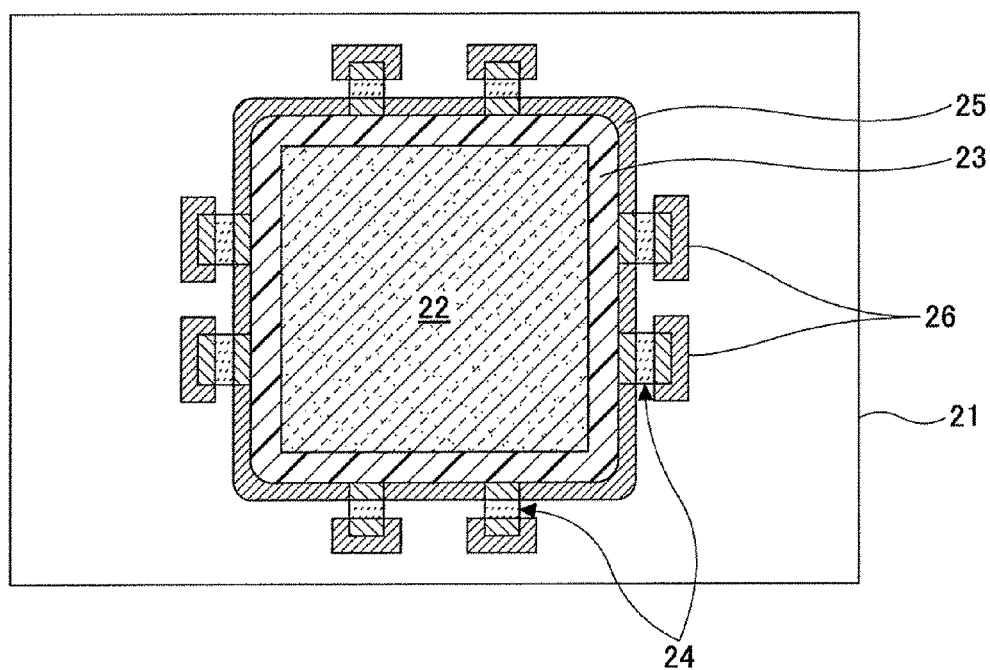
FIG. 19 is a plan view of a modified example of a semiconductor device of First Embodiment.
Figure 20A:
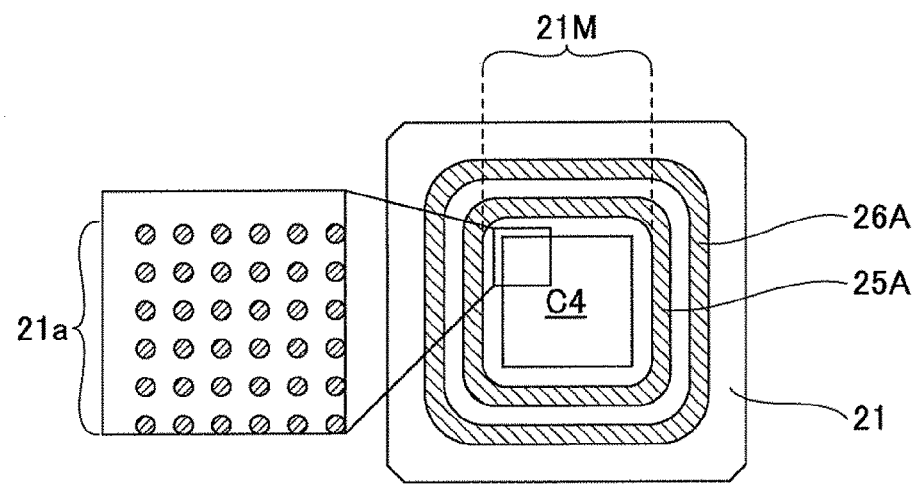
FIG. 20A is a first plan view of a semiconductor device for illustrating a manufacturing method of the semiconductor device of Second Embodiment.
Figure 20B:
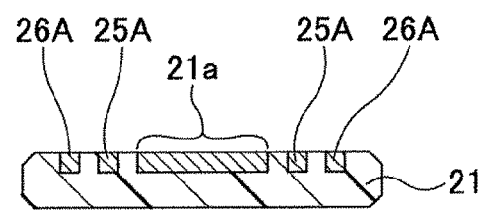
FIG. 20B is a first cross-sectional view of the semiconductor device for illustrating the manufacturing method of the semiconductor device of Second Embodiment.
Figure 21A:
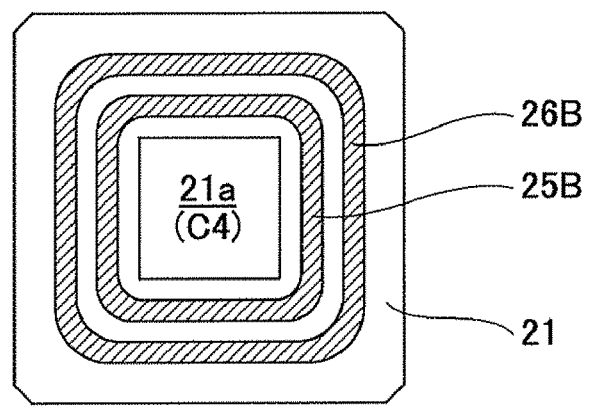
FIG. 21A is a second plan view of the semiconductor device for illustrating the manufacturing method of the semiconductor device of Second Embodiment.
Figure 21B:
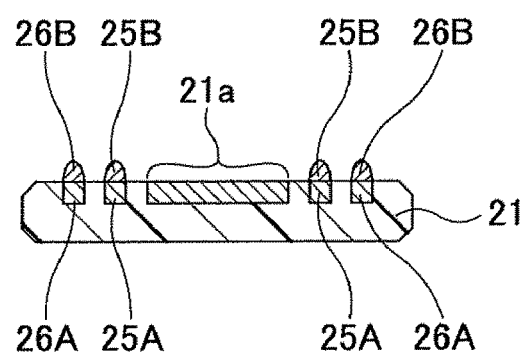
FIG. 21B is a second cross-sectional view of the semiconductor device for illustrating the manufacturing method of the semiconductor device of Second Embodiment.

FIG. 19 illustrates a semiconductor device 20F of another modified example of First Embodiment.

Referring to FIG. 19, it is possible to form the outer conductive pattern 26 so as to exist except for intermittently forming regions of chip-type capacitative elements 24.

Second Embodiment

The manufacturing method of a semiconductor device 40 is illustrated in FIG. 20A and FIG. 20B to FIG. 25A and FIG. 25B. FIG. 20B to FIG. 25B are cross-sectional views of the semiconductor device 40 illustrated in FIG. 22A taken along a line J-J'. The same reference symbols are used for portions corresponding to the portions described above and description of these portions is omitted.

The processes illustrated in FIG. 20A and FIG. 20B to FIG. 25A and FIG. 25B are substantially the same as the processes illustrated in FIG. 5A and FIG. 5B to FIG. 7A and FIG. 7B. As illustrated in FIG. 22A and FIG. 22B, a first conductive pattern 25 and a second conductive pattern 26 are formed by solder patterns so as to surround a mounting area 21M illustrated in FIG. 20A on an upper principal surface 21A of a wiring board 21.

Figure 22A:
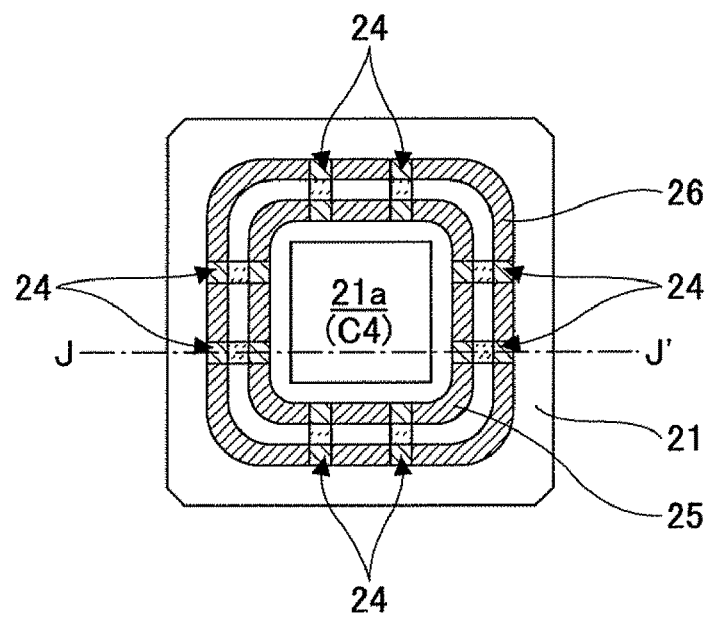
FIG. 22A is a third plan view of the semiconductor device for illustrating the manufacturing method of the semiconductor device of Second Embodiment.
Figure 22B:
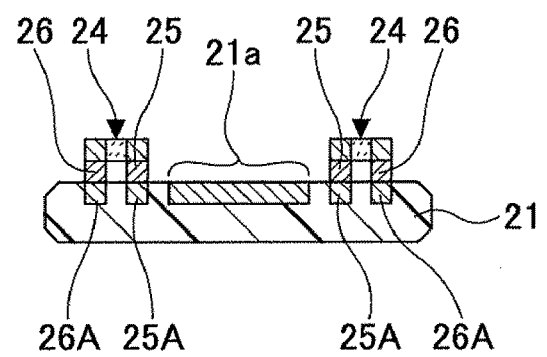
FIG. 22B is a third cross-sectional view of the semiconductor device for illustrating the manufacturing method of the semiconductor device of Second Embodiment.

Referring to FIG. 22A and FIG. 22B, chip-type capacitative elements 24 are mounted between the conductive patterns 25 and 26.

Figure 23A:
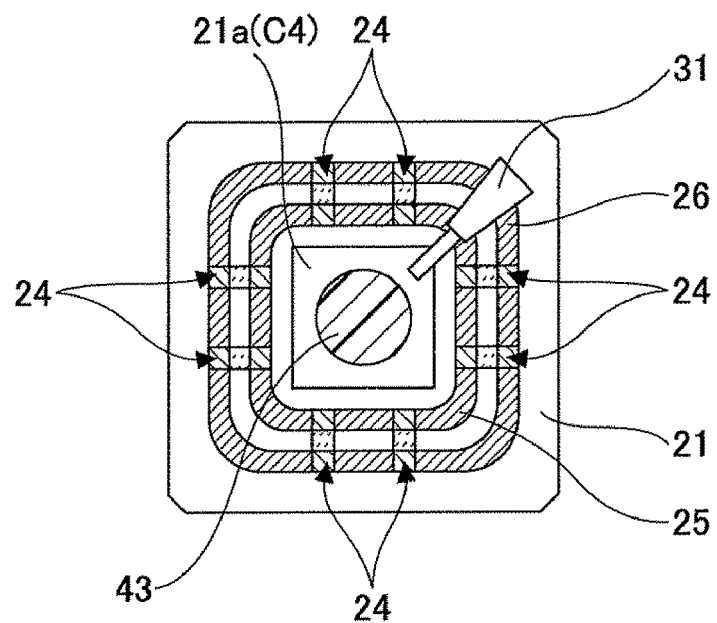
FIG. 23A is a fourth plan view of the semiconductor device for illustrating the manufacturing method of the semiconductor device of Second Embodiment.
Figure 23B:
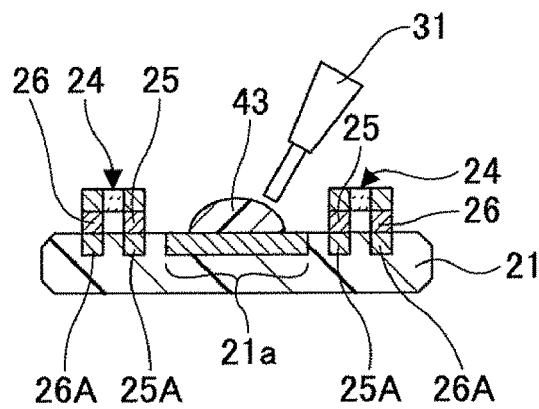
FIG. 23B is a fourth cross-sectional view of the semiconductor device for illustrating the manufacturing method of the semiconductor device of Second Embodiment.

Referring to FIG. 23A and FIG. 23B of a Second Embodiment, an underfill resin 43 as much as a predetermined amount is supplied to an occupying area C4 on which arrays of electrode pads are formed on upper principal surface 21A using a dispenser 31.

Figure 24A:
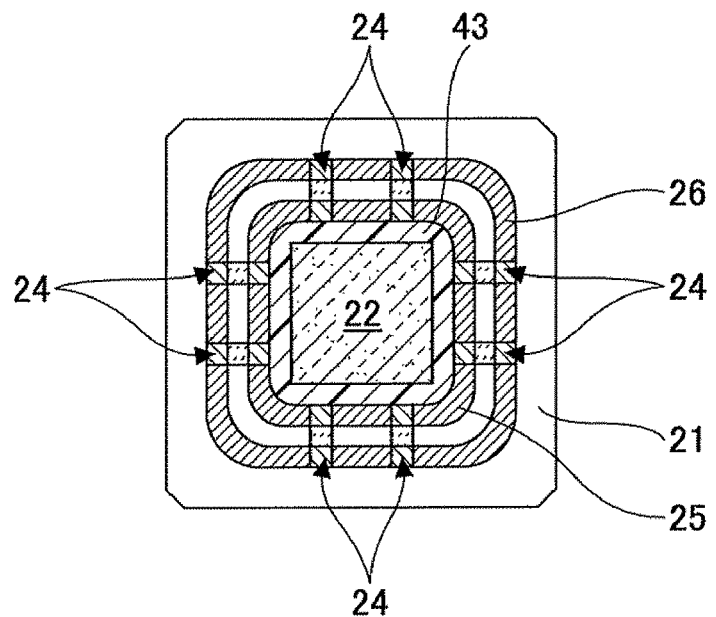
FIG. 24A is a fifth plan view of the semiconductor device for illustrating the manufacturing method of the semiconductor device of Second Embodiment.
Figure 24B:
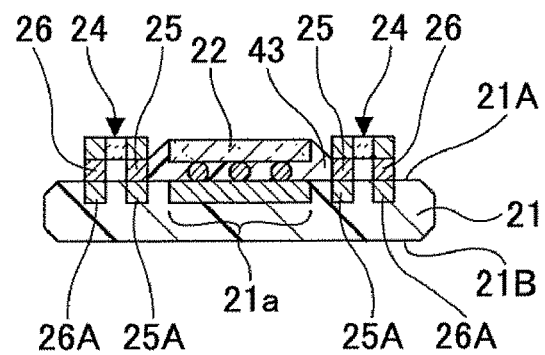
FIG. 24B is a fifth cross-sectional view of the semiconductor device for illustrating the manufacturing method of the semiconductor device of Second Embodiment.

Thereafter, as illustrated in FIGS. 24A and 24B, the semiconductor element 22 is mounted on the electrode pad 21a by flip chip mounting. Therefore, a flux (active component) such as adipic acid, succinic acid, and glutaric acid anhydride is added to the underfill resin 43 to promote joining between bump electrodes and the electrode pads 21a. The predetermined amount of the underfill resin 43 is an amount of an underfill resin 43 sufficient for filling a gap between the semiconductor element 22 and the upper principal surface 21A and forming a fillet which supports side wall faces of the semiconductor element 22 when the semiconductor element 22 is mounted on the upper principal surface 21A of the wiring board 21 by flip chip mounting.

In Second Embodiment, the underfill resin 43 is prevented from extending over the conductive pattern 25 by a dam action of the conductive pattern 25.

Figure 25A:
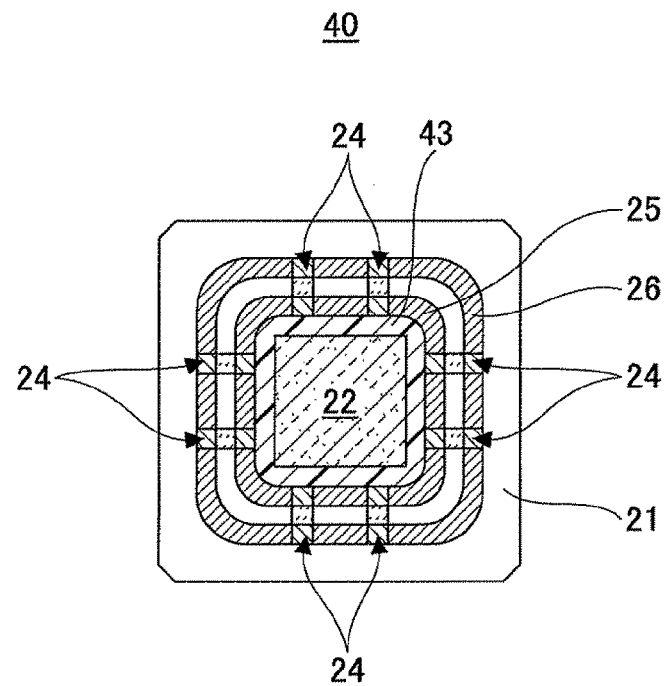
FIG. 25A is a sixth plan view of the semiconductor device for illustrating the manufacturing method of the semiconductor device of Second Embodiment.
Figure 25B:
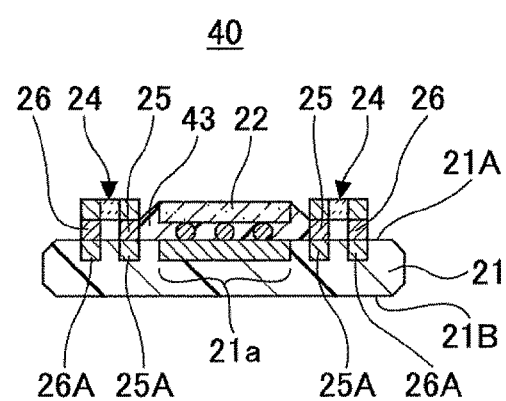
FIG. 25B is a sixth cross-sectional view of the semiconductor device for illustrating the manufacturing method of the semiconductor device of Second Embodiment.

Further, the underfill resin 43 is hardened under states illustrated in FIG. 24A and FIG. 24B. Thus, the semiconductor device 40 illustrated in FIG. 25A and FIG. 25B is obtainable.

With Second Embodiment, the underfill resin 43 may not be supplied after mounting the semiconductor element 22 as illustrated in FIG. 9A and FIG. 9B. As illustrated in a modified example of Second Embodiment illustrated in FIG. 26A to FIG. 26C, the conductive pattern 25 may be formed in contact with the outer periphery of the semiconductor element 22.

Figure 26A:
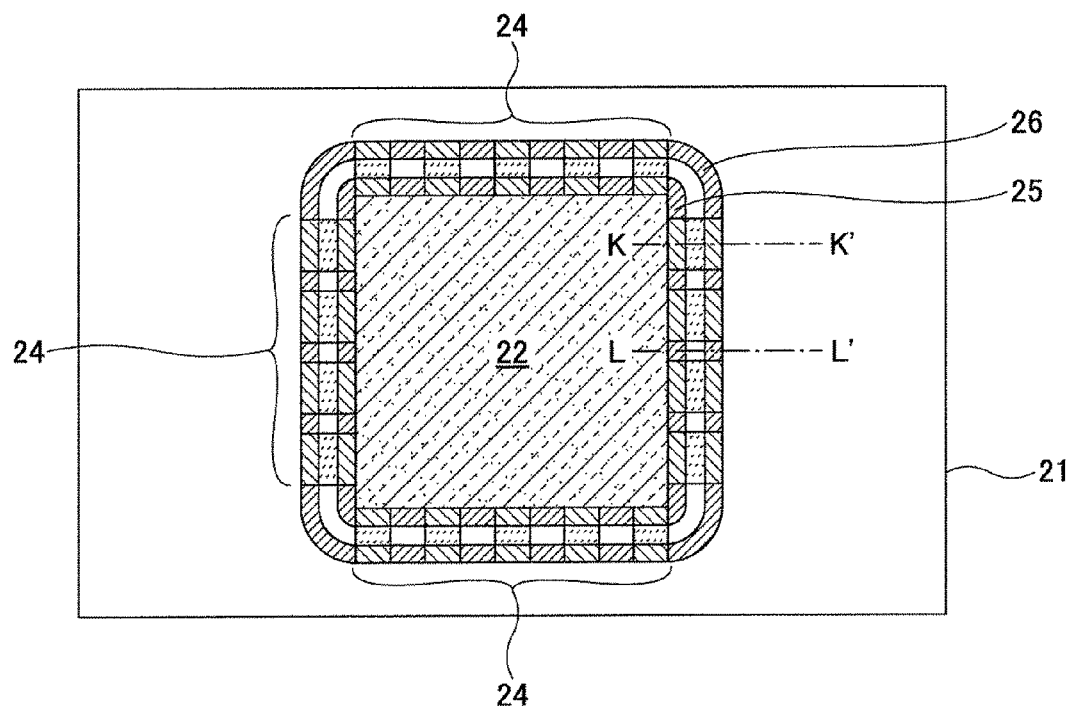
FIG. 26A is a plan view of a semiconductor device of a modified example of Second Embodiment.
Figure 26C:
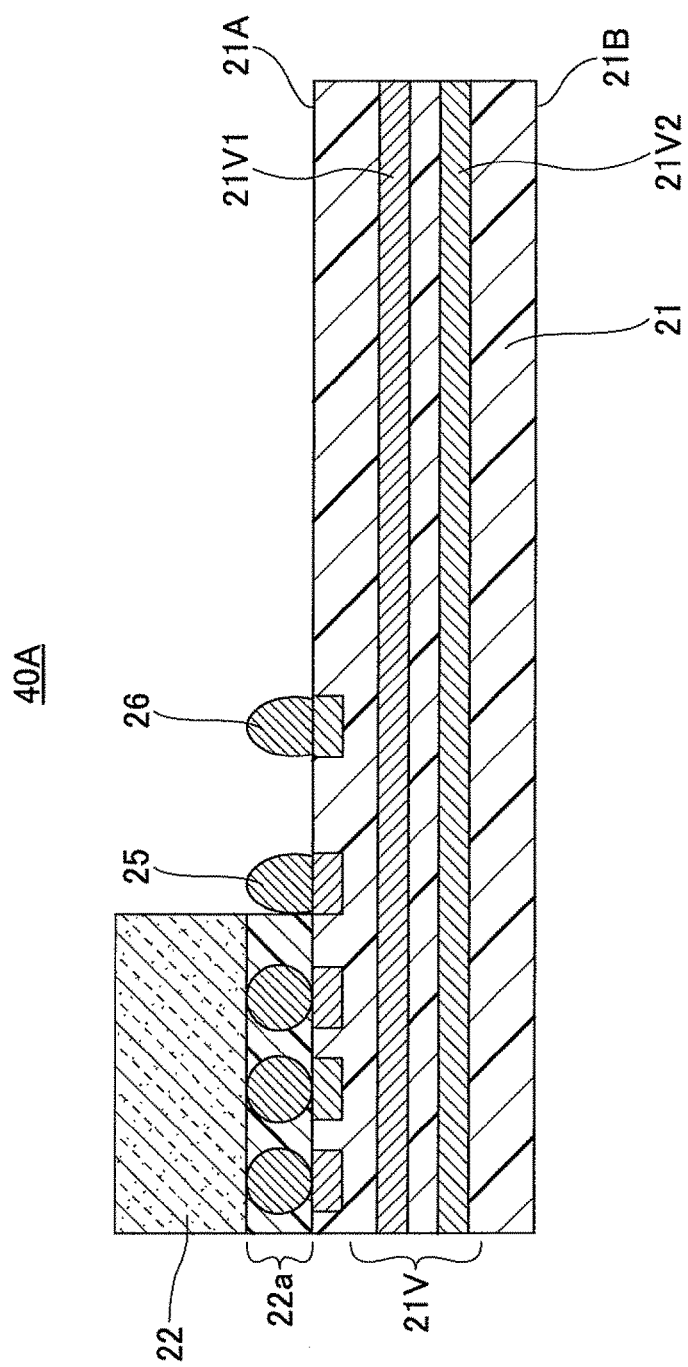
FIG. 26C is a cross-sectional view of the semiconductor device of the modified example of Second Embodiment taken along a line L-L' of FIG. 26A.

FIG. 26B and FIG. 26C are cross-sectional views of FIG. 26A taken along lines K-K' and L-L'. The same reference symbols are used for portions corresponding to the portions described above and description of these portions is omitted.

By forming the conductive pattern 25 in contact with or the vicinity of the outer periphery of the semiconductor element 22, the chip-type capacitative element 24 may be arranged in contact with or the vicinity of the outer periphery of the semiconductor element 22. Then, it becomes possible to further suppress a parasitic inductance or a parasitic capacitance of wiring between the semiconductor element 22 and the chip-type capacitative elements 24. In addition, an electric property of the semiconductor device 40 may be further improved.

In a similar manner to First Embodiment, by providing the processes illustrated FIG. 15A to FIG. 15C to the semiconductor device 40 illustrated in FIG. 25A and FIG. 25B or the semiconductor device 40A illustrated in FIG. 26A and FIG. 26B, the sealing resin member 38 and solder bumps 21 may be formed.

Various modifications are possible in Second Embodiment like first embodiment.

Third Embodiment

The structure of a semiconductor device of Third Embodiment enable to prevent extension of an underfill resin on a wiring board. Therefore, the structure is effective in applying to a multi chip module in which a large number of semiconductor elements are closely mounted on a single wiring board.

Figure 27:
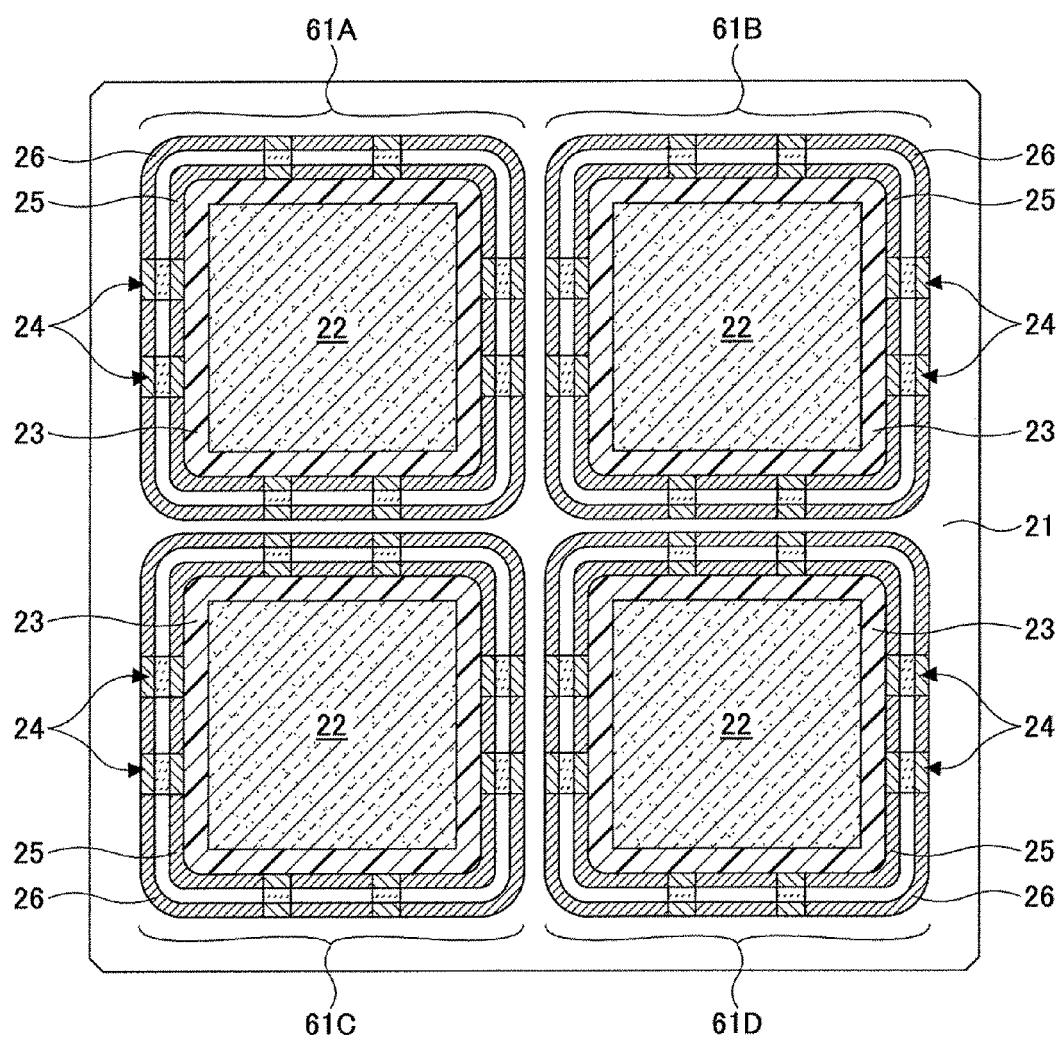
FIG. 27 is a plan view of a semiconductor device of Third Embodiment.

The structure of the semiconductor device 60 of Third Embodiment is illustrated in FIG. 27.

Referring to FIG. 27, plural semiconductor device elements 61A to 61D each including a single semiconductor element 22 are arranged like a matrix on a wiring board 21. The plural semiconductor device elements 61A to 61D may be any one of the semiconductor devices 20 to 20F of First Embodiment and the semiconductor devices 40 and 40A of Second Embodiment.

In the structure illustrated in FIG. 27, passive elements such as chip-type capacitative elements 24 may be arranged between a pair of semiconductor chips adjacent to each other in up and down directions or right and left directions. Therefore, an excellent electric property can be assured in the semiconductor device having the multi chip modules.

Figure 28:
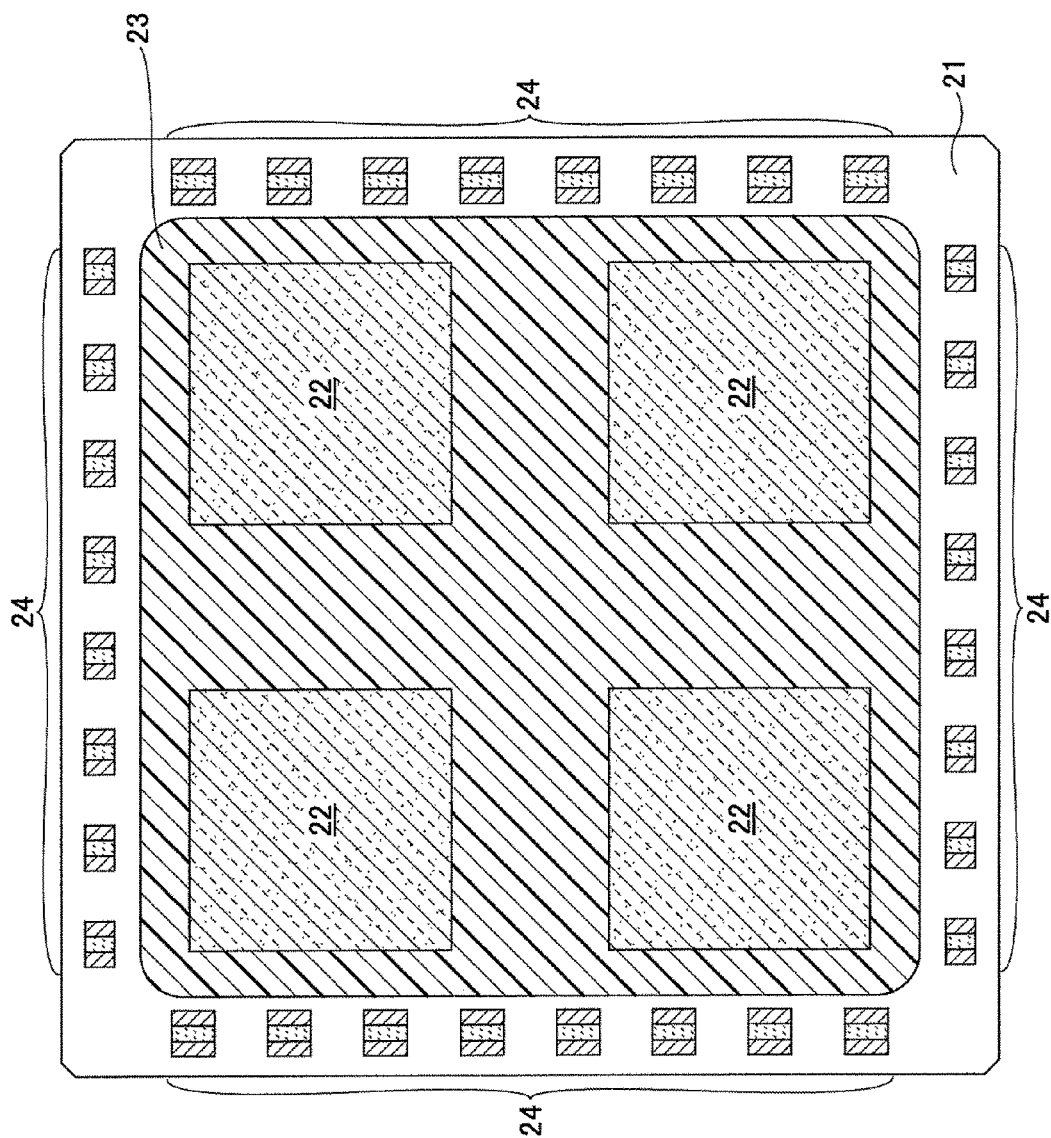
FIG. 28 is a plan view of a semiconductor device of a comparative example relative to the semiconductor device of Third Embodiment.
Figure 29:
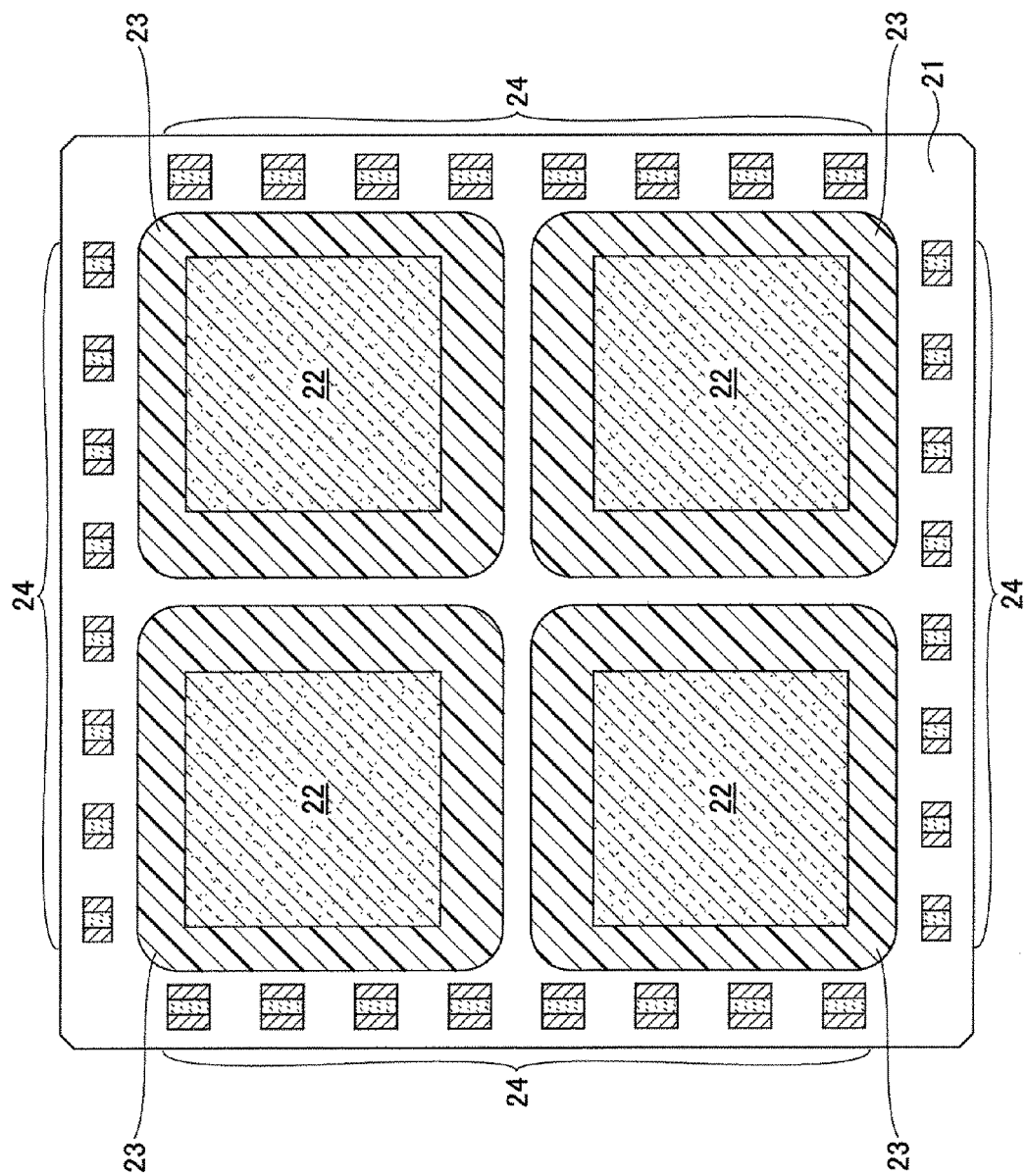
FIG. 29 is a plan view of a semiconductor device of another comparative example relative to the semiconductor device of Third Embodiment.

On the contrary, if the semiconductor device elements 61A to 61D does not have the conductive patterns 25 and 26, the underfill resin 23 extends from the semiconductor elements 22 as illustrated in FIG. 28 or 29. In this case, the passive elements such as the chip-type capacitative elements 24 can be arranged on the wiring board 21 while surrounding the plural semiconductor elements. Then, a sufficient number of chip-type capacitative elements 24 cannot be arranged on the wiring board 21 thereby insufficiently stabilizing electric properties.

Referring to FIG. 28 and FIG. 29, the same reference symbols as those in FIG. 27 are used for convenience. FIG. 28 and FIG. 29 do not illustrate the semiconductor device of Third Embodiment nor a modified example of Third Embodiment.

Figure 30:
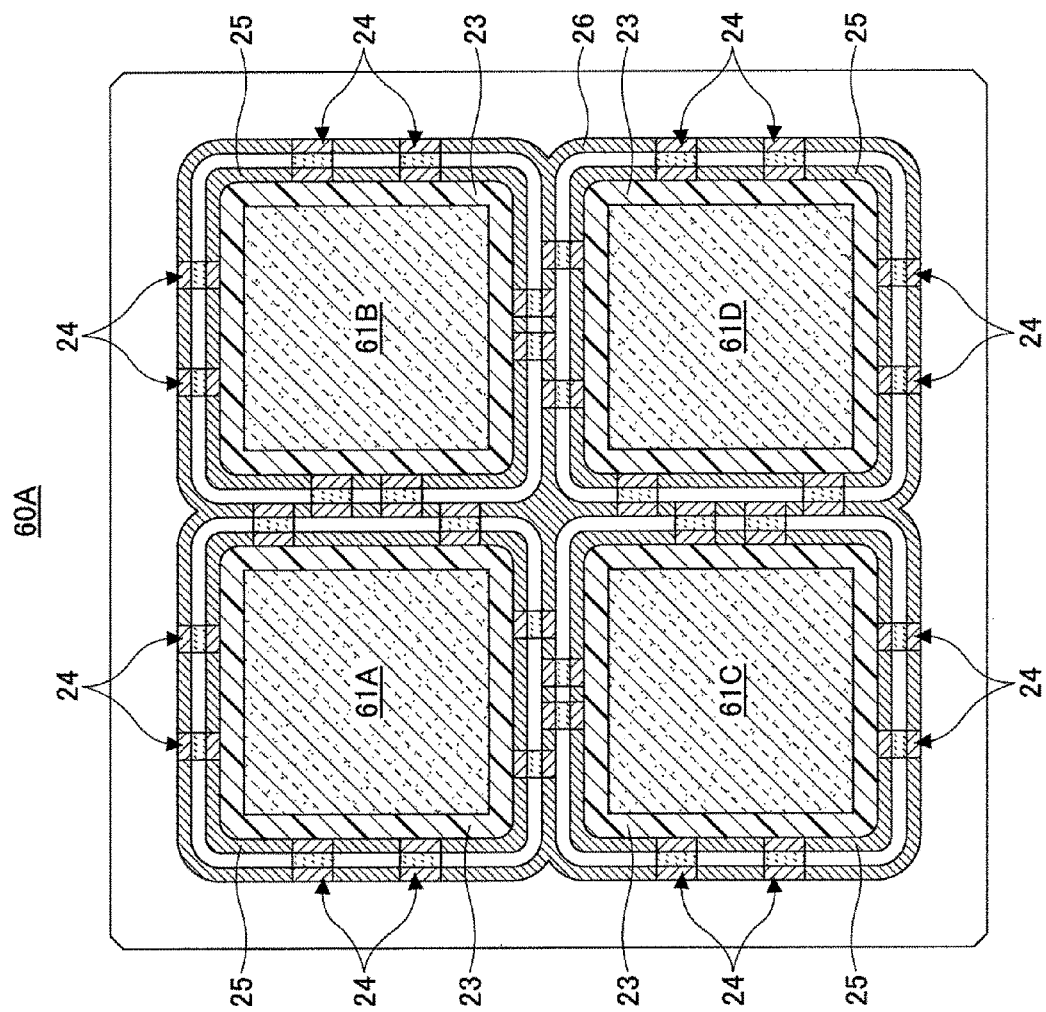
FIG. 30 is a plan view of a modified example of a semiconductor device of Third Embodiment.

FIG. 30 is a plan view of a semiconductor device 60A having a multi chip structure as a modified example of the semiconductor device 60 illustrated in FIG. 28.

Referring to FIG. 30 of the modified example of Third Embodiment, an outer conductive pattern 26 is used in common with semiconductor device elements 61A, 61B, 61C and 61D arranging up, down, right and left. With this structure, an occupying area of the semiconductor device elements 61A to 61D on a wiring board 21 can be reduced.

Fourth Embodiment

The structures of the semiconductor devices of first to Third Embodiments are applicable to a case where plural different power supply voltages are used.

Figure 31:
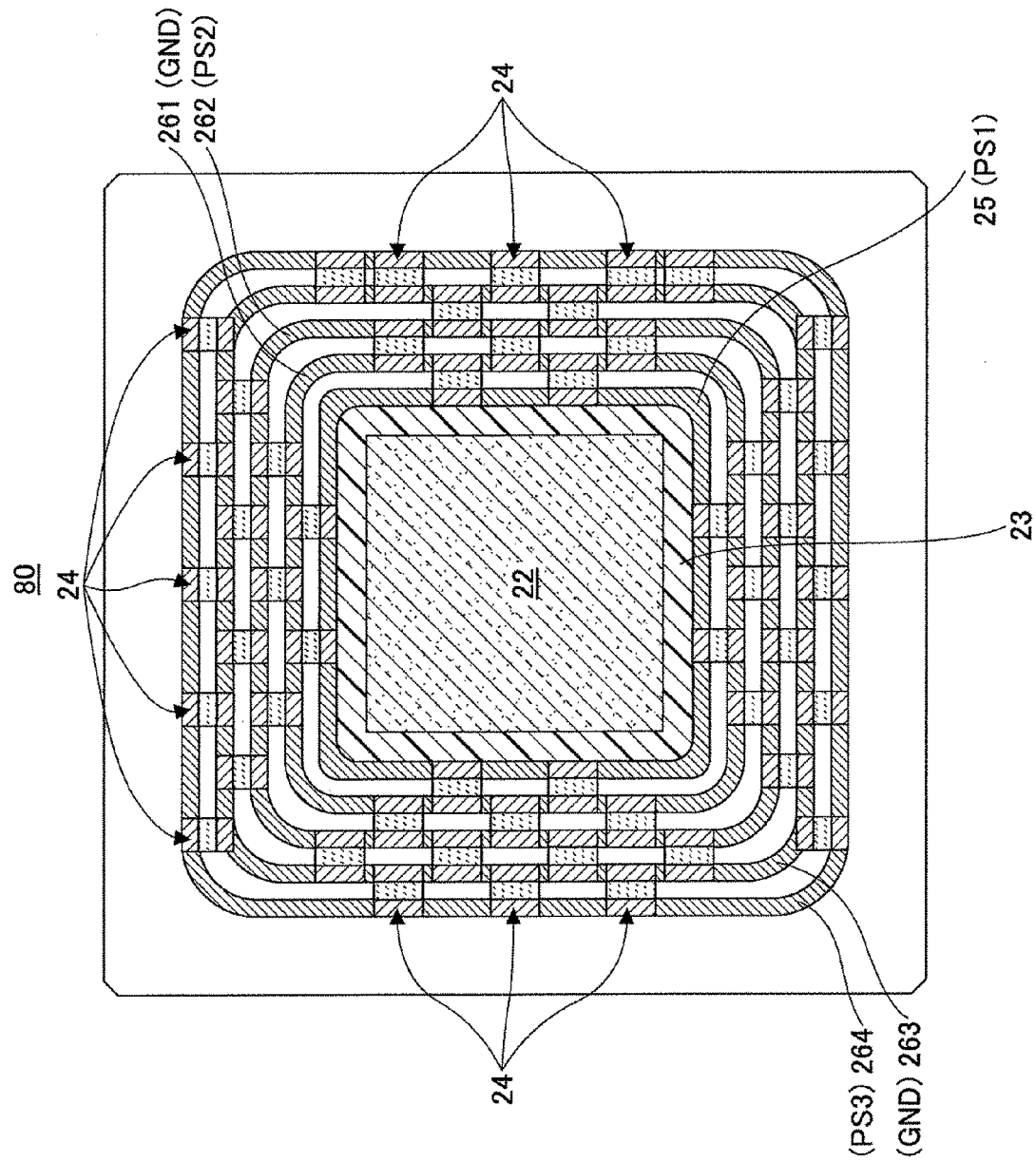
FIG. 31 is a plan view of a semiconductor device of Fourth Embodiment.

A semiconductor device 80 according to Fourth Embodiment is illustrated in FIG. 31.

The same reference symbols are used for portions corresponding to the portions described above and description of these portions is omitted.

Referring to FIG. 31, a conductive pattern 261 is formed on a wiring board 21 instead of the conductive pattern 26 of first to Third Embodiments so as to surround a conductive pattern 25. Further, another conductive pattern 262 is formed outside the conductive pattern 261 so as to surround the conductive pattern 261. Further, another conductive pattern 263 is formed outside the conductive pattern 262 so as to surround the conductive pattern 262. Further, another conductive pattern 264 is formed outside the conductive pattern 263 so as to surround the conductive pattern 263.

As described, the conductive patterns 261 to 264 are concentrically formed while surrounding the conductive pattern 25.

With Fourth Embodiment, when a power supply voltage 1 (power source 1, hereinafter referred to as PS1) is supplied to the conductive pattern 25, a ground potential (GND) is supplied to the conductive pattern 261, a power supply voltage (power source 2, hereinafter referred to as PS2) is supplied to the conductive pattern 262, a ground potential (ground, hereinafter referred to as GND) is supplied to the conductive pattern 263, and the third power supply voltage (power source 3, hereinafter referred to as PS3) is supplied to the conductive pattern 264.

The power supply voltage 1, the power supply voltage 2, the power supply voltage 3, and the ground potential are applied to the conductive patterns 25, 261, 262, 263, and 264 using a wiring pattern 21V in the wiring board 21 illustrated in FIG. 4A and FIG. 4B.

When the ground potential is applied to the conductive pattern 25, the power supply voltage (PS1) may be applied to the conductive pattern 261, the ground potential (GND) may be applied to the conductive pattern 262, the power supply voltage 2 (PS2) may be applied to the conductive pattern 263, and the ground potential (GND) may be applied to the conductive pattern 264.

In this case, two types of the power source voltages are applied.

With Fourth Embodiment, passive elements such as chip-type capacitative elements 24 are provided by bridging between the conductive pattern 25 and the conductive pattern 261, between the conductive pattern 261 and the conductive pattern 262, between the conductive pattern 262 and the conductive pattern 263, and between the conductive pattern 263 and the conductive pattern 264.

Fifth Embodiment

Figure 32:
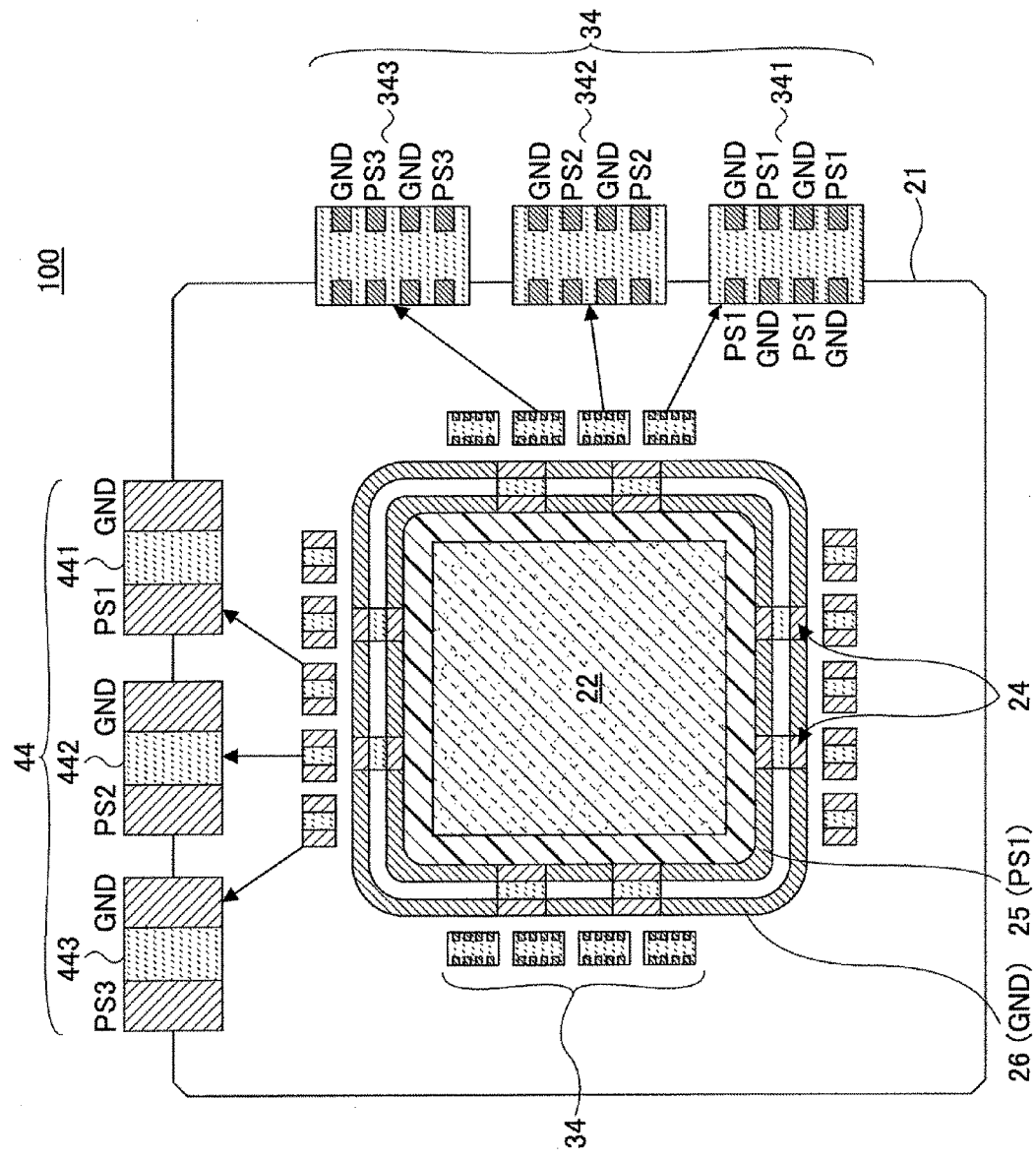
FIG. 32 is a plan view of a semiconductor device of Fifth Embodiment.

A semiconductor device 100 of Fifth Embodiment using plural power supply voltages is illustrated in FIG. 32.

The semiconductor device 100 is configured like the semiconductor device 20 of First Embodiment and further includes plural ceramic capacitors having multi terminal structures as illustrated in FIG. 14B, which are arranged in symmetric positions right and left of the semiconductor element 22 outside the conductive pattern.

With Fifth Embodiment, one of the power supply voltage 1 (PS1) and the ground potential (GND) is applied to the conductive pattern 25 in a manner similar to that of the semiconductor device 20, and the other one of the power supply voltage 1 (PS1) and the ground potential (GND) is applied to the conductive pattern 26. The ceramic capacitors 34 illustrated in FIG. 32 may be a capacitor 341 with the power supply voltage 1 (PS1) and the ground potential (GND) applied via terminals 34a and 34b respectively, a capacitor 342 with the power supply voltage 2 (PS2) and the ground potential (GND) applied via terminals 34a and 34b, respectively, and a capacitor 343 with the power supply voltage 3 (PS3) and the ground potential (GND) applied via terminals 34a and 34b, respectively. As described, the decoupling capacitors 34 are provided with the power supply voltage 1, the power supply voltage 2, and the power supply voltage 3 to stabilize the function of the semiconductor device 100 and the power supply voltage 1, the power supply voltage 2, and the power supply voltage 3.

Referring to the semiconductor device 100 of Fifth Embodiment, ceramic capacitors having a two terminal structure which are similar to the chip-type capacitative element 24 of First Embodiment are arranged in symmetric positions up and down the semiconductor element 22 outside the conductive patterns. The plural ceramic capacitors 44 illustrated in FIG. 32 may be a capacitor 441 with the power supply voltage 1 (PS1) and the ground potential (GND) applied, a capacitor 442 with the power supply voltage 2 (PS2) and the ground potential (GND) applied, and a capacitor 443 with the power supply voltage 3 (PS3) and the ground potential (GND) applied. The power supply voltage 1, the power supply voltage 2, and the power supply voltage 3 are further stabilized in the semiconductor device 100.

Sixth Embodiment

Figure 33A:
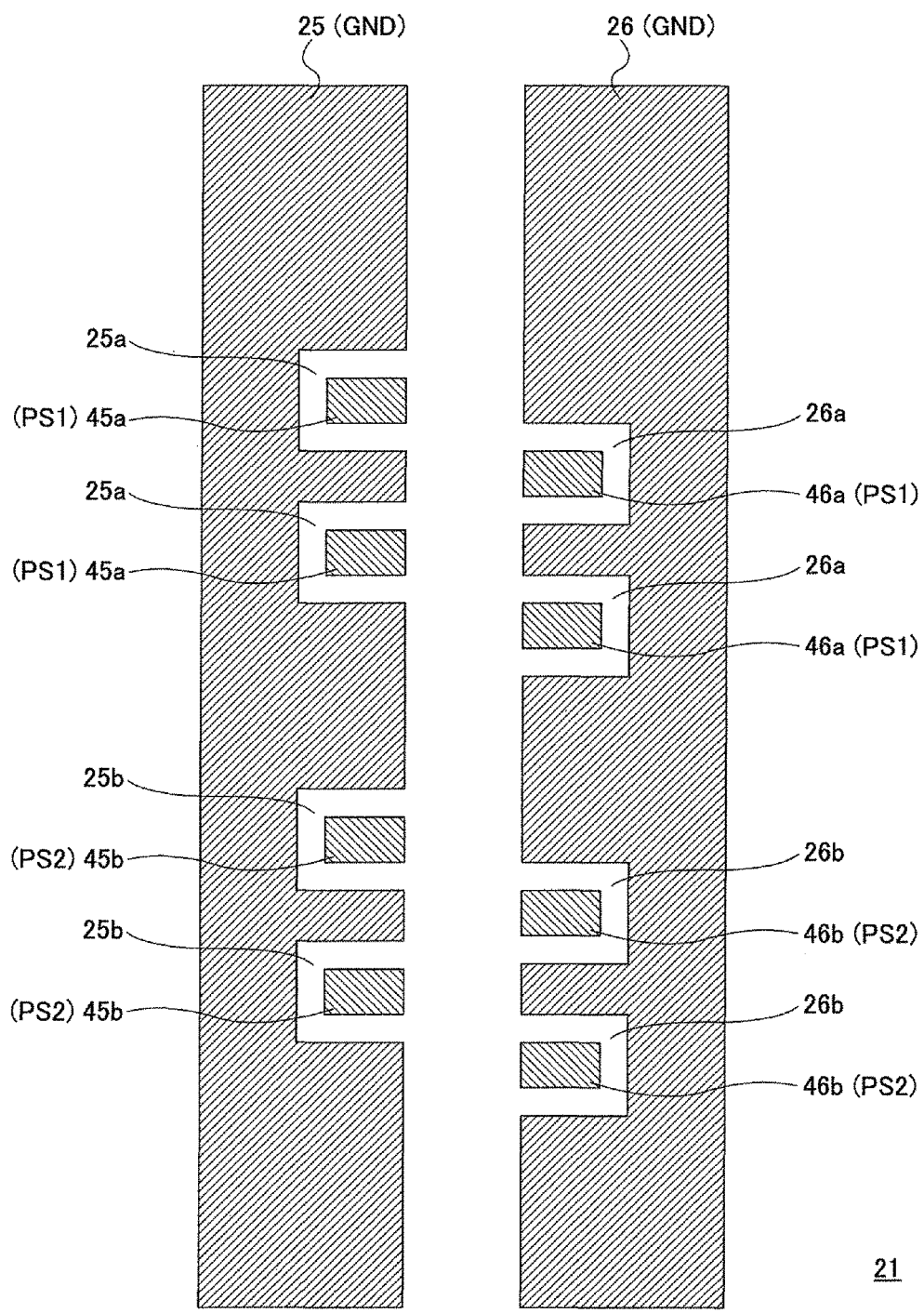
FIG. 33A is a first plan view of a semiconductor device of Sixth Embodiment.
Figure 33B:
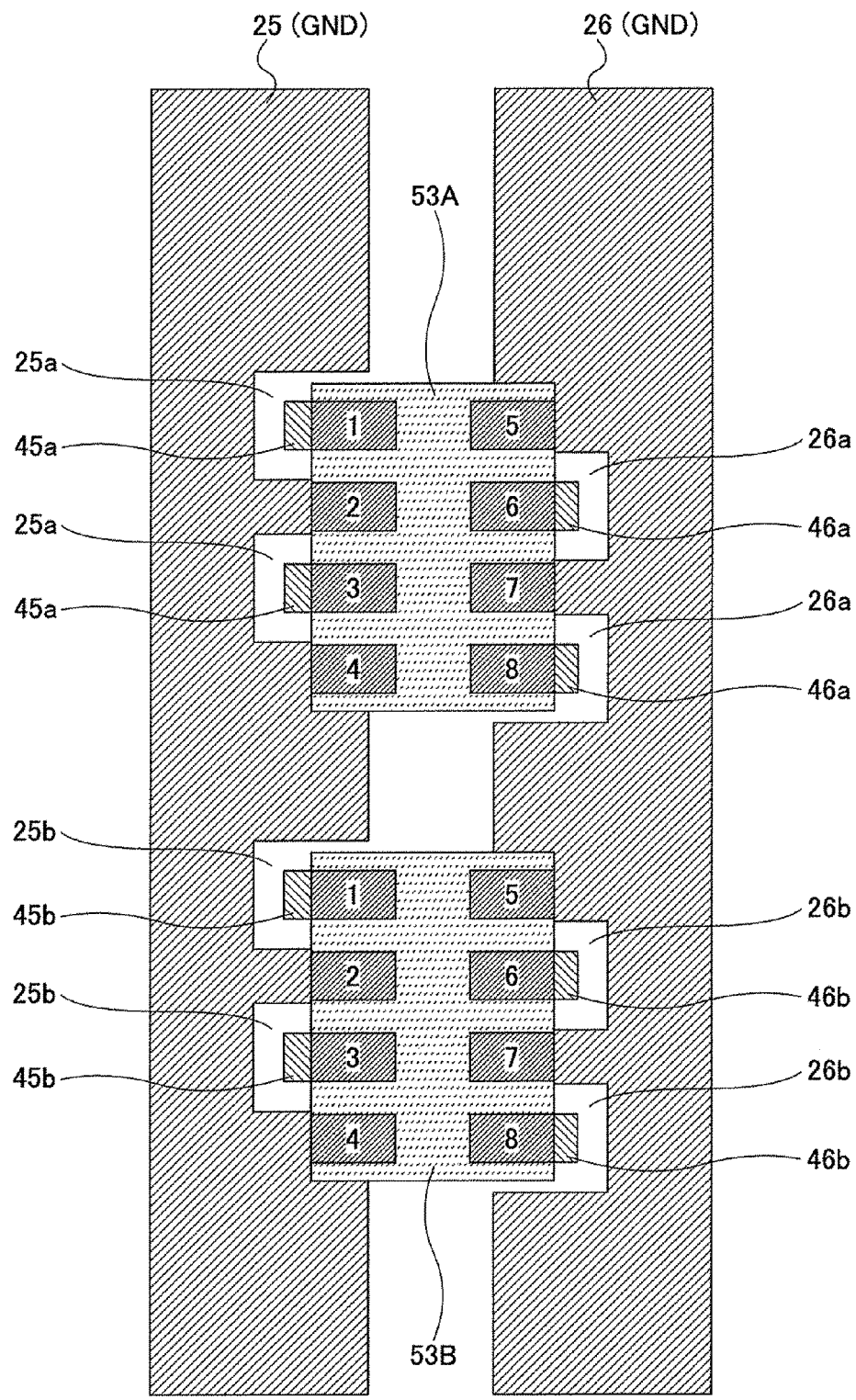
FIG. 33B is a second plan view of the semiconductor device of Sixth Embodiment.

A part of the semiconductor device 200 of Sixth Embodiment provided with the plural power supply voltages (the power supply voltage 1 and the power supply voltage 2) is illustrated in FIG. 33A and FIG. 33B.

Referring to FIG. 33A, the chip-type capacitative elements 53A and 53B are not yet mounted. Referring to FIG. 33B, the chip-type capacitative elements 53A and 53B are mounted. The same reference symbols are used for portions corresponding to the portions described above and description of these portions is omitted.

Referring to FIG. 33A, the conductive patterns 25 and 26 have the ground potential (GND). A cutout 25a is formed on the wiring board 21 to interpose an electrode pad 45a for applying the power supply voltage 1 (PS1) in the conductive pattern 25. A cutout 25b is formed on the wiring board 21 to interpose an electrode pad 45b for applying the power supply voltage 2 (PS2) in the conductive pattern 25. In a similar manner, a cutout 26a is formed on the wiring board 21 to interpose an electrode pad 46a for applying the power supply voltage 1 (PS1) in the conductive pattern 26. A cutout 26b is formed on the wiring board 21 to interpose an electrode pad 46b for applying the power supply voltage 2 (PS2) in the conductive pattern 26. Although not illustrated, the conductive pattern 25 functions as the dam for banking up the underfill resin 23 under the semiconductor element 22.

In Sixth Embodiment, the cutouts 25a in the conductive pattern 25 and the cutouts 26a in the conductive pattern 26 are alternately arranged in the longitudinal directions of the conductive patterns 25 and 26. In association with this structure, the electrode pads 45a and the electrode pads 46a are alternately arranged in the longitudinal directions of the conductive patterns 25 and 26. In a similar manner, the cutouts 25b in the conductive pattern 25 and the cutouts 26b in the conductive pattern 26 are alternately arranged in the longitudinal directions of the conductive patterns 25 and 26. In association with this structure, the electrode pads 45b and the electrode pads 46b are alternately arranged in the longitudinal directions of the conductive patterns 25 and 26.

Referring to FIG. 33B, the ceramic capacitors having the multi terminals 1 to 8 are mounted as the chip-type capacitative elements 53A and 53B on the wiring board 21. More specifically, the terminals 1 and 3 of the chip-type capacitative element 53A are connected to the electrode pads 45a, the terminals 6 and 8 of the chip-type capacitative element 53A are connected to the electrode pads 46a, the terminals 2 and 4 of the chip-type capacitative element 53A are connected to the conductive pattern 25, and the terminals 5 and 7 of the chip-type capacitative element 53A are connected to the conductive pattern 26. Further, the terminals 1 and 3 of the chip-type capacitative element 53B are connected to the electrode pads 45b, the terminals 6 and 8 of the chip-type capacitative element 53A are connected to the electrode pads 46b, the terminals 2 and 4 of the chip-type capacitative element 53A are connected to the conductive pattern 25, and the terminals 5 and 7 of the chip-type capacitative element 53A are connected to the conductive pattern 26.

Said differently, referring to FIG. 33A and FIG. 33B, the electrode pads 45a and 46a are formed at positions corresponding to the terminals of the ceramic capacitor 53A having the multi terminals, and the electrode pads 45b and 46b are formed at positions corresponding to the terminals of the ceramic capacitor 53B having the multi terminals.

An example of the chip-type capacitative elements 53A and 53B having the multi chip structures is a LLA series manufactured by Murata Manufacturing Co., Ltd.

With this structure, the chip-type capacitative element 53A is connected to the power supply line for the power supply voltage 1 and the chip-type capacitative element 53B is connected to the power supply line for the power supply voltage 2 to thereby effectively and independently absorb voltage variations of the power supply voltages 1 and 2.

Referring to FIG. 33A and FIG. 33B, when the power supply voltage 1 and the power supply voltage 2 are equalized, the semiconductor device using a single power supply voltage is realized.

Figure 34A:
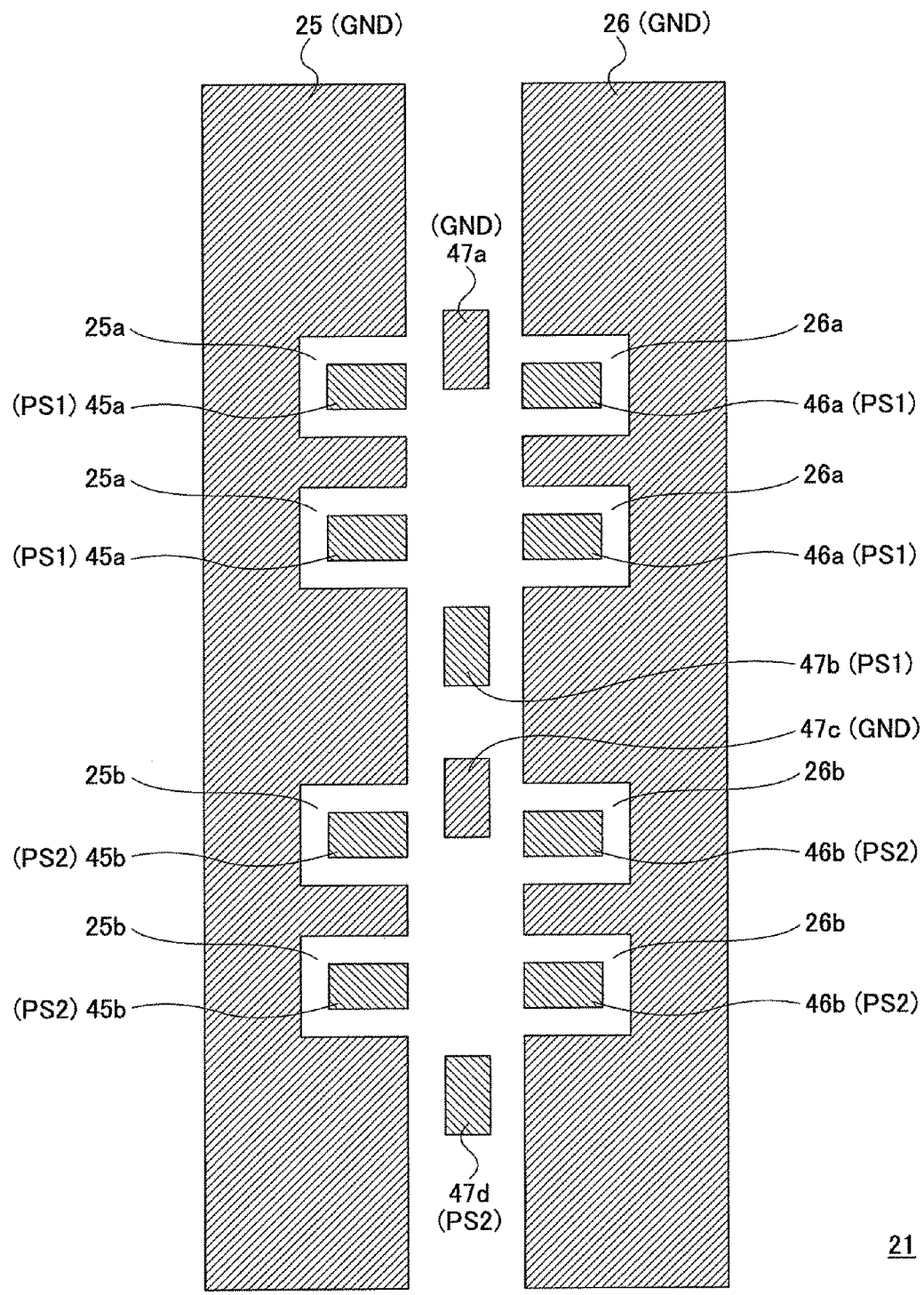
FIG. 34A is a first plan view of a semiconductor device of a first modified example of Sixth Embodiment.
Figure 34B:
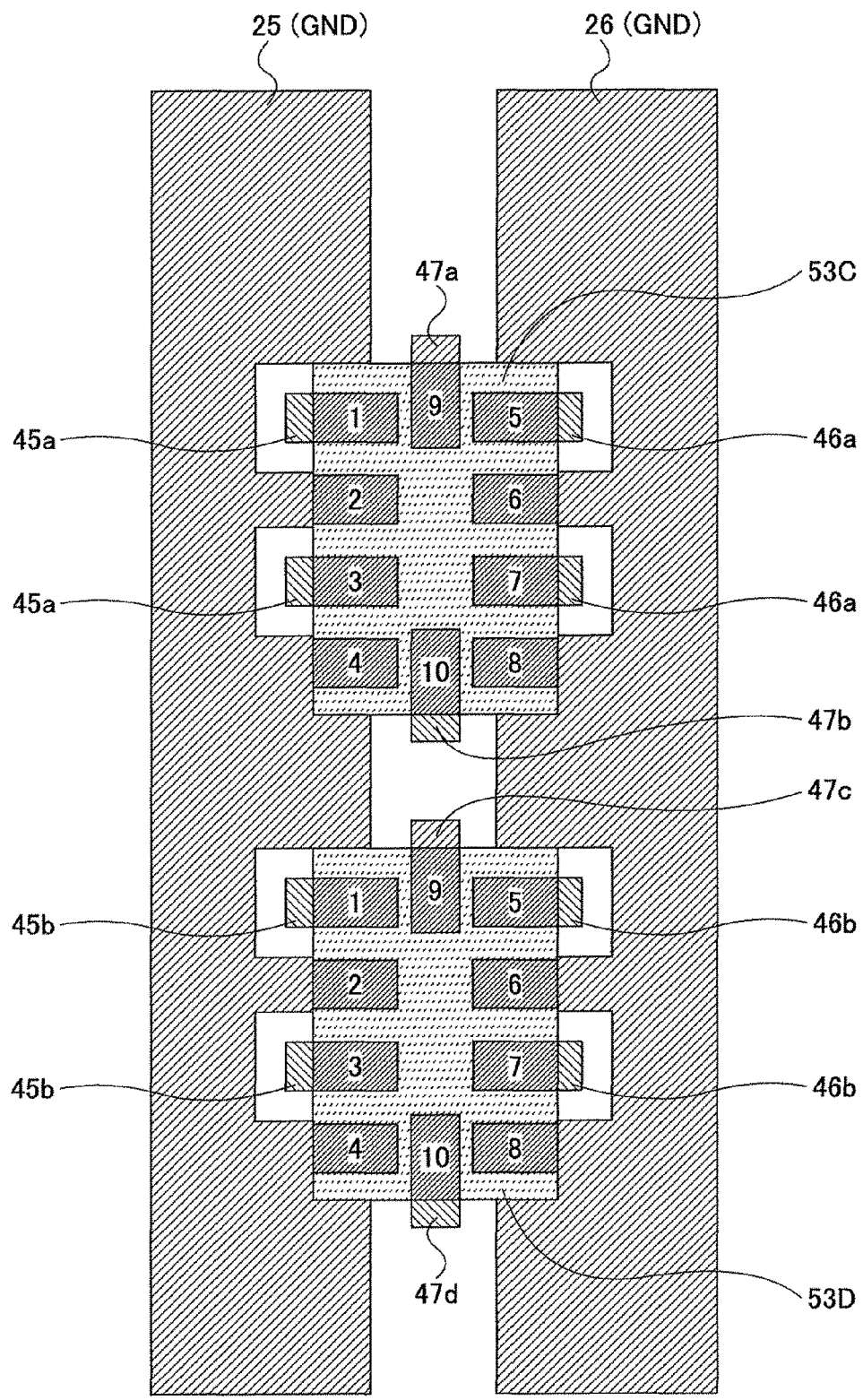
FIG. 34B is a second plan view of a semiconductor device of the first modified example of Sixth Embodiment.

FIG. 34A and FIG. 34B illustrate modified example 1 of Sixth Embodiment illustrated in FIG. 33A and FIG. 33B.

Referring to FIG. 34A, in addition to the electrode pads 45a, 45b, 46a and 46b, an electrode pad 47a for supplying a ground potential and an electrode pad 47b for supplying the power supply voltage 1 (PS1) are formed between the conductive patterns 25 and 26. Further, an electrode pad 47c for supplying a ground potential and an electrode pad 47d for supplying a power supply voltage 2 (PS2) are formed between the conductive patterns 25 and 26.

In Sixth Embodiment, the cutouts 25a in the conductive pattern 25 and the cutouts 26a in the conductive pattern 26 are symmetrically arranged in the longitudinal directions of the conductive patterns 25 and 26. In association with this structure, the electrode pads 45a and the electrode pads 46a are symmetrically arranged in the longitudinal directions of the conductive patterns 25 and 26. In a similar manner, the cutouts 25b in the conductive pattern 25 and the cutouts 26b in the conductive pattern 26 are symmetrically arranged in the longitudinal directions of the conductive patterns 25 and 26. In association with this structure, the electrode pads 45b and the electrode pads 46b are symmetrically arranged in the longitudinal directions of the conductive patterns 25 and 26.

FIG. 34B illustrates a state in which the ceramic capacitors 53C and 53D having multi terminals 1 to 10 are mounted on the electrode pads 45a, 46a, 45b, 46b, 47a and 47b illustrated in FIG. 34A.

Referring to FIG. 34B of modified example 1, the chip-type capacitative element 53C is mounted on the wiring board by connecting terminals 1 and 3 to the electrode pads 45a, terminals 5 and 7 to the electrode pads 46a, terminals 2 and 4 to the conductive pattern 25, terminals 6 and 8 to the conductive pattern 26, and a terminal 9 to the electrode pads 47a, and a terminal 10 to the electrode pad 47b. Further, in modified example 1, the chip-type capacitative element 53D is mounted on the wiring board by connecting terminals 1 and 3 to the electrode pads 45b, terminals 5 and 7 to the electrode pads 46b, terminals 2 and 4 to the conductive pattern 25, terminals 6 and 8 to the conductive pattern 26, and a terminal 9 to the electrode pad 47c, and a terminal 10 to the electrode pad 47d. Said differently, referring to FIG. 34A and FIG. 34B, the electrode pads 45a, 46a, 47a and 47b are formed at positions corresponding to the terminals of the ceramic capacitor 53C having the multi terminals, and the electrode pads 45b, 46b, 47c and 47d are formed at positions corresponding to the terminals of the ceramic capacitor 53D having the multi terminals.

With this structure, the chip-type capacitative element 53C is connected to the power supply line for the power supply voltage 1 and the chip-type capacitative element 53D is connected to the power supply line for the power supply voltage 2 to thereby effectively and independently absorb voltage variations of the power supply voltages 1 and 2.

These chip-type capacitative elements 55 and 56 may be ceramic capacitors commercially available as the LLM series manufactured by Murata Manufacturing Co., Ltd.

Figure 35A:
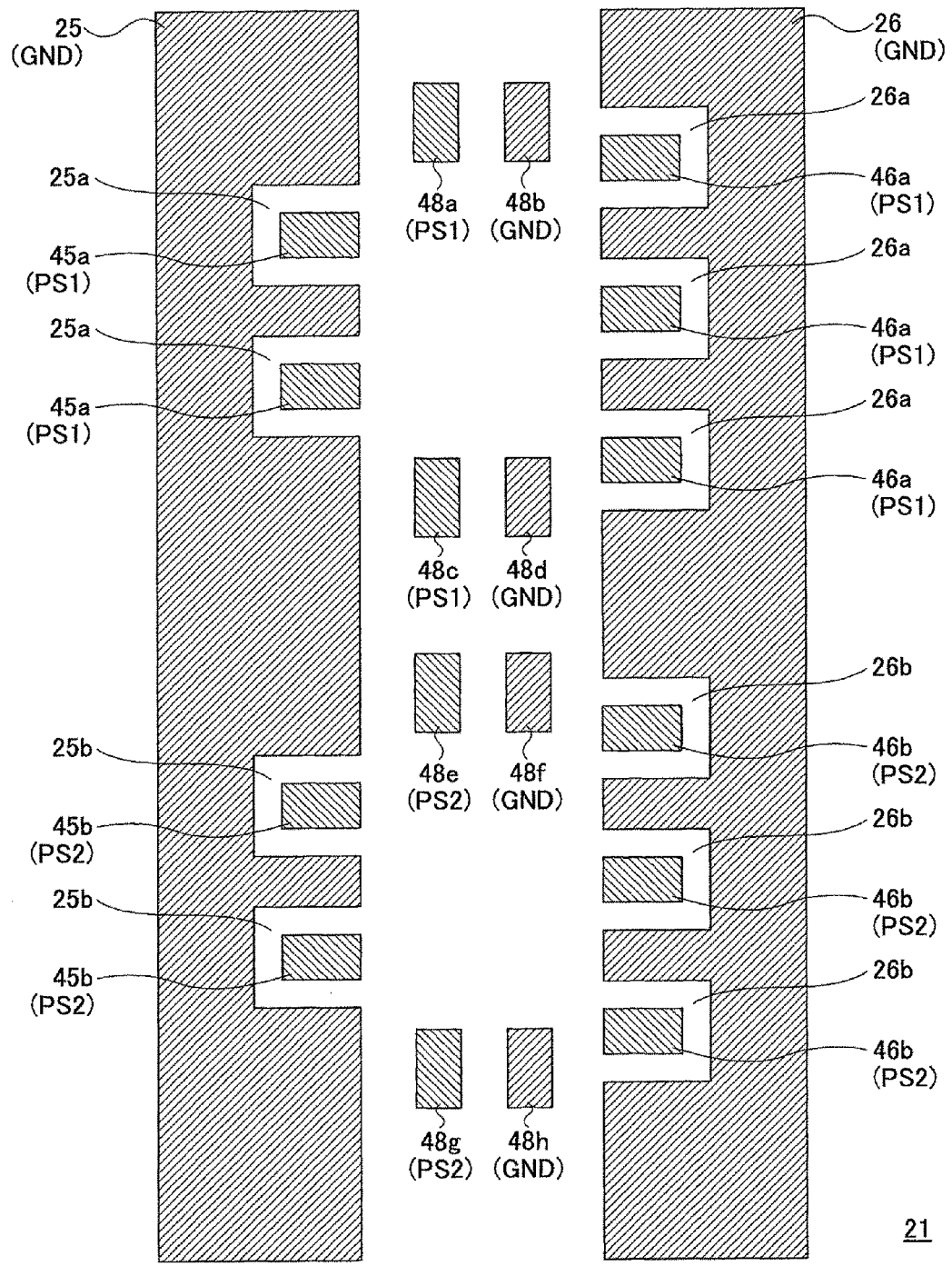
FIG. 35A is a first plan view of a semiconductor device of a second modified example of Sixth Embodiment.
Figure 35B:
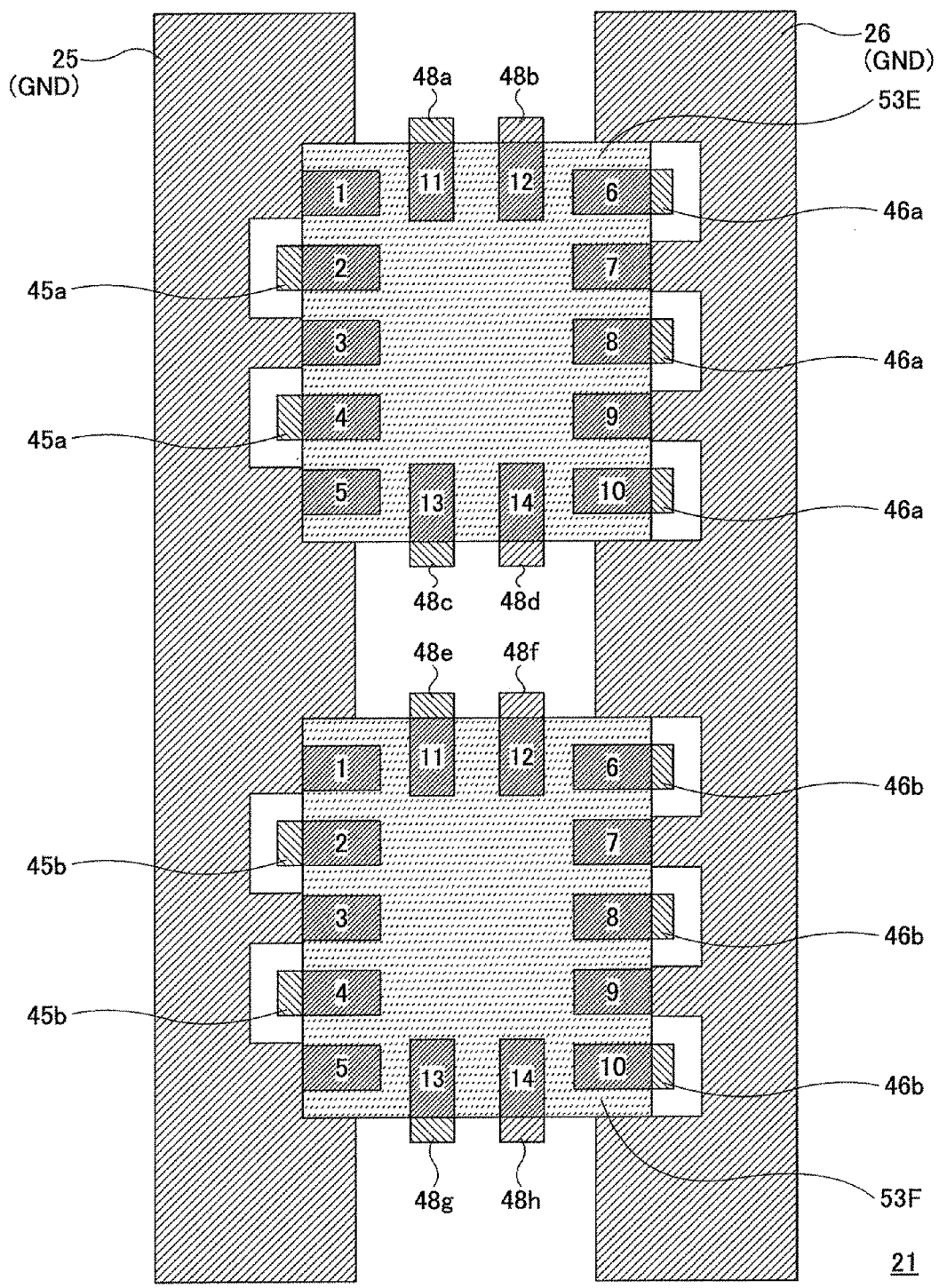
FIG. 35B is a second plan view of the semiconductor device of the second modified example of Sixth Embodiment.

FIG. 35A and FIG. 35B illustrate modified example 2 of Sixth Embodiment illustrated in FIG. 33A and FIG. 33B.

Referring to FIG. 35A of modified example 2, the number of electrode pads 46a and 46b are respectively increased from two to three. Further, an electrode pad 48b for applying a ground potential (GND) and an electrode pad 48a for applying a power supply voltage 1 (PS1) are arranged side by side between conductive patterns 25 and 26 corresponding to a chip-type capacitative element 53E. In a similar manner, an electrode pad 48c for applying the power supply voltage 1 (PS1) and an electrode pad 48d for applying the ground potential (GND) are arranged side by side between the conductive patterns 25 and 26 corresponding to the chip-type capacitative element 53E.

Further, an electrode pad 48e for applying a power supply voltage 2 (PS2) and an electrode pad 48f for applying the ground potential (GND) are arranged side by side between the conductive patterns 25 and 26 corresponding to a chip-type capacitative element 53F. Furthermore, an electrode pad 48g for applying the power supply voltage 2 (PS2) and an electrode pad 48h for applying the ground potential (GND) are arranged side by side between the conductive patterns 25 and 26 corresponding to the chip-type capacitative element 53F.

In a similar manner to FIG. 33A and FIG. 33B of Sixth Embodiment, cutouts 25a formed in the conductive pattern 25 and cutouts 26a formed in the conductive pattern 26 are alternately arranged in the directions of the longitudinal conductive patterns 25 and 26. In association with this structure, the electrode patterns 45a and 46a are alternately arranged in the directions of the longitudinal conductive patterns 25 and 26. In a similar manner, cutouts 25b in the conductive pattern 25 and cutouts 26b in the conductive pattern 26 are alternately arranged in the longitudinal directions of the conductive patterns 25 and 26. In association with this structure, the electrode pads 45b and the electrode pads 46b are alternately arranged in the longitudinal directions of the conductive patterns 25 and 26.

Referring to FIG. 35B, the chip-type capacitative element 53E is mounted on the wiring board by connecting terminals 1, 3 and 5 to the conductive pattern 25, terminals 2 and 4 to the electrode pads 45a, terminals 6, 8 and 10 to the electrode pads 46a, terminals 7 and 9 to the conductive pattern 26, a terminal 11 to the terminal 48a, a terminal 12 to the terminal 48b, a terminal 13 to the terminal 48c, and a terminal 14 to the terminal 48d. Further, the chip-type capacitative element 53F is mounted on the wiring board by connecting terminals 1, 3 and 5 to the conductive pattern 25, terminals 2 and 4 to the electrode pads 45b, terminals 6, 8 and 10 to the electrode pads 46b, terminals 7 and 9 to the conductive pattern 26, a terminal 11 to the terminal 48e, a terminal 12 to the terminal 48f, a terminal 13 to the terminal 48g, and a terminal 14 to the terminal 48h.

Said differently, referring to FIG. 35A and FIG. 35B, the electrode pads 45a, 46a, and 48a to 48d are formed at positions corresponding to the terminals of the ceramic capacitor 53E having the multi terminals, and the electrode pads 45b, 46b, and 48e to 48h are formed at positions corresponding to the terminals of the ceramic capacitor 53F having the multi terminals.

With this structure, the chip-type capacitative element 53E is connected to the power supply line for the power supply voltage 1 and the chip-type capacitative element 53F is connected to the power supply line for the power supply voltage 2 to thereby effectively and independently absorb voltage variations of the power supply voltages 1 and 2.

These chip-type capacitative elements 53E and 53F may be ceramic capacitors commercially available as manufactured by Murata Manufacturing Co., Ltd.

Figure 36A:
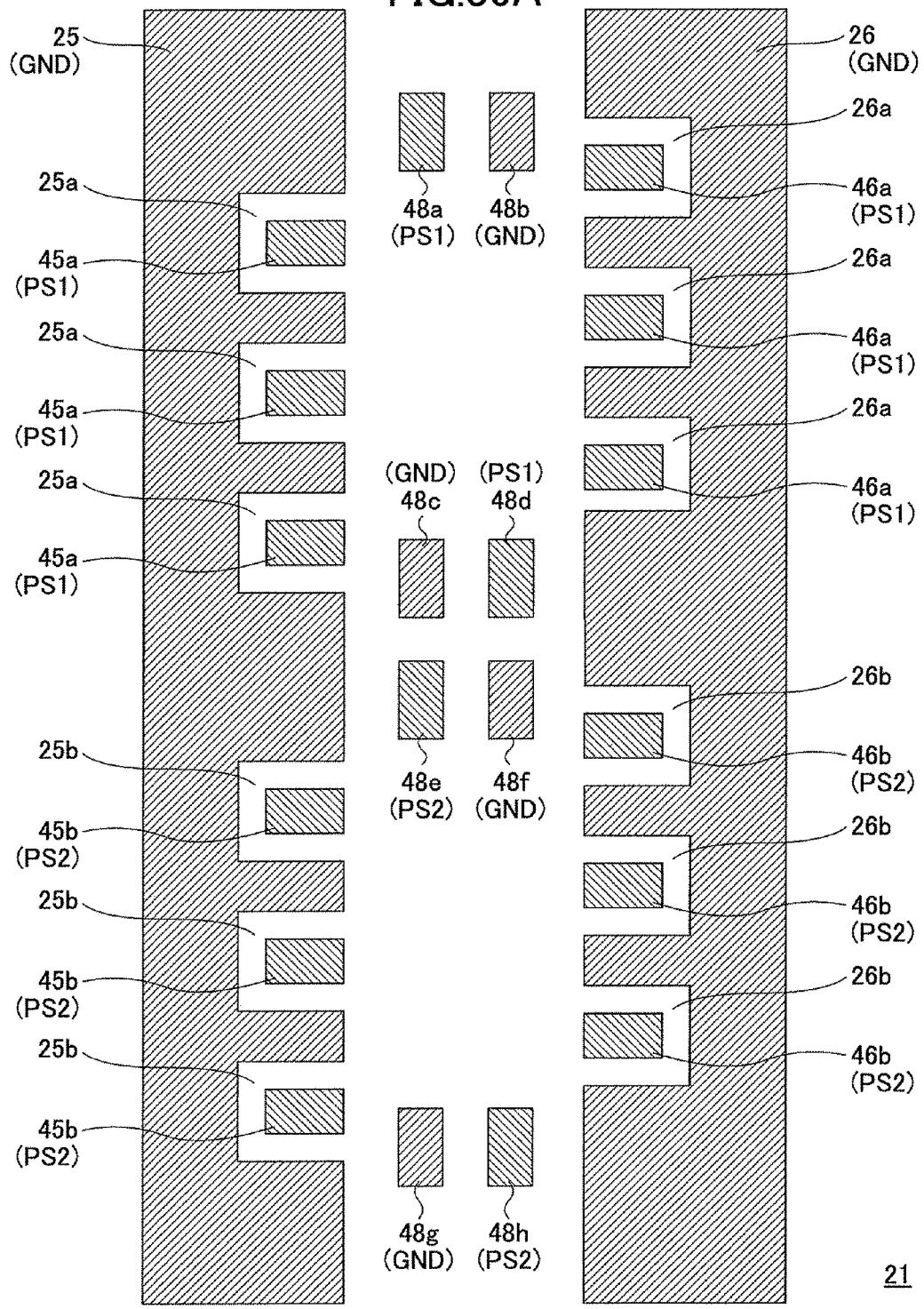
FIG. 36A is a first plan view of a semiconductor device of a third modified example of Sixth Embodiment.
Figure 36B:
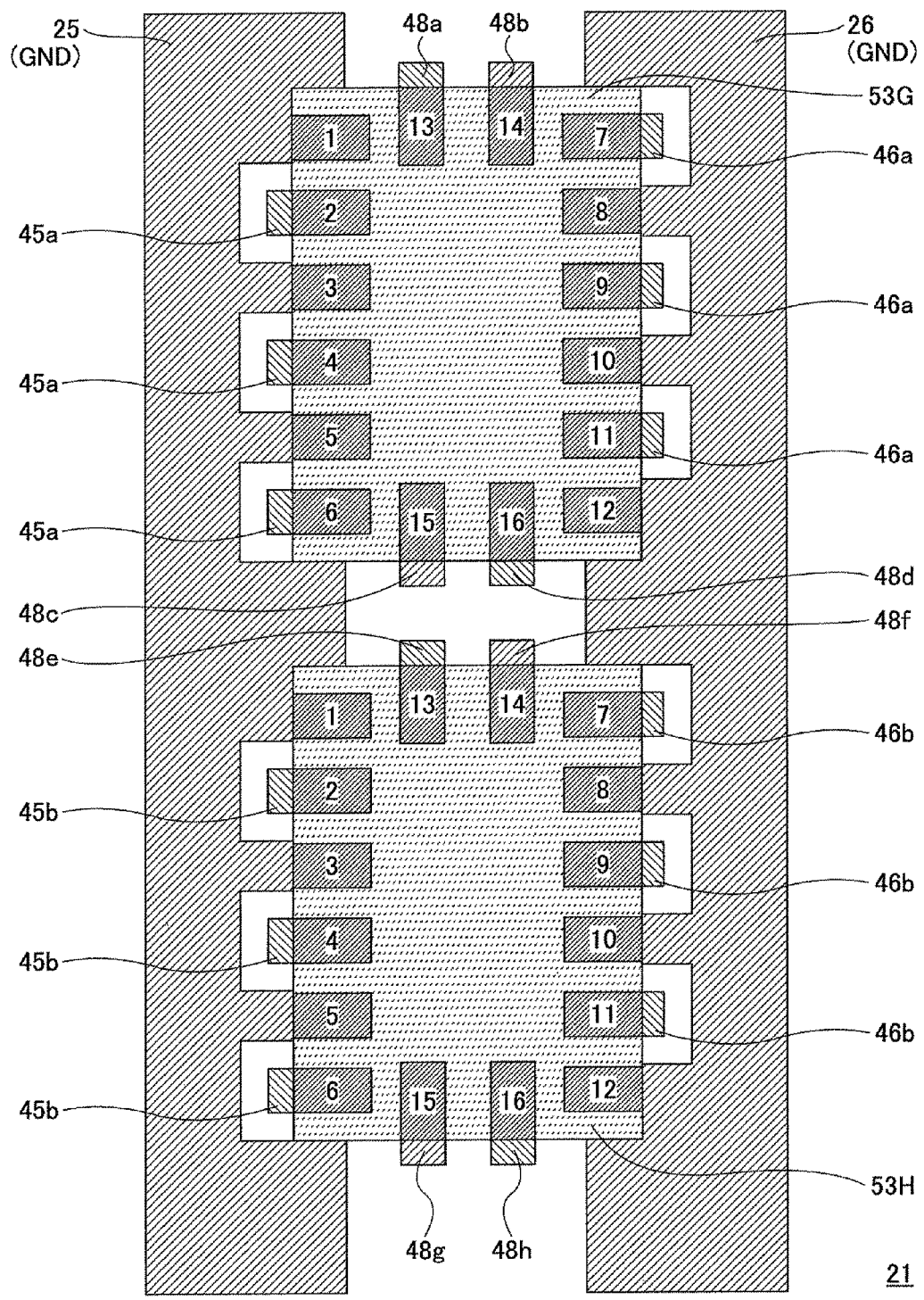
FIG. 36B is a second plan view of the semiconductor device of the third modified example of Sixth Embodiment.

FIG. 36A and FIG. 36B illustrate modified example 3 of Sixth Embodiment illustrated in FIG. 33A and FIG. 33B.

Referring to FIG. 36A of modified example 3, the number of electrode pads 45a, 45b, 46a and 46b are respectively increased from two to three.

Further, an electrode pad 48a for applying a ground potential and an electrode pad 48b for applying a power supply voltage 1 (PS1) are arranged side by side between conductive patterns 25 and 26 corresponding to a chip-type capacitative element 53G. In a similar manner, an electrode pad 48c for applying the power supply voltage 1 (PS1) and an electrode pad 48d for applying the ground potential (GND) are arranged side by side between the conductive patterns 25 and 26 corresponding to the chip-type capacitative element 53G.

Further, an electrode pad 48e for applying a power supply voltage 2 (PS2) and an electrode pad 48f for applying the ground potential (GND) are arranged side by side between the conductive patterns 25 and 26 corresponding to a chip-type capacitative element 53H. Furthermore, an electrode pad 48g for applying the power supply voltage 2 (PS2) and an electrode pad 48h for applying the ground potential (GND) are arranged side by side between the conductive patterns 25 and 26 corresponding to the chip-type capacitative element 53H.

In a similar manner to FIG. 33A and FIG. 33B of Sixth Embodiment, cutouts 25a formed in the conductive pattern 25 and cutouts 26a formed in the conductive pattern 26 are alternately arranged in the directions of the longitudinal conductive patterns 25 and 26. In association with this structure, the electrode patterns 45a and 46a are alternately arranged in the directions of the longitudinal conductive patterns 25 and 26. In a similar manner, cutouts 25b in the conductive pattern 25 and cutouts 26b in the conductive pattern 26 are alternately arranged in the longitudinal directions of the conductive patterns 25 and 26. In association with this structure, the electrode pads 45b and the electrode pads 46b are alternately arranged in the longitudinal directions of the conductive patterns 25 and 26.

Referring to FIG. 36B, the chip-type capacitative element 53G is mounted on the wiring board by connecting terminals 1, 3 and 5 to the conductive pattern 25, terminals 2, 4 and 6 to the electrode pads 45a, terminals 7, 9 and 11 to the electrode pads 46a, terminals 8, 10 and 12 to the conductive pattern 26, a terminal 13 to the terminal 48a, a terminal 14 to the terminal 48b, a terminal 15 to the terminal 48c, and a terminal 16 to the terminal 48d. Further, the chip-type capacitative element 53H is mounted on the wiring board by connecting terminals 1, 3 and 5 to the conductive pattern 25, terminals 2, 4 and 6 to the electrode pads 45b, terminals 7, 9 and 11 to the electrode pads 46b, terminals 8, 10 and 12 to the conductive pattern 26, a terminal 13 to the terminal 48e, a terminal 14 to the terminal 48f, a terminal 15 to the terminal 48g, and a terminal 16 to the terminal 48h. Said differently, referring to FIG. 36A and FIG. 36B, the electrode pads 45a, 46a, and 48a to 48d are formed at positions corresponding to the terminals of the ceramic capacitor 53G having the multi terminals, and the electrode pads 45b, 46b, and 48e to 48h are formed at positions corresponding to the terminals of the ceramic capacitor 53H having the multi terminals.

With this structure, the chip-type capacitative element 53G is connected to the power supply line for the power supply voltage 1 and the chip-type capacitative element 53H is connected to the power supply line for the power supply voltage 2 to thereby effectively and independently absorb voltage variations of the power supply voltages 1 and 2. The chip-type capacitative elements 53G and 53H having the multi chip structures may be LLK series manufactured by Murata Manufacturing Co., Ltd.

Figure 37A:
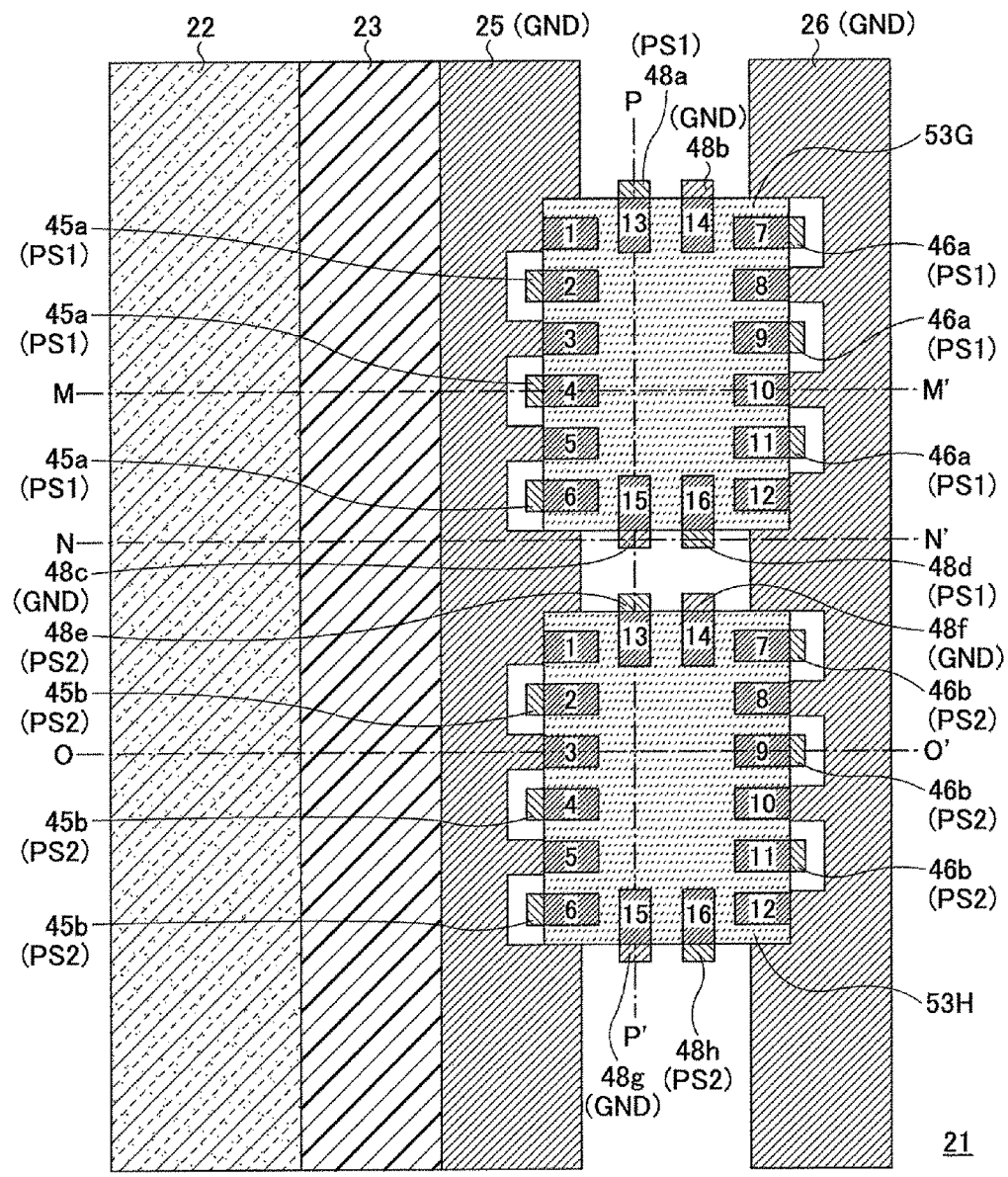
FIG. 37A is a plan view of the semiconductor device illustrated in FIG. 36A and FIG. 36B and a part of the underfill resin.

FIG. 37A illustrates the semiconductor device of FIG. 36B and parts of the semiconductor element 22 and underfill resin 23. FIG. 37B to FIG. 37E are cross-sectional views of FIG. 37A taken along lines M-M', N-N', O-O', and P-P'.

The same reference symbols are used for portions corresponding to the portions described above and description of these portions is omitted.

Figure 37B:
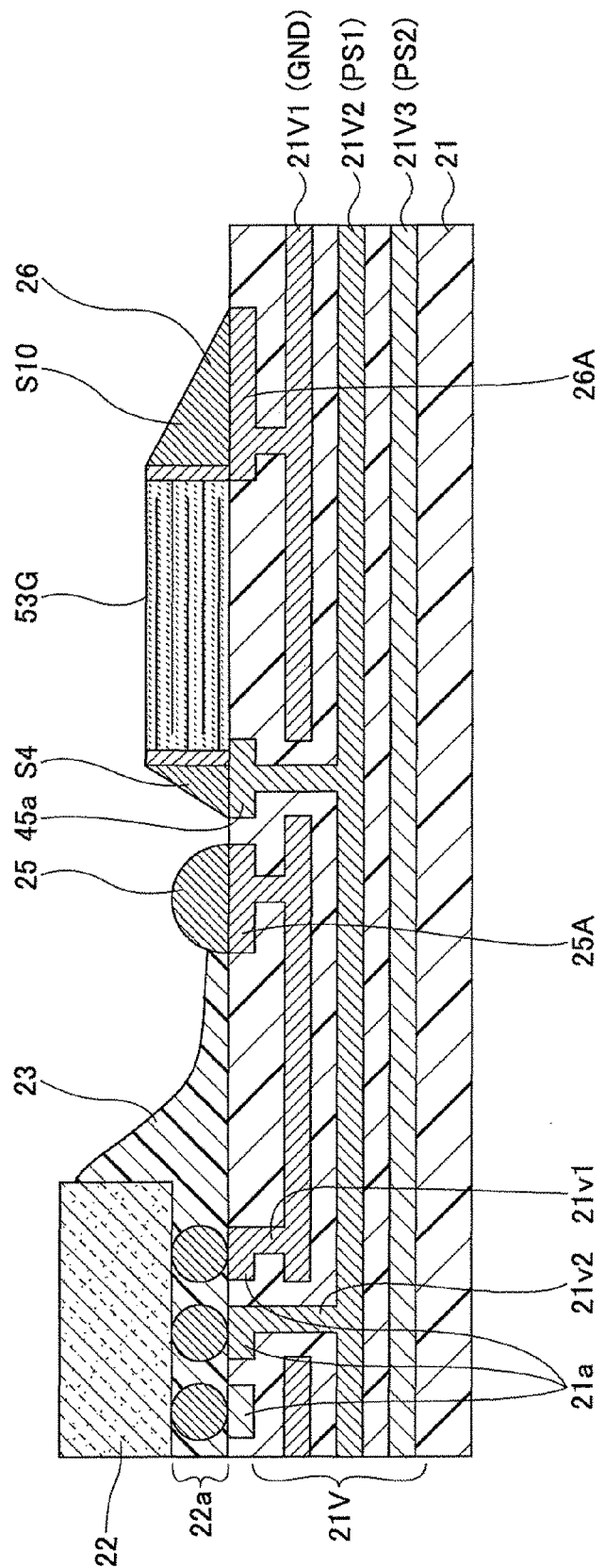
FIG. 37B is a cross-sectional view of the semiconductor device illustrated in FIG. 37A taken along a line M-M' of FIG. 37A.
Figure 37C:
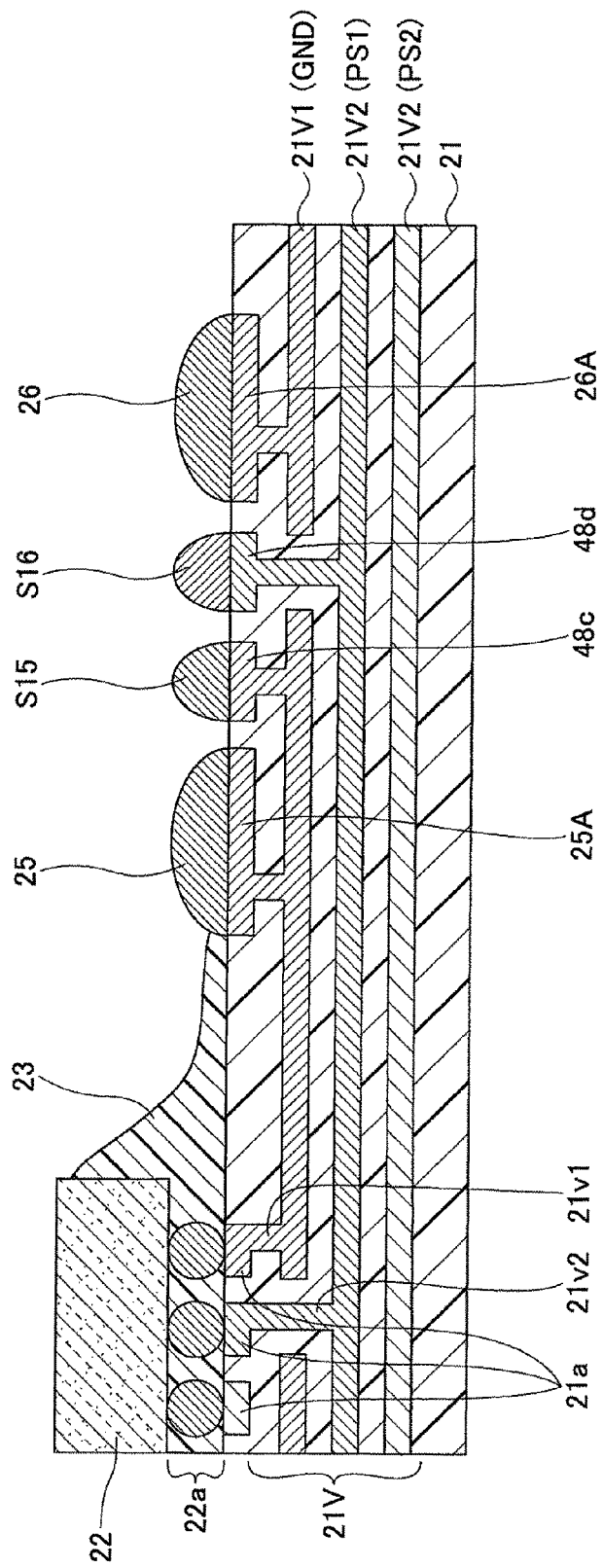
FIG. 37C is a cross-sectional view of the semiconductor device illustrated in FIG. 37A taken along a line N-N' of FIG. 37A.
Figure 37D:
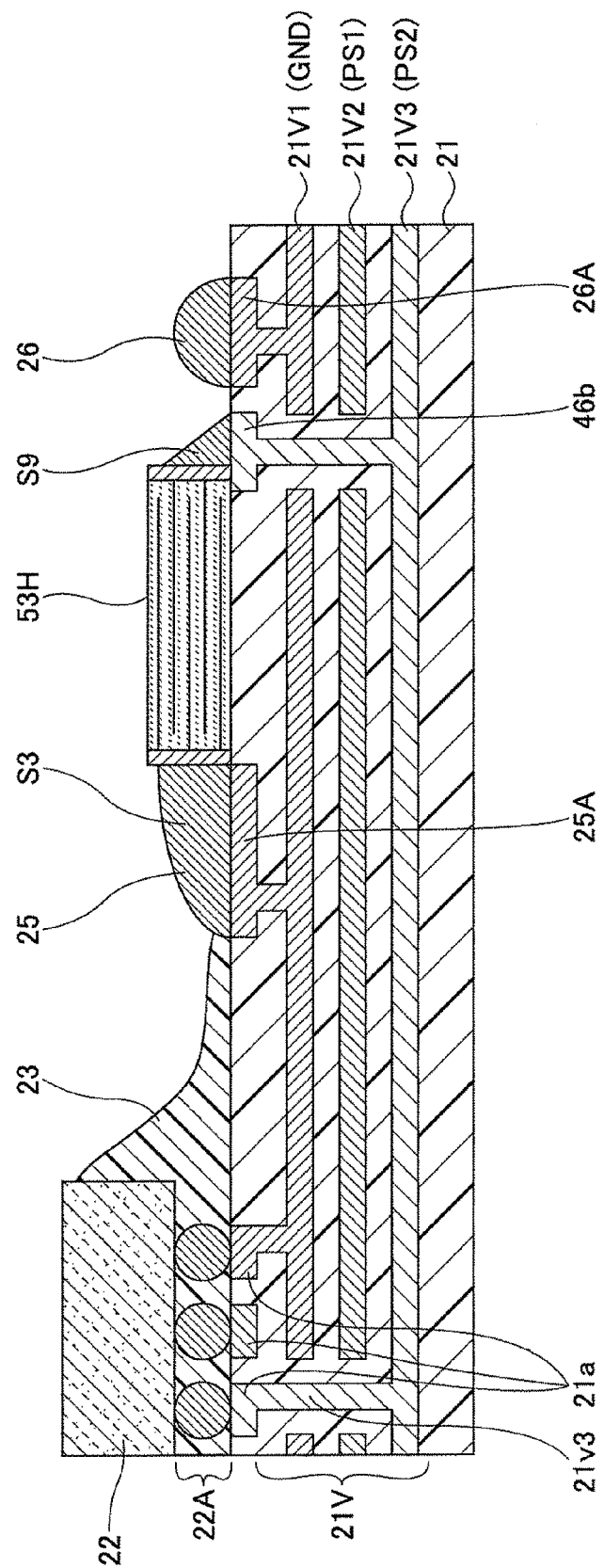
FIG. 37D is a cross-sectional view of the semiconductor device illustrated in FIG. 37A taken along a line O-O' of FIG. 37A.

Referring to FIG. 37B to FIG. 37D of modified example 3, an internal wiring 21V formed in the wiring board 21 includes a power source pattern for applying a ground potential (GND), a power source pattern 21V2 for applying a power supply voltage 1 (PS1), and a power source pattern 21V3 for applying a power supply voltage 2 (PS2). The power source pattern 21V3 is positioned below the power source pattern 21V2. The power source pattern 21V3 is connected to one of electrode pads 21a of the semiconductor element 22 via a via plug 21v3 illustrated in FIG. 37A.

Referring to FIG. 37B, a solder pattern S4 corresponding to a terminal 4 of the chip-type capacitative element 53G. The electrode pattern 45a is connected to the power source pattern 21V2. In a similar manner, the solder pattern forming the conductive pattern 25 is formed on an electrode pad 25A to function as a dam for banking up an underfill resin 23. A solder pattern S10 corresponding to the terminal 10 of the capacitor 53G is connected to a solder pattern forming the conductive pattern 26.

Referring to FIG. 37C, the conductive patterns 25 and 26 are formed in a manner similar to those of the previous embodiments. The conductive pattern 25 functions as the dam for banking up the underfill resin 23.

Referring to FIG. 37C, solder patterns S15 and S16 corresponding to terminals 15 and 16 of the chip-type capacitative element 53G are formed between the conductive patterns 25 and 26. The solder pattern S15 is connected to the power source pattern 21V1 via the electrode pattern 48c corresponding to the solder pattern S15. The solder pattern S16 is connected to the power source pattern 21V2 via the electrode pattern 48d corresponding to the solder pattern S16.

Referring to FIG. 37D, the conductive patterns 25 and 26 are formed in a manner similar to those of the previous embodiments. The conductive pattern 25 functions as the dam for banking up the underfill resin 23.

Referring to FIG. 37D, solder patterns S3 and S9 corresponding to terminals 3 and 9 of the chip-type capacitative element 53H are formed between the conductive patterns 25 and 26. The solder pattern S3 is connected to and fused with the solder pattern forming the conductive pattern 25. Meanwhile, the solder pattern S9 is connected to a power source pattern 21V3 via a corresponding electrode pattern 46b.

Figure 37E:
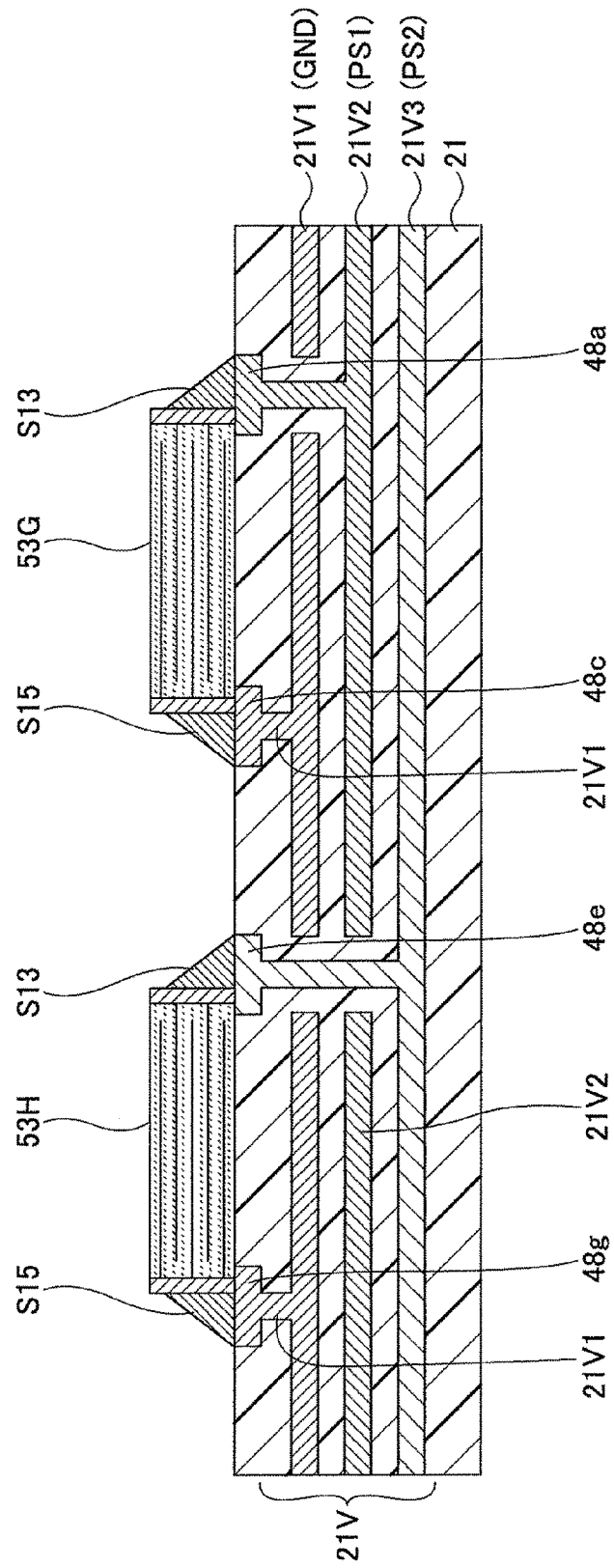
FIG. 37E is a cross-sectional view of the semiconductor device illustrated in FIG. 37A taken along a line P-P' of FIG. 37A

Referring to FIG. 37E, the conductive patterns 25 and 26 are not illustrated. A solder pattern S13 corresponding to a terminal 13 of the capacitor 53G is connected to the power source pattern 21V2 for applying the power supply voltage (PS1), a solder pattern S15 corresponding to a terminal 15 of the capacitor 53G is connected to the power source pattern 21V1 for applying the ground (GND), a solder pattern S13 corresponding to a terminal 13 of the capacitor 53H is connected to the power source pattern 21V3 for applying the power supply voltage 2 (PS2), and a solder pattern S15 corresponding to a terminal 15 of the capacitor 53H is connected to the power source pattern 21V1 for applying the ground (GND).

Seventh Embodiment

Figure 38:
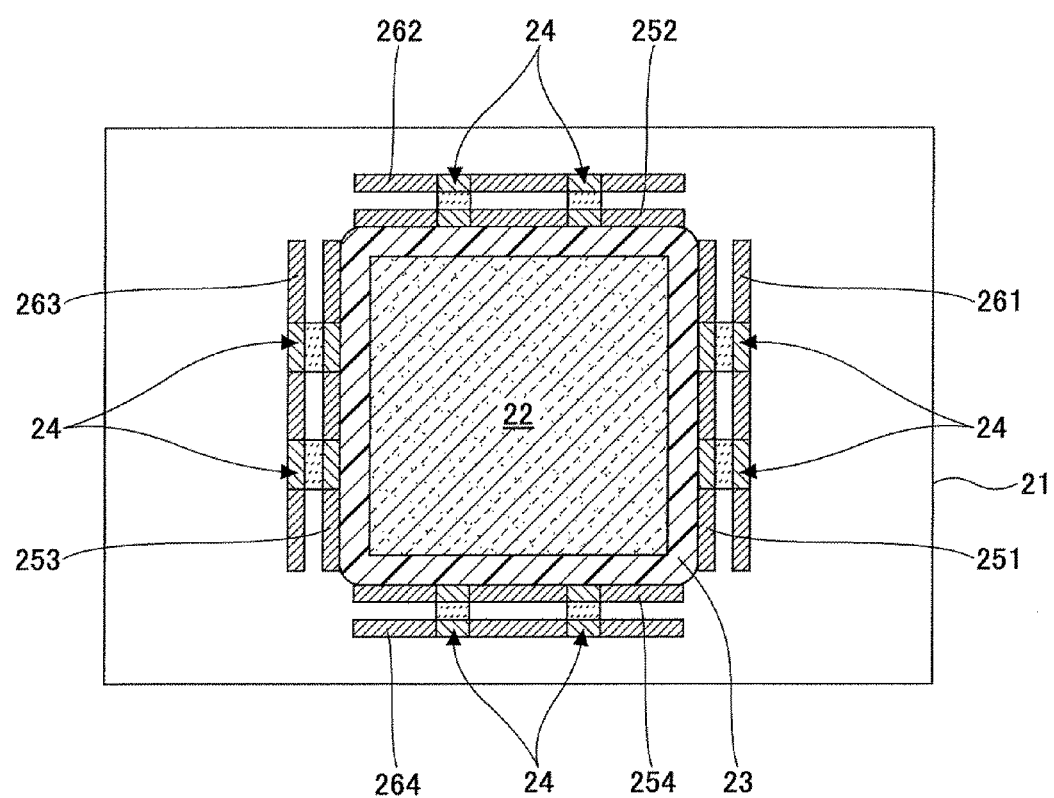
FIG. 38 is a plan view of a semiconductor device of Seventh Embodiment.

Depending on the type of the underfill resin 23, conductive patterns 25 and 26 may be modified to plural mutually separated members 251 to 254 and 261 to 264. When a resin having a low wet extension property is used as the underfill resin 23, or a resin having low wettability with the solder forming the conductive pattern 25 is used as the underfill resin 23, it is possible to contain wet extension of the underfill resin in the structure illustrated in FIG. 38.

Eighth Embodiment

Figure 39:
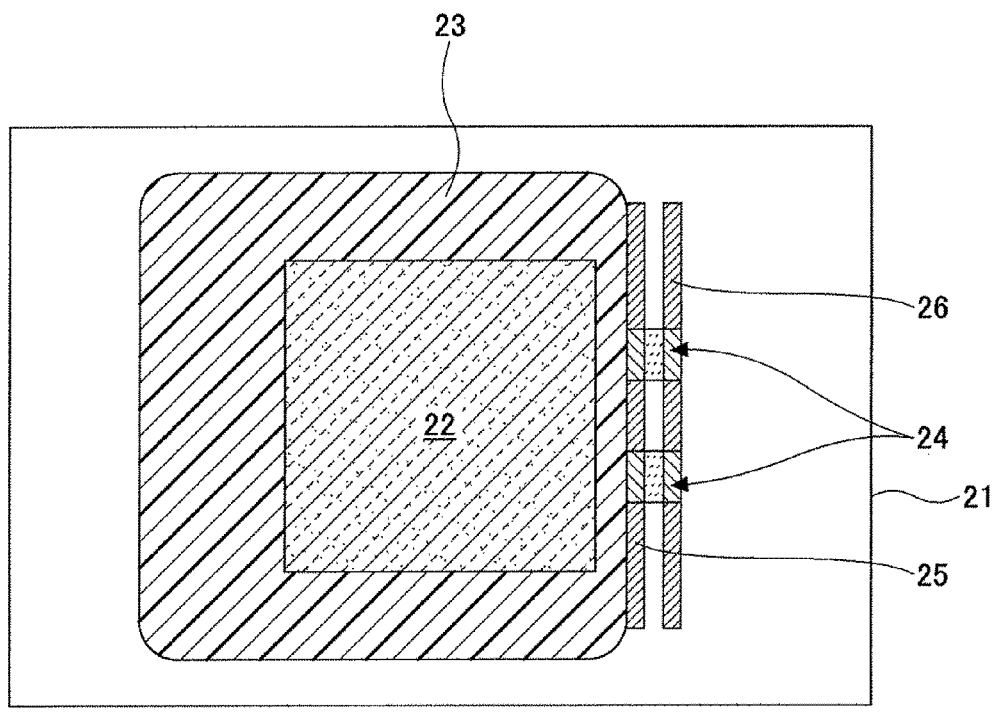
FIG. 39 is a plan view of a semiconductor device of Eighth Embodiment.

When a chip-type capacitative element 24 is formed only on one side or a predetermined side or sides of a semiconductor device, it is possible to form conductive patterns 25 and 26 only on the side on which the chip-type capacitative element 24 is formed as illustrated in FIG. 39.

Ninth Embodiment

Figure 40A:
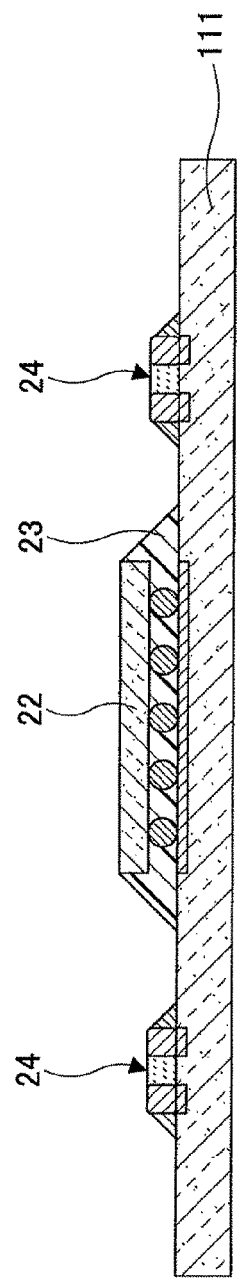
FIG. 40A is a cross-sectional view of a semiconductor device of Ninth Embodiment.
Figure 40B:
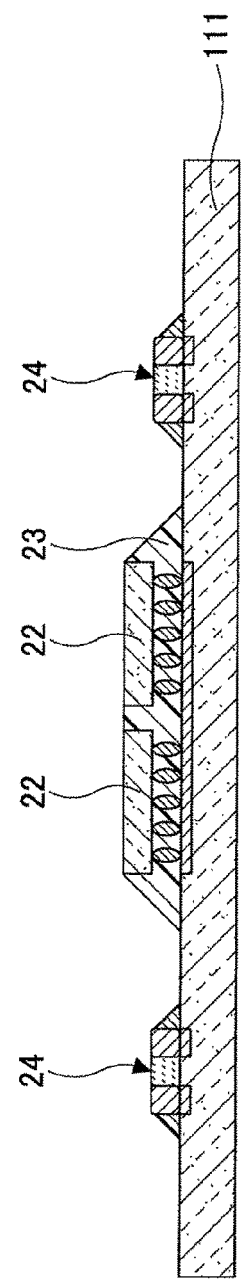
FIG. 40B is a cross-sectional view of the semiconductor device of Ninth Embodiment.

The semiconductor devices of the embodiments are not limited to a single chip structure, a multi chip structure, or a system in package. As illustrated in FIG. 40A and FIG. 40B, a semiconductor element 111 is used instead of the wiring board of the previous embodiments. The structures illustrated in FIG. 3A, FIG. 3B, or FIG. 27 may be provided on the semiconductor element 111 to form a semiconductor device having a chip on chip structure.

Tenth Embodiment

Figure 40C:
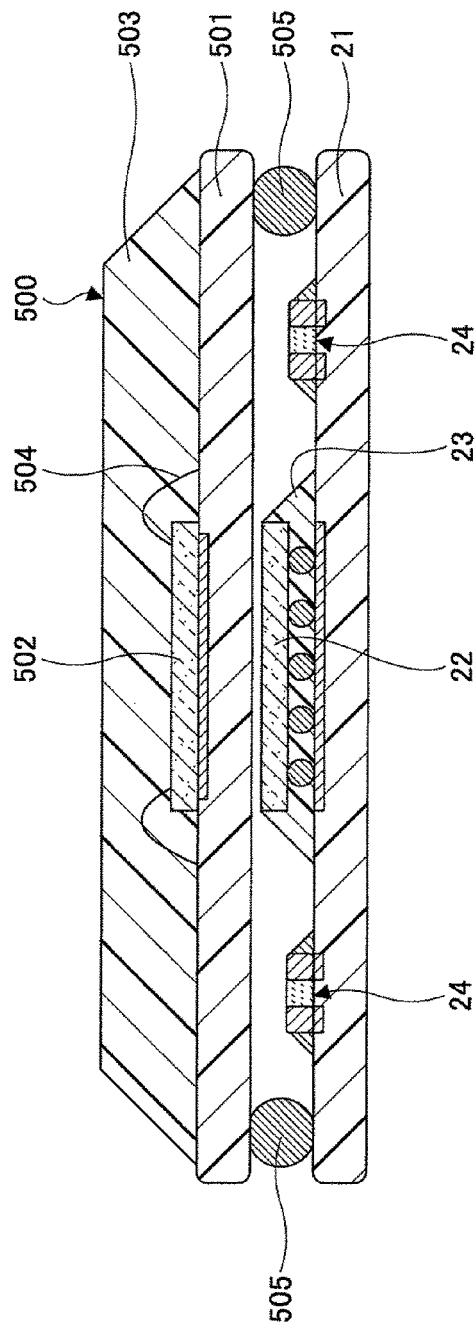
FIG. 40C is a cross-sectional view of a semiconductor device of Tenth Embodiment.

Further, the semiconductor device described in the above embodiments is used. As illustrated in FIG. 40C, it is possible to form a semiconductor device having a package-on-package structure in which another semiconductor package is formed on the semiconductor device described in the above embodiments as illustrated in FIG. 40C.

In an example illustrated in FIG. 40C, the other semiconductor package includes a wiring board 501 and a semiconductor element 502 mounted on the wiring board 501 and sealed by a resin 503. The semiconductor element 502 and the wiring board 501 are connected by a bonding wire 504. Referring to FIG. 40C, the other semiconductor package is mounted on a wiring board 21 by solder bumps 505.

Eleventh Embodiment

Figure 40D:
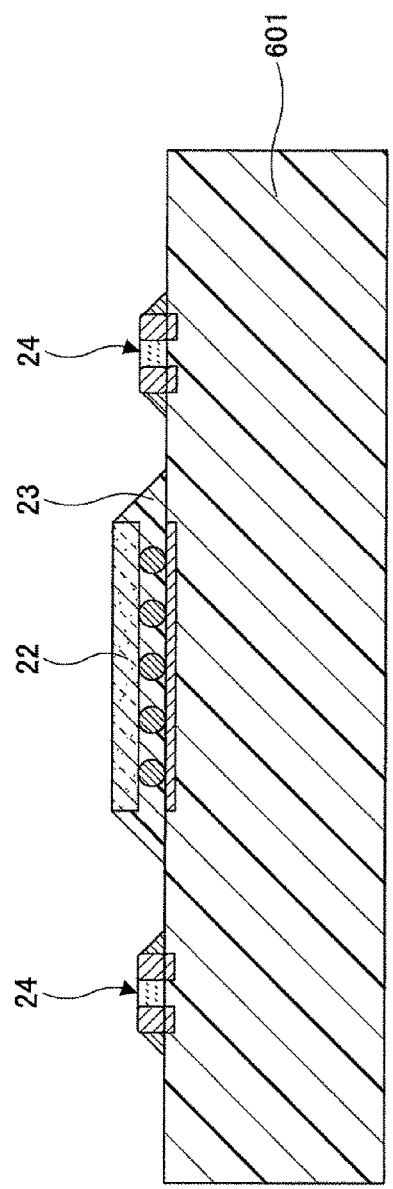
FIG. 40D is a cross-sectional view of a semiconductor device of Eleventh Embodiment.

Referring to FIG. 40D, a mounting board (motherboard) 601 is used instead of the wiring board 21 used in Tenth Embodiment. In this case, an electronic device of pair chip mounting is obtainable.

As described in the above embodiments, the first conductive pattern functions as the dam for banking up the underfill resin. When the underfill resin is supplied between the semiconductor element and the wiring board, the underfill resin does not extend beyond the first conductive pattern 25.

By arranging the first conductive pattern in the vicinity of the region occupied by the semiconductor element, the passive element may be arranged in the vicinity of the semiconductor element. With this, an electric property of the semiconductor device may be stabilized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a wiring board;
a semiconductor chip mounted on a principal surface of the wiring board with flip chip mounting;
a first conductive pattern formed on the principal surface along at least an edge portion of the semiconductor chip;
a second conductive pattern formed on the principal surface along the first conductive pattern and away from the first conductive pattern;
a passive element bridging between the first conductive pattern and the second conductive pattern on the principal surface of the wiring board; and
a resin layer filling a space between the wiring board and the semiconductor chip,
wherein the resin layer extends between the semiconductor chip and the first conductive pattern on the principal surface of the wiring board.

2. The semiconductor device according to claim 1, wherein the first conductive pattern surrounds the semiconductor chip.

3. The semiconductor device according to claim 1, wherein the second conductive pattern surrounds the first conductive pattern.

4. The semiconductor device according to claim 1, wherein the second conductive pattern includes a plurality of members surrounding the first conductive pattern.

5. The semiconductor device according to claim 1,
wherein the first conductive pattern is extended while being in contact with an outer periphery of the semiconductor chip.

6. The semiconductor device according to claim 1,
wherein the first conductive pattern includes a first portion extending in the vicinity of the semiconductor chip, a second portion extending away from the semiconductor chip, and a bending portion connecting the first portion and the second portion,
the second conductive pattern extends in parallel with the first conductive pattern, and
the passive element is formed in the first portion of the first conductive pattern.

7. The semiconductor device according to claim 6,
wherein the bending portion of the first conductive pattern bends at a right angle.

8. The semiconductor device according to claim 6,
wherein the bending portion of the first conductive pattern gradually transitions from the first portion to the second portion.

9. The semiconductor device according to claim 1,
wherein the first conductive pattern includes a plurality of members surrounding the semiconductor chip.

10. The semiconductor device according to claim 1,
wherein a power supply voltage is applied to one of the first conductive pattern and the second conductive pattern, and a ground potential is applied to the other one.

11. The semiconductor device according to claim 10,
wherein the passive element is a two-terminal element including a first terminal and a second terminal, and the passive element is mounted while the first terminal is coupled to the first conductive pattern and the second terminal is coupled to the second conductive pattern.

12. The semiconductor device according to claim 11,
wherein the first conductive pattern includes a first connecting portion wider than other portions of the first conductive pattern, the second conductive pattern includes a second connecting portion wider than other portions of the second conductive pattern, the first terminal of the passive element is coupled to the first conductive pattern, and the second terminal of the passive element is coupled to the second conductive pattern.

13. The semiconductor device according to claim 1,
wherein a first power supply voltage is supplied to one of the first conductive pattern and the second conductive pattern, a ground potential is supplied to the other one of the first conductive pattern and the second conductive pattern, and another passive element with a third power voltage applied is arranged on an outer side of the second conductive pattern.

14. The semiconductor device according to claim 1,
wherein a ground potential is applied to the first conductive pattern and the second conductive pattern,
a plurality of cutouts, from which a surface of the wiring board and first electrode pads formed on the surface of the wiring board and with a power supply voltage applied are exposed, are formed in the first conductive pattern,
a plurality of cutouts, from which the surface of the wiring board and second electrode pads formed on the surface of the wiring board and with the power supply voltage applied are exposed, are formed in the second conductive pattern,
a first side edge portion of the passive element includes a plurality of first ground terminals alternately coupled to the first conductive pattern and the first electrode pads,
a second side edge portion of the passive element positioned opposite to the first edge portion includes a plurality of second ground terminals alternately coupled to the second conductive pattern and the second electrode pads,
the passive element is a multi-terminal capacitor mounted on the wiring board while the plurality of the first ground terminals are coupled to the first conductive pattern, the plurality of the first power terminals are coupled to the corresponding plurality of first electrode pads, the plurality of second ground terminals are coupled to the second conductive pattern, and the plurality of second power terminals are coupled to the corresponding plural second electrode pads.

15. The semiconductor device according to claim 1,
wherein a ground potential is applied to the first conductive pattern and the second conductive pattern,
a plurality of first cutouts, from which a surface of the wiring board and first electrode pads formed on the surface of the wiring board and with a first power supply voltage applied are exposed, are formed in the first conductive pattern,
a plurality of second cutouts, from which the surface of the wiring board is exposed and second electrode pads formed on the surface of the wiring board and with the first power supply voltage applied are exposed, is formed in the second conductive pattern,
a plurality of third cutouts, from which the surface of the wiring board and third electrode pads formed on the surface of the wiring board and with a second power supply voltage applied are exposed, is formed in the first conductive pattern,
a plurality of fourth cutouts, from which the surface of the wiring board is exposed and fourth electrode pads formed on the surface of the wiring board and with the second power supply voltage applied are exposed, is formed in the second conductive pattern,
the passive element includes a first multi-terminal capacitor mounted on the wiring board,
a first side edge portion of the first multi-terminal capacitor includes a plurality of first ground terminals alternately coupled to the first conductive pattern and the first electrode pads,
a second side edge portion of the first multi-terminal capacitor positioned opposite to the first side edge portion includes a plurality of second ground terminals alternately coupled to the second conductive pattern and the second electrode pads,
the plurality of the first ground terminals are coupled to the first conductive pattern, the plurality of the first power terminals are coupled to the corresponding plurality of first electrode pads, the plurality of second ground terminals are coupled to the second conductive pattern, and the plurality of second power terminals are coupled to the corresponding plural second electrode pads,
the passive element further includes a second multi-terminal capacitor mounted on the wiring board,
a third side edge portion of the second multi-terminal capacitor includes a plurality of third ground terminals alternately coupled to the first conductive pattern and the third electrode pads,
a fourth side edge portion of the second multi-terminal capacitor positioned opposite to the third side edge portion includes a plurality of fourth ground terminals alternately coupled to the second conductive pattern and the fourth electrode pads, the plurality of the third ground terminals are coupled to the first conductive pattern, the plurality of the third power terminals are coupled to the corresponding plurality of third electrode pads, the plurality of fourth ground terminals are coupled to the fourth conductive pattern, and the plurality of fourth power terminals are coupled to the corresponding plural fourth electrode pads.

16. The semiconductor device according to claim 1,
wherein a plurality of conductive patterns is formed by concentrically surrounding the second conductive pattern, a ground potential or one of power supply voltages is applied to the plurality of conductive patterns in an alternating order,
the power supply voltages applied to the plurality of conductive patterns are different, and the passive element is arranged between any one of the second conductive pattern and the adjacent one of the plurality of conductive patterns, and between two adjacent patterns of the plurality of conductive patterns to bridge between the any one of the second conductive pattern and the adjacent one of the plurality of conductive patterns, and the two adjacent patterns of the plurality of conductive patterns.

17. The semiconductor device according to claim 1, further comprising:
a sealing member provided in the wiring board and have a joining portion,
wherein the joining portion of the sealing member is joined to a principal surface of the wiring board and an upper principal surface of the semiconductor chip, and to the principal surface of the wiring board at a position inner to an outer periphery of the wiring board.

18. A semiconductor device comprising:
a wiring board;
a plurality of semiconductor chips mounted on a principal surface of the wiring board with flip chip mounting;
first conductive patterns formed on the principal surface surrounding edge portions of the corresponding semiconductor chips;
second conductive patterns formed on the principal surface surrounding the corresponding first conductive patterns away from the first conductive patterns;
passive elements bridging between the corresponding first conductive patterns and the corresponding second conductive patterns on the principal surface of the wiring board; and
resin layers filling corresponding spaces between the wiring board and the plurality of the semiconductor chips,
wherein regions where the resin layers are formed are limited between the plurality of the semiconductor chips and the first conductive patterns on the principal surface of the wiring board.

* * * * *